United States Patent [19]

Harada et al.

[11] Patent Number: 5,763,292

[45] Date of Patent: Jun. 9, 1998

[54] METHOD OF MAKING A SOLID STATE IMAGER WITH REDUCED SMEAR

[75] Inventors: Kouichi Harada; Junichi Furukawa; Kazushi Wada; Takaaki Sarai, all of Kanagawa, Japan

[73] Assignee: Sony Corporation, Tokyo, Japan

[21] Appl. No.: 484,892

[22] Filed: Jun. 7, 1995

Related U.S. Application Data

[62] Division of Ser. No. 243,840, May 17, 1994, Pat. No. 5,614,741.

[30] Foreign Application Priority Data

| May 17, 1993 | [JP] | Japan | 5-114859 |
| Aug. 17, 1993 | [JP] | Japan | 5-203358 |
| Oct. 29, 1993 | [JP] | Japan | 5-272441 |
| Dec. 27, 1993 | [JP] | Japan | 5-333625 |

[51] Int. Cl.[6] ............................................. H01L 21/00
[52] U.S. Cl. ........................ 438/48; 438/57; 438/69; 438/78; 438/98
[58] Field of Search ..................... 437/2, 3, 51, 53

[56] References Cited

U.S. PATENT DOCUMENTS

| 5,264,374 | 11/1993 | Watanabe et al. | 437/2 |
| 5,385,849 | 1/1995 | Nakashiba | 437/3 |
| 5,492,852 | 2/1996 | Minami | 437/53 |

FOREIGN PATENT DOCUMENTS

| 0495503 | 7/1992 | European Pat. Off. |       |
| 0050057 | 3/1988 | Japan              | 437/2 |
| 0136665 | 6/1988 | Japan              | 437/2 |
| 0229851 | 9/1988 | Japan              | 437/2 |
| 0015969 | 1/1989 | Japan              | 437/2 |
| 0014570 | 1/1990 | Japan              | 437/2 |
| 0069478 | 3/1994 | Japan              | 437/53 |
| 0069481 | 3/1994 | Japan              | 437/53 |

*Primary Examiner*—Tuan H. Nguyen
*Attorney, Agent, or Firm*—Hill & Simpson

[57] ABSTRACT

A CCD solid state imaging device can reduce a smear component. This CCD solid state imaging device comprises a plurality of photosensor sections (10) arranged in a matrix fashion, a vertical transfer register (5) having a transfer electrode (16) disposed at every column of the photosensor sections, a shunt line layer (33) connected to the transfer electrode (16) on the vertical transfer register (5), and a photo-shield layer (38) formed so as to surround the photosensor section 10 through an interlayer insulating layer (37) which covers the shunt layer (33), in which the interlayer insulating layer (37) is formed under an overhang portion (38a) of the photo-shield layer (38) to the photosensor section (10).

4 Claims, 40 Drawing Sheets

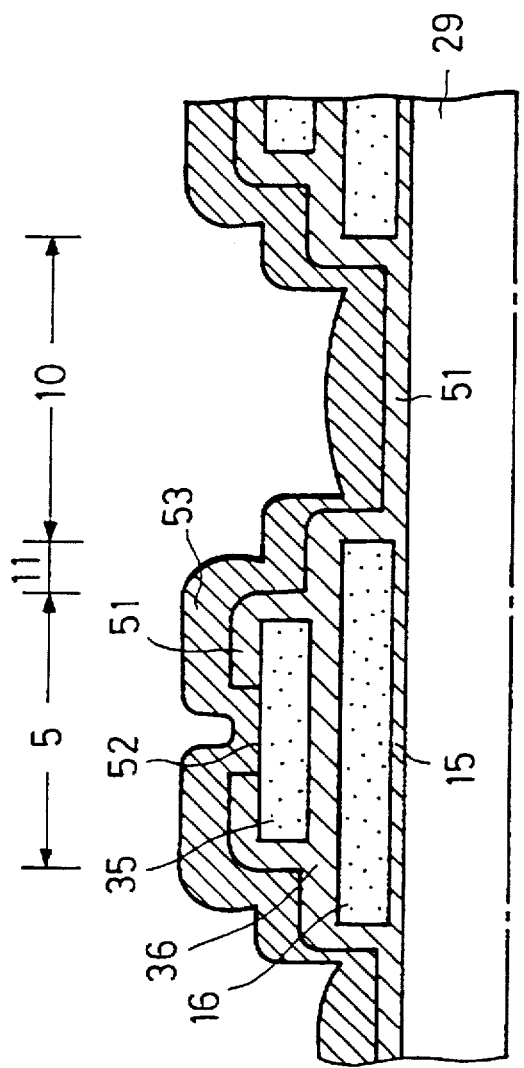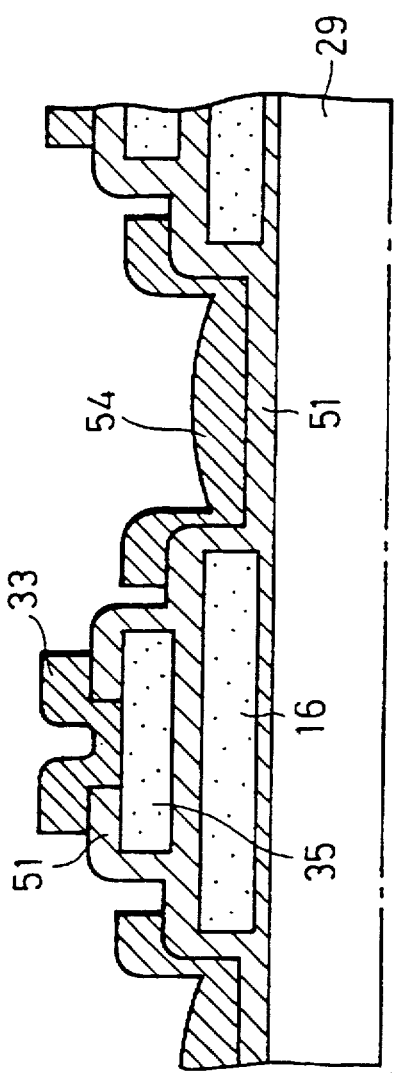
FIG. 19A
FIG. 19B

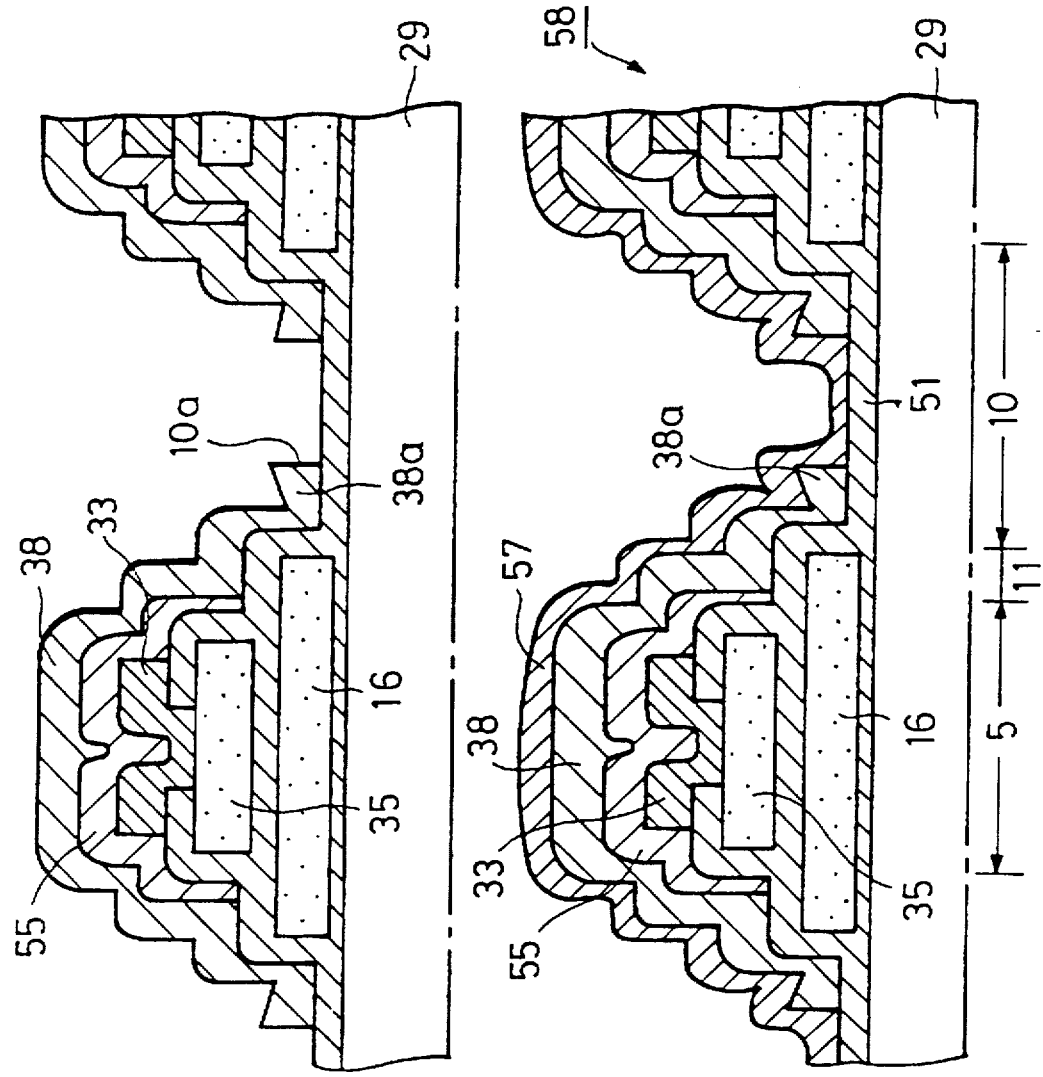

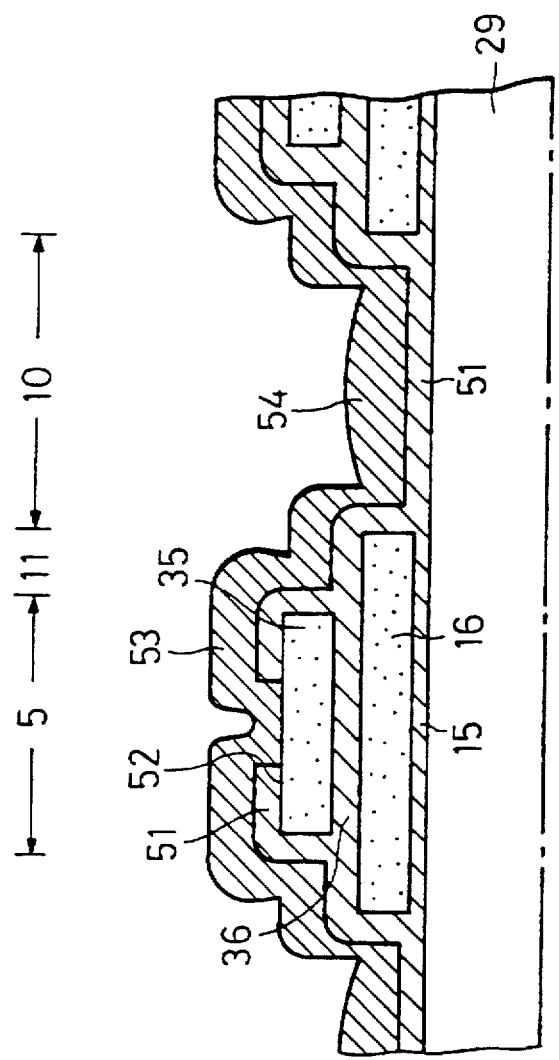
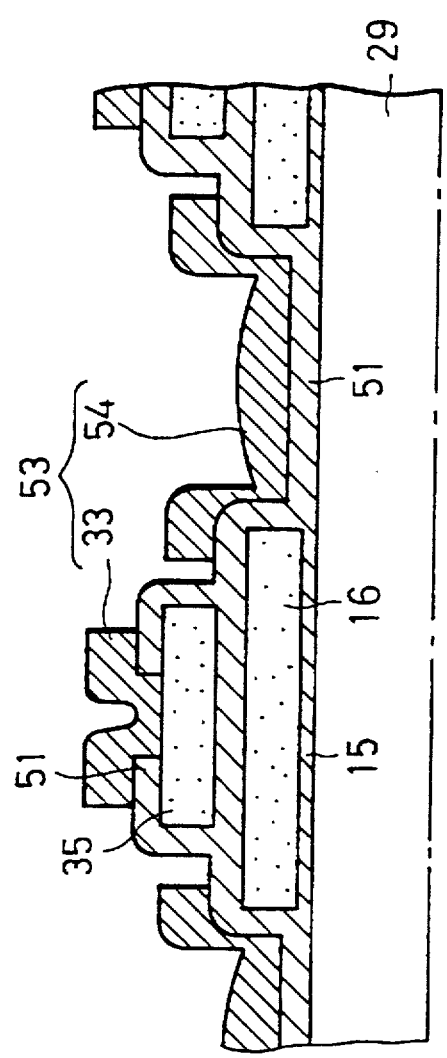
FIG. 21A
FIG. 21B

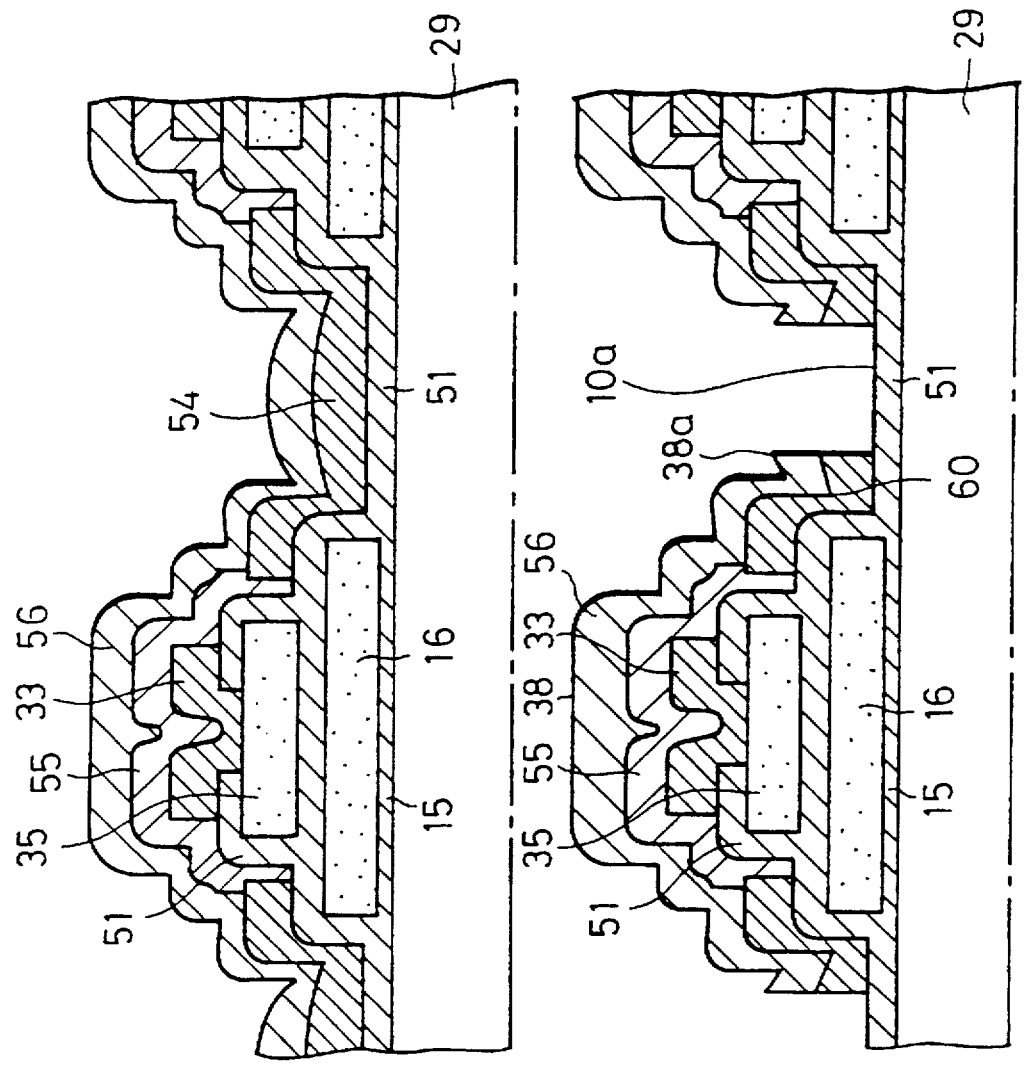

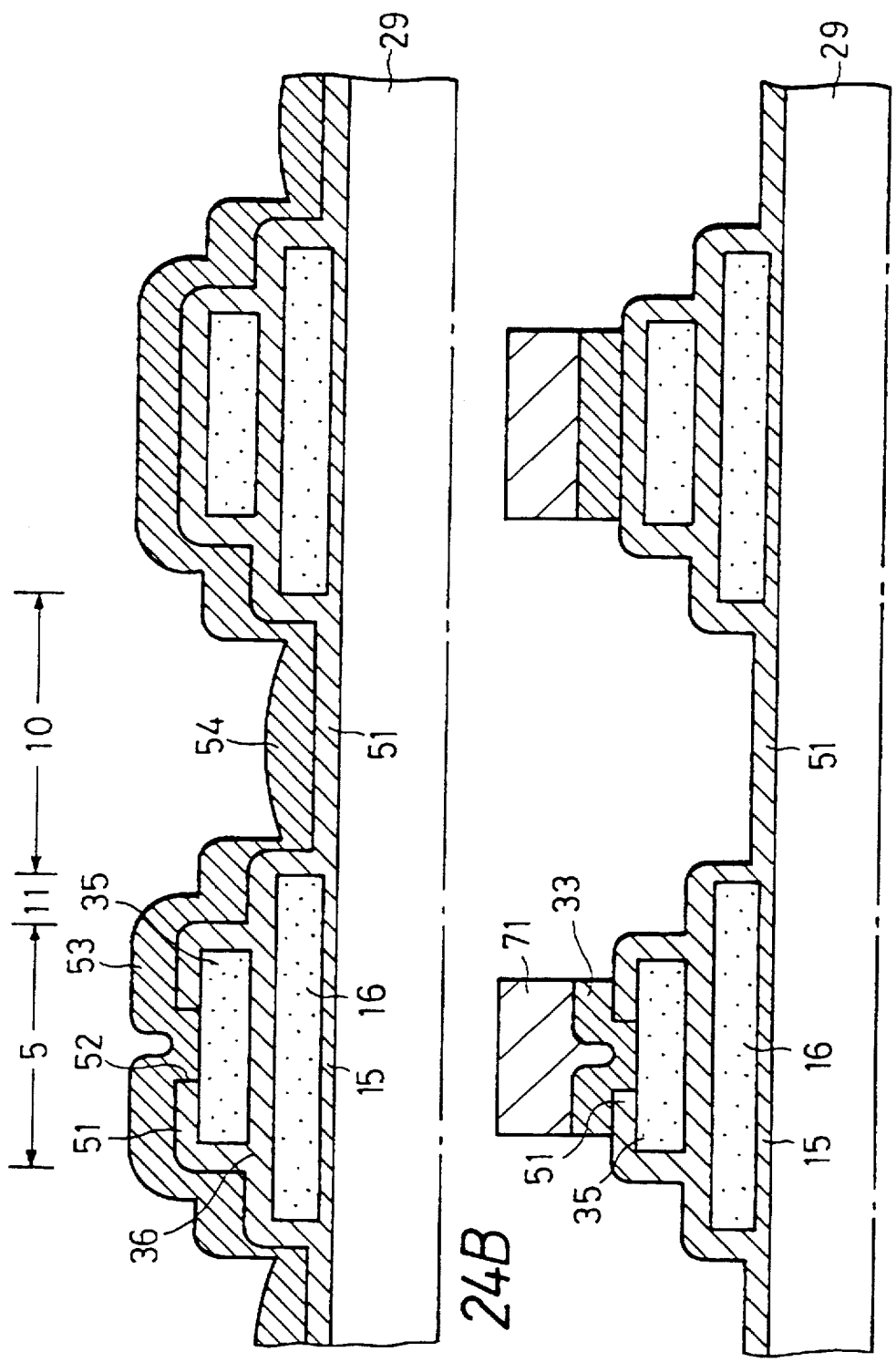

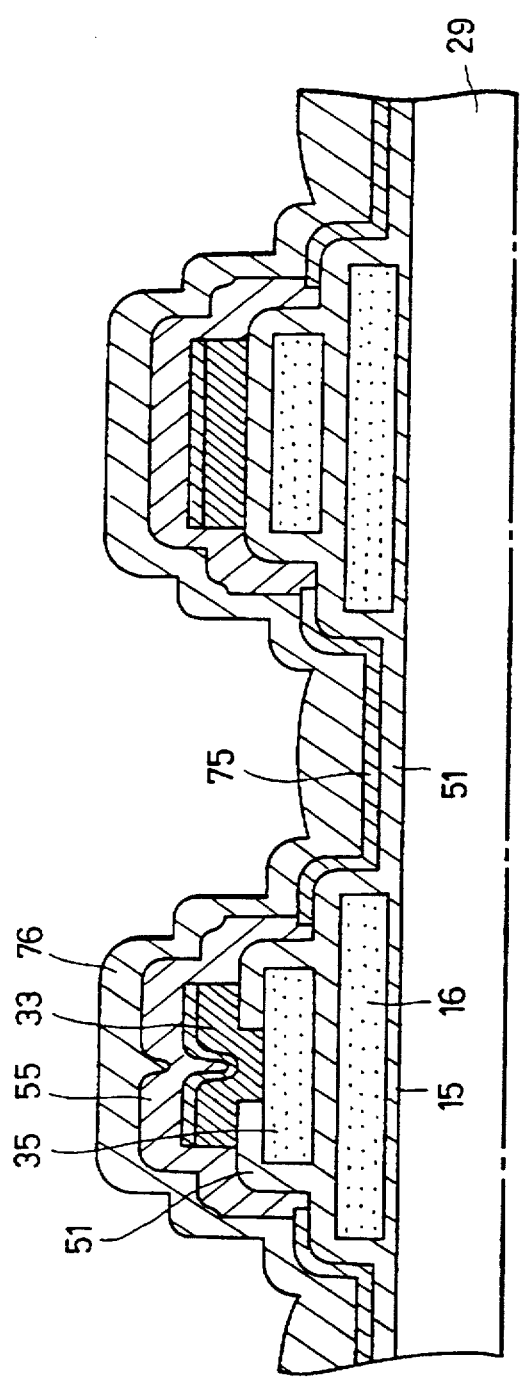
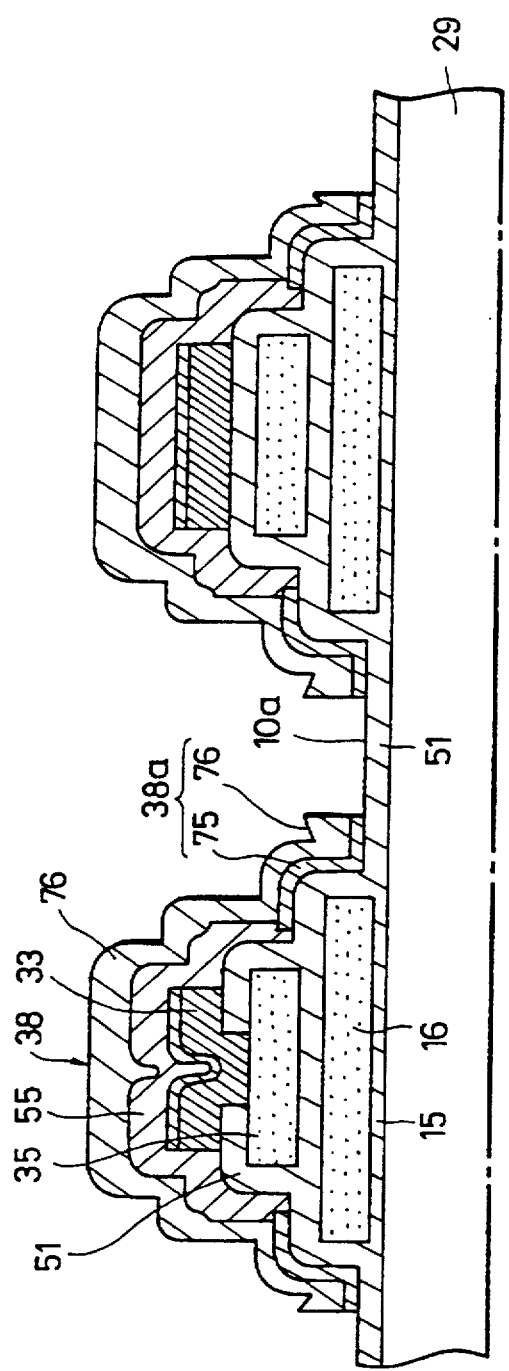
FIG. 24G
FIG. 24H

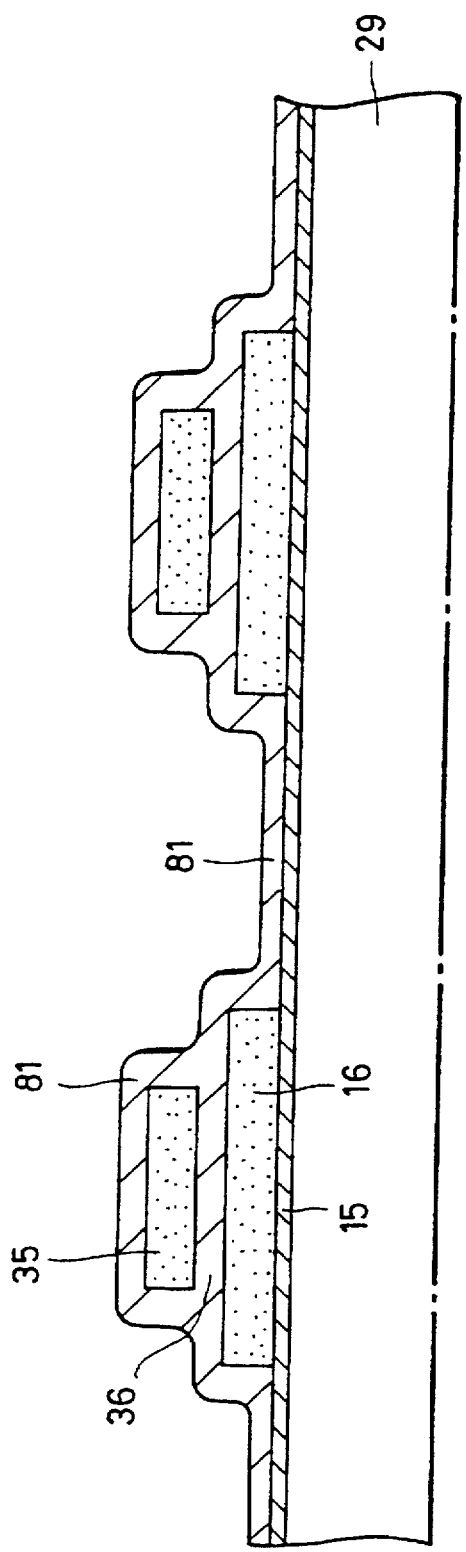
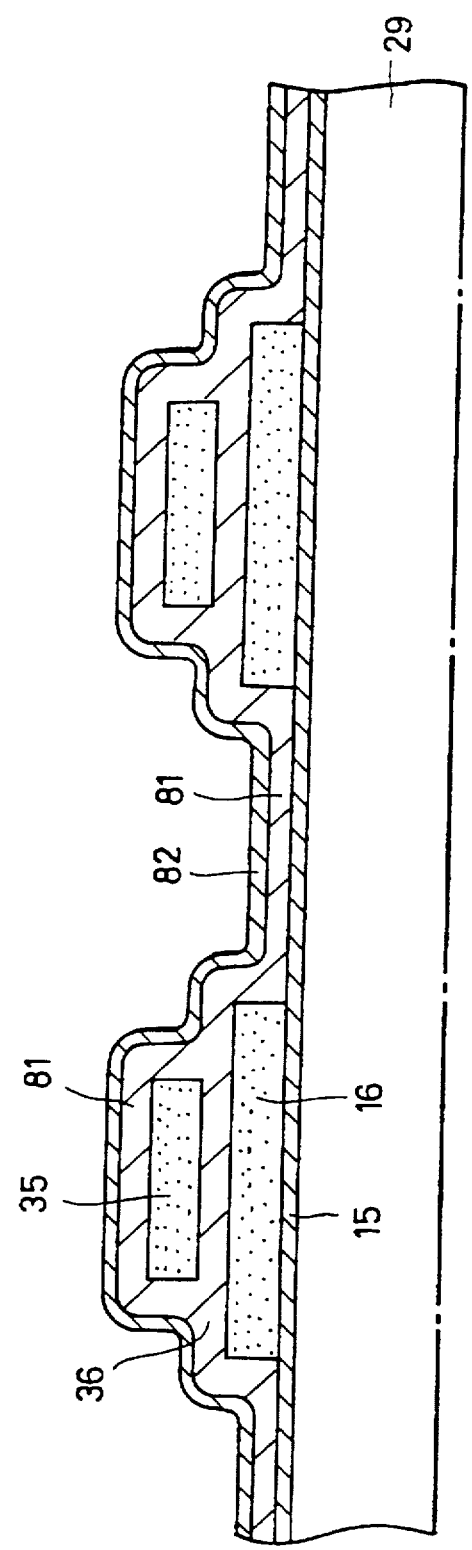
FIG. 26A
FIG. 26B

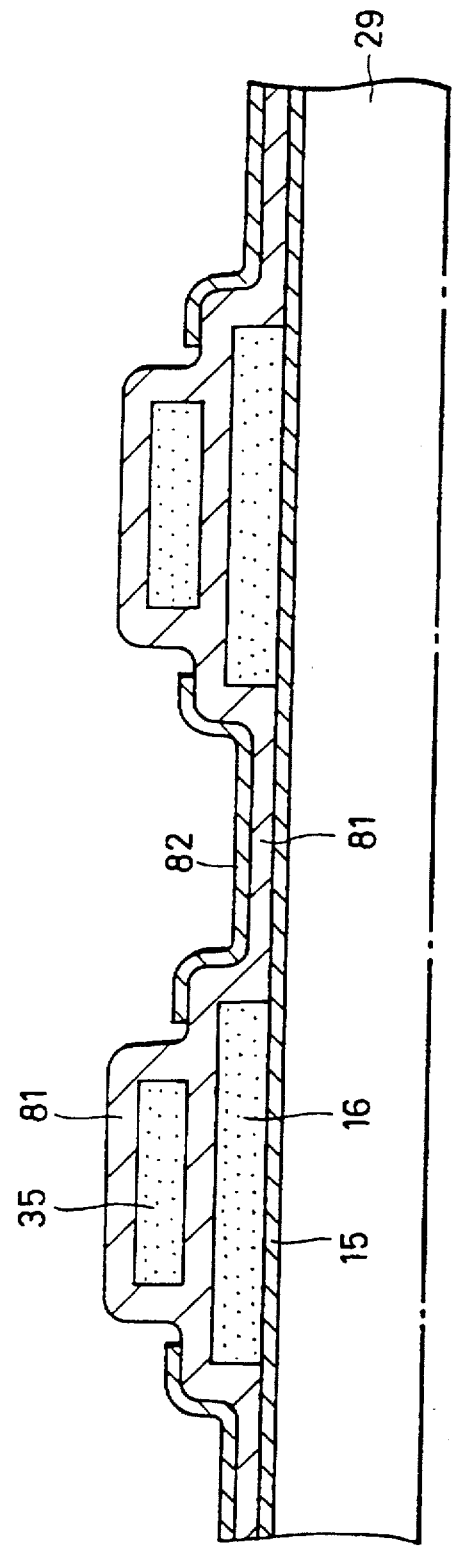
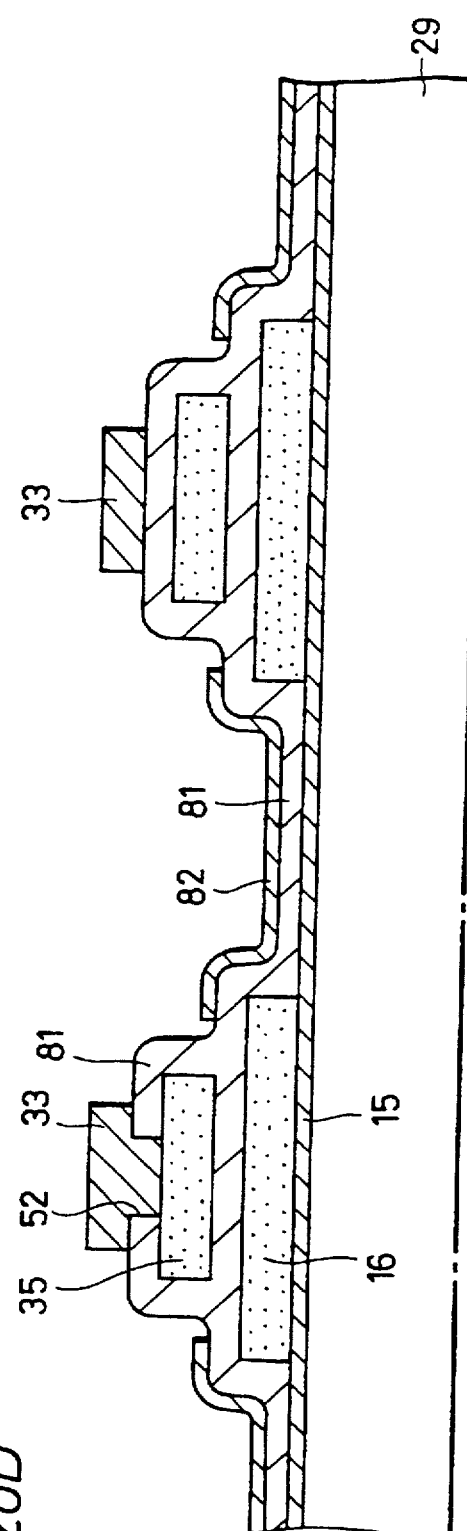
FIG. 26C
FIG. 26D

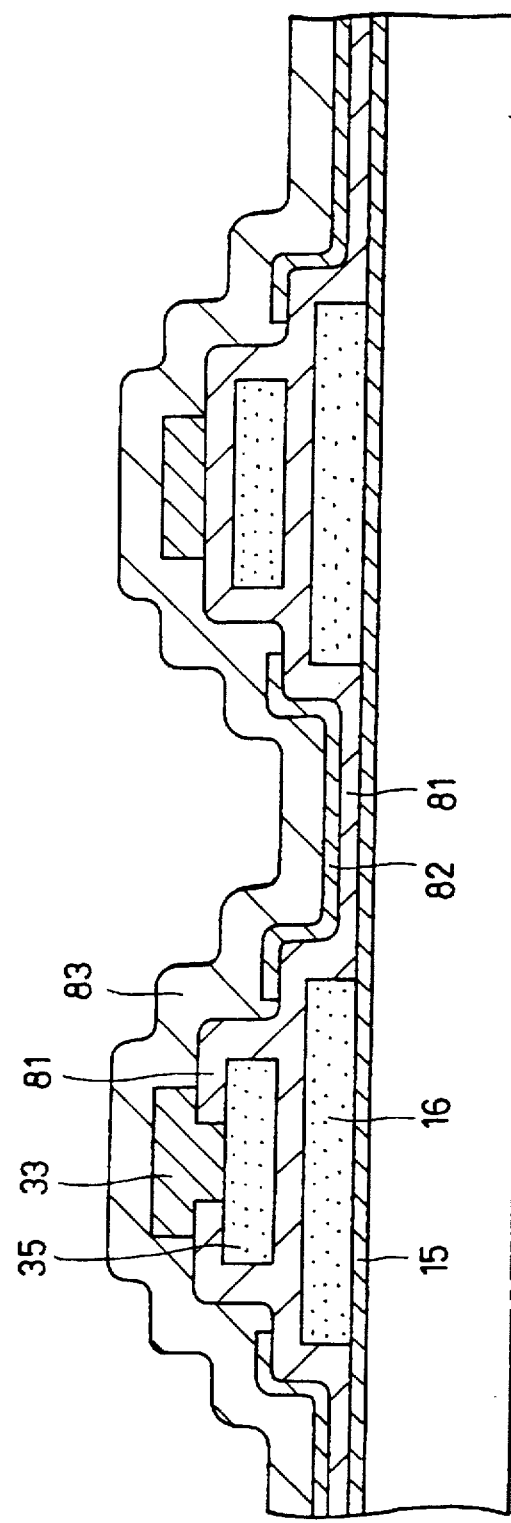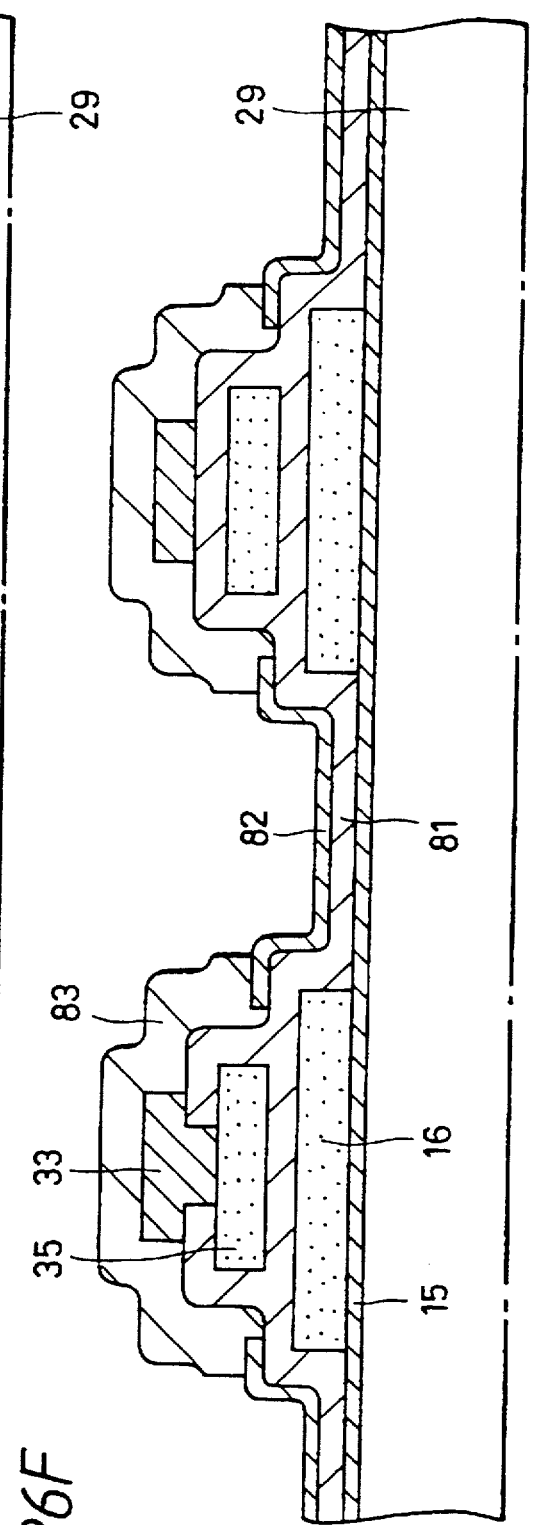

METHOD OF MAKING A SOLID STATE IMAGER WITH REDUCED SMEAR

This is a divisional of application Ser. No. 08/243,840, filed May 17, 1994, now U.S. Pat. No. 5,614,741.

BACKGROUND OF THE INVENTION

1. Field of the Invention

The present invention relates to a solid state imager with reduced smear and a method of manufacturing the same.

2. Description of Related Art

In CCD (charge-coupled device) solid state imagers for 1-inch optical system HD (high definition) television receiver, there are proposed CCD solid state imagers having a shunt line structure in order to prevent a propagation delay of a transfer clock applied to a vertical transfer register. In the specification, "shunt line" is referred to as "low resistance interconnection for connecting transfer electrodes of the same phase".

FIGS. 1 and 2 of the accompanying drawings show a conventional FIT (frame interline transfer) type CCD solid state imager having a shunt line structure, in particular, an example of an imaging section thereof.

As illustrated, a CCD solid state imaging device 1 comprises a silicon substrate 2 of a first conductivity type, e.g., N type, a first well region 3 of a second conductivity type, i.e., P type formed on the N-type silicon substrate 2, an N-type impurity diffusion region 4, an N-type transfer channel region 6 forming a vertical transfer register 5 and a P-type channel stopper region 7, all of which are formed within the first P-type well region 3, a P-type positive electric charge accumulation region 8 formed on the N-type impurity diffusion region 4 and a second P-type well region 9 formed beneath the N-type transfer channel region 6.

A PN junction i between the N-type impurity diffusion region 4 and the P-type well region 3 constructs a photosensor section (photoelectric-conversion section) 10. The photosensor section 10 serves as a pixel, and a plurality of photo-sensor sections 10 are arranged in a matrix shape.

A plurality of transfer electrodes 16 (16A, 16B) made of polycrystalline silicon layer of first and second layers are formed on the transfer channel region 6, the channel stopper region 7 forming the vertical transfer register 5 and a read-out gate section 11 through a gate insulating film 15. The transfer channel region 6, the gate insulating film 15 and the transfer electrodes 16 constitute the vertical transfer register 5. The transfer electrodes 16 are extended in the horizontal direction, respectively. The first layer polycrystalline silicon transfer electrode 16A and the second layer polycrystalline silicon transfer electrode 16B are overlapped each other in the area of the adjacent photosensor sections 10.

Shunt line layers 18 made of a first Al layer are formed on the vertical transfer registers 5 through an interlayer insulating layer 17 so as to be extended in the vertical direction. Each shunt line layer 18 is connected to the corresponding transfer electrode 16 through a contact section 19. 4-phase transfer clocks $\phi V_1$ to $\phi V_4$, for example, are applied to the shunt line layer 18.

In the aforesaid arrangement shown in FIGS. 1 and 2, the Al shunt line layer 18 is served also as an Al photo-shield layer for reducing a smear.

FIG. 3 shows another example of the CCD solid state imaging device in which a smear component can be reduced. In a CCD solid state imaging device 21, as shown in FIG. 3, a photo-shield layer 22 formed of a second Al layer covers the adjacent photosensor sections 10 in the vertical direction through the interlayer insulating layer, in addition to the arrangement shown in FIG. 1.

According to the CCD solid state imaging device 1 in which the first Al layer is served as both the photo-shield layer on each vertical transfer register 5 and the shunt line layer 18, smear light directly introduced into each vertical transfer register 5 could be shielded but light which becomes incident on the adjacent photosensor sections 10 arranged in the vertical direction could not be shielded so that the light which becomes incident between the adjacent photosensor sections 10 arranged in the vertical direction is leaked to the vertical transfer register 5. As a consequence, a smear suppressed ratio could not be made −100 dB or lower.

Further, according to the CCD solid state imaging device 21 in which the adjacent photosensor sections 10 arranged in the vertical direction are covered with the photo-shield layer 22 formed of the second Al layer, the smear compressed ratio thereof is improved to be several decibels, i.e., about 3 dB as compared with the CCD solid state imaging device 1 shown in FIG. 1. However, the insulating layer formed under the Al photo-shield layer 22 is thick so that a satisfactory smear reducing effect cannot be achieved.

As other method of reducing a smear component, there is proposed a structure in which a reflection preventing film made of TiON, for example, is formed on the lower surface of the Al layer serving as the shunt line layer and the photo-shield layer so as to cover the extended portion of the Al layer into the photo-sensor section. With this structure, although a light component incident on the lower surface of the extended portion of the Al layer into the photo-sensor section can be prevented from being repeatedly reflected to become incident on the vertical transfer register, a scanning of the reflection preventing film remains between the pixels. There is then the risk that the adjacent shunt line layers will be short-circuited. Also, this structure cannot be processed without difficulty and cannot yet be realized.

As a further method of reducing a smear component, there is proposed a structure in which the first Al layer forms the photo-shield layer and the second Al layer forms the shunt line layer. It is very difficult to process this structure, and this structure is not commercially available on the market.

SUMMARY OF THE INVENTION

In view of the aforesaid aspects, it is an object of the present invention to provide a solid state imager with reduced smear and a method of making the same in which a smear component can be reduced much more.

A solid state imaging device according to the present invention comprises a plurality of photosensor sections arranged in a matrix shape, a vertical transfer register having a transfer electrode disposed at every column of photosensor sections, a shunt line layer connected to the transfer electrode on the vertical transfer register, and a photo-shield layer formed between the photosensor sections at least in the vertical direction through an interlayer insulating layer which covers the shunt line layer, in which the interlayer insulating layer is not formed under an overhang portion of the photo-shield layer which overhangs to the photosensor section.

A solid state imaging device according to the present invention comprises a plurality of photosensor sections arranged in a matrix shape, a vertical transfer register having a transfer electrode disposed at every column of photosensor sections, a shunt line layer connected to the transfer electrode on the vertical transfer register, and a photo-shield layer formed through an interlayer insulating layer which covers the shunt line layer so as to surround the photosensor sections, in which the interlayer insulating layer is not formed under an overhanging portion of the photo-shield layer which overhangs to the photosensor section.

The interlayer insulating layer may not be formed between the photosensor sections in the vertical direction.

In the above-mentioned solid state imaging device according to the present invention, the interlayer insulating layer may be formed of a nitride film or an oxide film.

In the solid state imaging device according to the present invention, the interlayer insulating film may be formed of the nitride film of the lower layer and the oxide film of the upper layer.

A solid state imaging device according to the present invention comprises a plurality of photosensor sections arranged in a matrix shape, a vertical transfer register having a transfer electrode disposed at every column of photosensor sections, a shunt line layer connected to the transfer electrode on the vertical transfer register, and a photo-shield layer formed through an interlayer insulating layer which covers the shunt line layer, in which an overhanging portion of the photo-shield layer which overhangs to the photosensor side is formed as a bilayer film structure, and the interlayer insulating layer is not formed under the overhanging portion.

In the above-mentioned solid state imaging device according to the present invention, a film thickness of a lower layer film which constructs an overhanging portion having a bilayer structure of the photo-shield layer overhanging to the photosensor section is smaller than a film thickness of the shunt line layer.

A solid state imaging device according to the present invention comprises a plurality of photosensor sections arranged in a matrix shape, a vertical transfer register having a transfer electrode disposed at every column of the photosensor sections, a shunt line layer connected to the transfer electrode on the vertical transfer register, and a photo-shield layer formed through an interlayer insulating layer which covers the shunt line layer, in which the interlayer insulating layer is not formed under the overhanging portion of the photo-shield layer which overhangs to the photosensor section, and a thin film serving as a stopper formed of a semiconductor thin film or a semiconductor thin film having an oxide film on the surface is formed between the overhanging portion 38a and the insulating layer on the photosensor section.

A solid state imaging device according to the present invention comprises a plurality of sensor sections arranged in a matrix shape, a vertical transfer register having a transfer electrode disposed at every column of the photosensor sections, a shunt line layer connected to the transfer electrode on the vertical transfer register, and a photo-shield layer, in which the photo-shield layer is formed of a first layer film and a second layer film, and the overhanging portion of the photo-shield layer and the shunt line layer are formed of the first layer film.

In the above-mentioned solid state imaging device, a reflection preventing film may be formed under the photo-shield layer.

A method of manufacturing a solid state imaging device according to the present invention comprises a first process for forming a plurality of photosensor sections and a vertical transfer register having a transfer electrode disposed at every column of the photosensor sections, a second process for forming a shunt line layer connected to the transfer electrode a through first insulating layer, a third process for forming a second insulating layer so as to cover the shunt line layer, a fourth process for selectively removing the second insulating layer at its portion corresponding to the photosensor section, and a fifth step for forming the photo-shield layer on the vertical transfer register and around the photosensor section such that the photo-shield layer is partly overhung to the photosensor section side.

In the above-mentioned manufacturing method, the shunt line layer formed of the first metal film is formed and the first metal film is selectively left on the photosensor section in the second process, the second insulating layer is selectively removed at its portion corresponding to the photosensor section by using the first metal film on the photosensor section. This manufacturing method further includes a step for removing the first metal film on the photosensor section before the fifth process.

The method of manufacturing a solid state imaging device according to the present invention includes the fifth step for forming a second metal film on the whole surface, and forming the photo-shield layer on the vertical transfer register and around the photosensor section by selectively patterning the first metal film and the second metal film such that the overhanging portion of the photo-shield layer to the photosensor section is formed as a bilayer film structure of the first metal film and the second metal film after the fourth process for selectively removing the second insulating layer at its portion corresponding to the photosensor section by using the first metal layer film on the photosensor section as the stopper.

A method of manufacturing a solid state imaging device according to the present invention comprises a first process for forming a plurality of photosensor sections and a vertical transfer register having a transfer electrode at every column of the photosensors, a second process for forming a first insulating layer on the whole surface of the photosensor section and the vertical transfer register and selectively forming a thin film serving as a stopper made of a semiconductor thin film or a semiconductor thin film having an oxide film on its surface on the first insulating layer at its portion corresponding to the photosensor section, a third process for forming a shunt line layer connected to the transfer electrode on the vertical transfer register through the first insulating layer, a fourth process for forming a second insulating layer so as to cover the shunt line layer, a fifth process for selectively removing the second insulating layer 83 at its portion corresponding to the photosensor section by using the thin film as a stopper, and a sixth process for forming a photo-shield layer on the vertical transfer register and around the photosensor section by patterning the layer for photo-shielding and the thin film after the layer for photo-shield on the whole surface in such a manner that the photo-shield layer partly overhangs to the photosensor section side.

In the solid state imaging device according to the present invention, since the photo-shield layer is formed between the photosensor sections at least in the horizontal direction through the interlayer insulating layer covering the shunt line layer, the photosensor sections in the vertical direction are photo-shielded by the shunt line layer 44 and the photosensor sections in the vertical direction are photo-shielded by the photo-shield layer.

In addition, since the interlayer insulating layer is not formed under the overhanging portion of the photo-shield layer to the photosensor section, a thickness between the overhanging portion 38a of the photo-shield layer 38 and the photosensor section is reduced and therefore a smear component caused by light incident on the photosensor sections 10 can be reduced.

According to the solid state imaging device of the present invention, since the photo-shield layer is formed so as to surround the photosensor sections through the interlayer insulating layer which covers the shunt line layer 33, the photosensor sections 10 in the horizontal and vertical directions are photo-shielded by the photo-shield layer 38.

In addition, since the interlayer insulating layer is not formed under the overhanging portion 38a of the photo-shield layer 3 to the photosensor section side, the thickness of the insulating layer between the overhanging portion 38a of the photo-shield layer 38 and the photosensor section 10 can be reduced and therefore the smear component caused by light incident on the photosensor sections 10 can be reduced.

The etching selectivity relative to the lower insulating layer is achieved by using the nitride film as the interlayer insulating layer covering the shunt line layer. Thus, it becomes possible to selectively remove the interlayer insulating layer at its portion corresponding to the photosensor section 10.

By using the laminated film of the nitride film of the lower layer and the oxide film of the upper layer, a specific inductive capacity of the interlayer insulating layer can be lowered to reduce the capacity between the shunt line layer and the photo-shield layer.

In the solid state imaging device according to the present invention, since the photo-shield layer is formed through the interlayer insulating layer covering the shunt line layer, the photosensor sections can be photo-shielded by the photo-shield layer.

In addition, since the interlayer insulating layer is not formed under the overhanging portion of the photo-shield layer to the photosensor section side, the thickness between the overhanging portion 38a of the photo-shield layer and the insulating layer provided between the photosensors is reduced so that the smear component caused by light leaked into the lower portion of the overhanging portion 38a can be reduced.

Further, since the overhanging portion of the photo-shield layer is formed as the bilayer film structure, the photo-shield property of the photo-shield layer can be improved much more and the smear component can be reduced much more.

In the overhanging portion of the photo-shield layer of the bilayer film structure, when a film thickness of the under layer is made smaller than that of the shunt line layer, the selective etching can be carried out reliably, whereby a disconnection caused between the shunt line layer 33 and the overhanging portion of the photo-shield layer when the etching is not sufficient can be prevented. Further, when the selective etching is carried out in order to form the lower layer film, the amount in which the film thickness of the support insulating layer is reduced by the over-etching can be reduced. Therefore, the support insulating layer can be reduced much more in thickness and the smear suppressed ratio can be improved.

In the solid state imaging device according to the present invention, since photo-shield layer is formed through the interlayer insulating layer which covers the shunt line layer, the adjacent photosensor sections are photo-shielded by the photo-shield layer. In addition, since the interlayer insulating layer is not formed on the photo-shield layer under its overhang portion 38a which overhangs toward the photosensor section, the insulating layer between the overhang portion of the photo-shield layer and the photosensor section can be reduced in thickness and the smear component, caused by light leaked into the lower portion of the overhang portion, can be reduced.

The thin film which serves as the stopper is formed between the overhang portion of the photo-shield layer and the insulating layer formed on the photosensor section, thereby making it possible to selectively remove the interlayer insulating layer corresponding to the photosensor section. Therefore, the film thickness of the insulating layer 81 formed on the photosensor section can be reduced, and the smear component can be reduced.

In the solid state imaging device according to the present invention, since the photo-shield layer is formed by the first layer film and the second layer film and the overhang portion of the photo-shield layer and the shunt line layer are formed by the first layer film, the stepped portion of the end edge of the overhang portion of the photo-shield layer can be reduced in height and the eclipse of light incident on the photosensor section can be improved.

Further, since the shunt line layer and the overhang portion of the photo-shield layer are formed by the same first layer film, the insulating layer can be made flat on the whole.

In the solid state imaging device according to the present invention, since the reflection preventing film is formed under the photo-shield layer, light incident on the vertical transfer register can be reduced and therefore the smear component can be reduced. In addition, since the reflection preventing film is formed under the photo-shield layer, the short-circuit caused between the shunt line layers by the residual scanning in the reflection preventing film can be avoided unlike the conventional arrangement in which the shunt line layer and the photo-shield layer are both served as each other.

In the manufacturing method of the solid state imaging device according to the present invention, after the second insulating layer is formed so as to cover the shunt line layer, the second insulating layer is selectively removed at its portion corresponding to the photosensor section and the photo-shield layer is formed so as to partly be overhang on the photosensor section. Therefore, only the first insulating layer is formed under the overhang portion of the photo-shield layer with the result that a sufficient photo-shield effect can be achieved.

In the manufacturing method of the solid state imaging device according to the present invention, the shunt line layer is formed by the first layer metal film in the second process and a part of the first layer metal film is selectively left on the photosensor section, whereafter the second insulating layer is formed. Then, the second insulating layer is selectively removed at its portion corresponding to the photosensor section by using the first layer metal film formed on the photosensor section as the stopper prior to the fifth process. Thus, when the shunt line layer is patterned by plasma etching, for example, the first layer metal film can protect the insulating layer on the photosensor section from being damaged.

Further, when the second insulating layer is selectively removed, the etching is ended in the first layer metal film on the photosensor section and prevented from affecting the lower insulating layer 51. Therefore, the controlled film thickness of the insulating film on the photosensor section can be maintained.

Thereafter, since the first layer metal film on the photosensor section is removed and the photo-shield layer is formed, the insulating film on the photo-shield layer under its overhang portion which overhangs on the photosensor section can be reduced in thickness and the smear component can be reduced.

Further, in the manufacturing method of the solid state imaging device according to the present invention, after the fourth process of the above-mentioned manufacturing method, the second layer metal film is formed on the whole surface under the condition that the first layer metal film on the photosensor section is not removed but left, the photo-shield layer is formed such that the overhang porting which overhangs toward the photosensor section is formed as the bilayer film structures formed of the first layer metal film and the second layer metal film by patterning the first layer metal film and the second layer metal film. Therefore, it is possible to form the photo-shield layer which is high in photo-shield property reliably.

Furthermore, in the manufacturing method of the solid state imaging device according to the present invention, since the thin film which serves as the stopper is selectively formed on the first insulating film at its portion corresponding to the photosensor section and the second insulating layer formed on the thin film is selectively removed at its portion corresponding to the photosensor section by using the thin film as the stopper, the first insulating layer can be prevented from being etched and the controlled film thickness of the insulating film on the photosensor section can be maintained to be thin. Therefore, the smear component can be reduced.

BRIEF DESCRIPTION OF THE DRAWINGS

FIGS. 19A through 19H are manufacturing process diagrams of the CCD solid state imaging device according to other embodiment of the present invention, respectively;

FIGS. 21A through 21F are manufacturing process diagrams of the CCD solid state imaging device according to other embodiment of the present invention, respectively;

FIGS. 24A through 24H are manufacturing process diagrams of the CCD solid state imaging device according to a further embodiment of the present invention, respectively;

FIGS. 26A through 26H are manufacturing process diagrams of the CCD solid state imaging device according to still a further embodiment of the present invention, respectively;

DETAILED DESCRIPTION OF THE PREFERRED EMBODIMENTS

The present invention will now be described with reference to the drawings.

Figure 4:
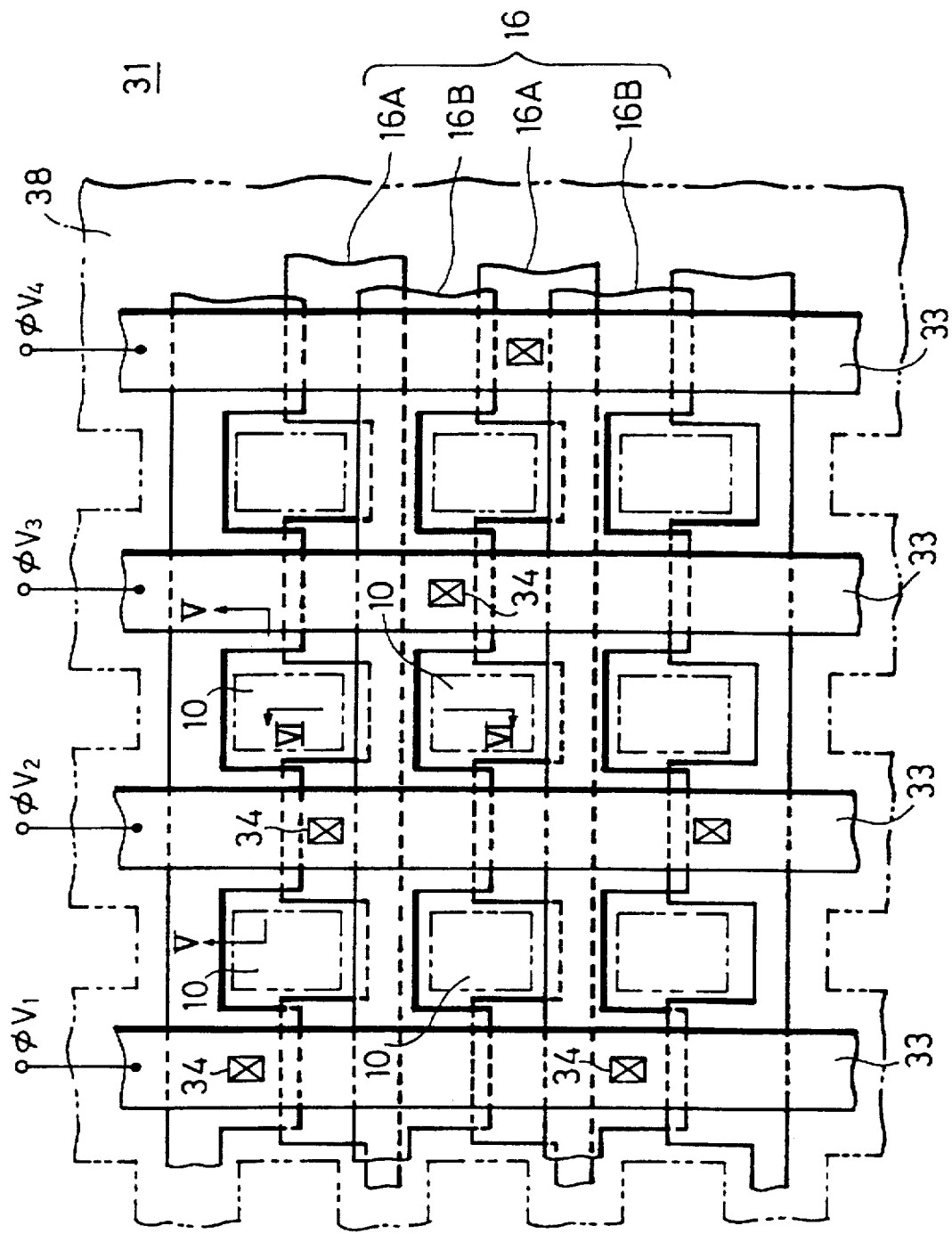
FIG. 4 is a plan view of an imaging section and showing a CCD solid state imaging device according to an embodiment of the present invention.
Figure 5:
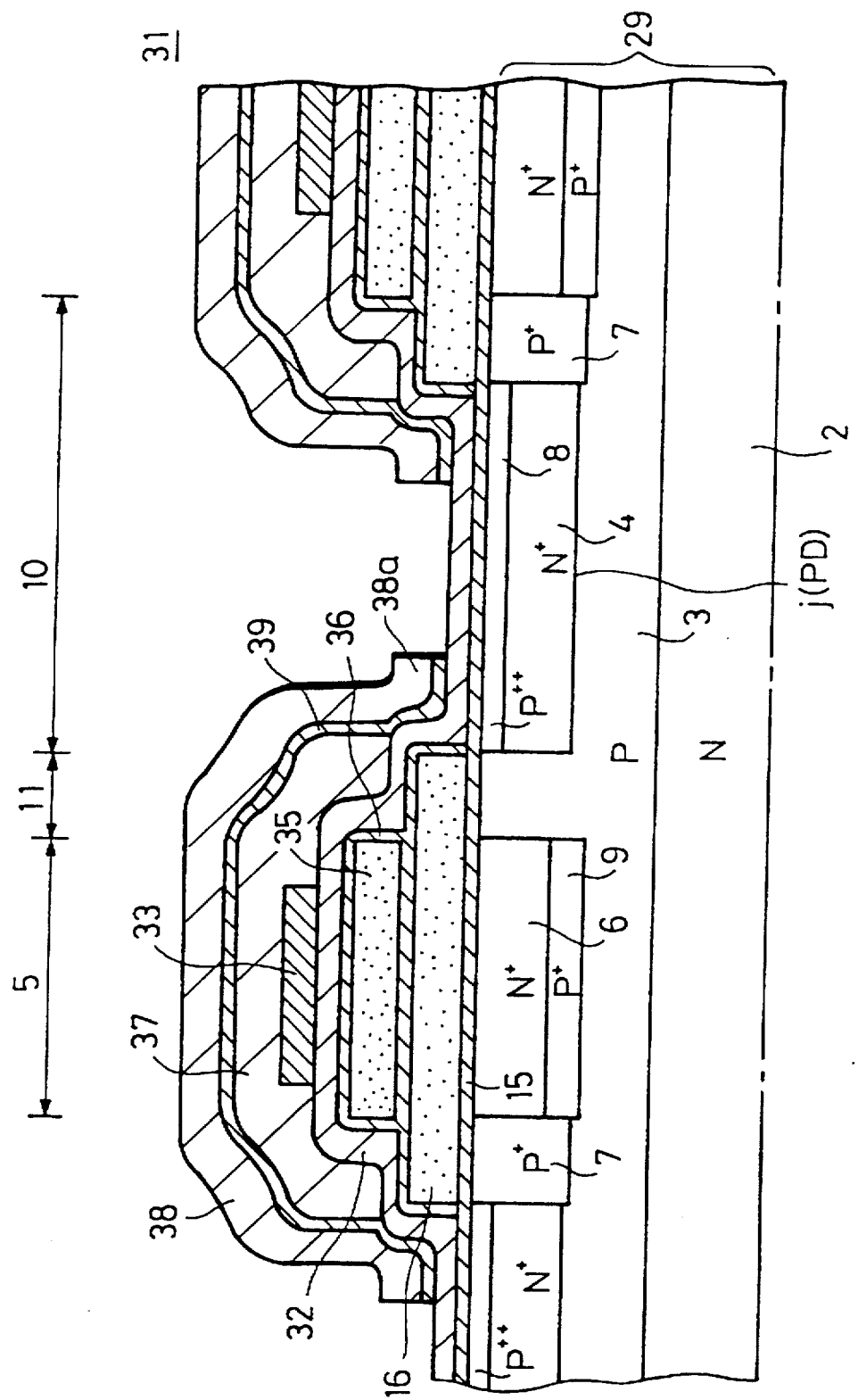
FIG. 5 is a cross-sectional view taken along the line V—V in FIG. 4.
Figure 6:
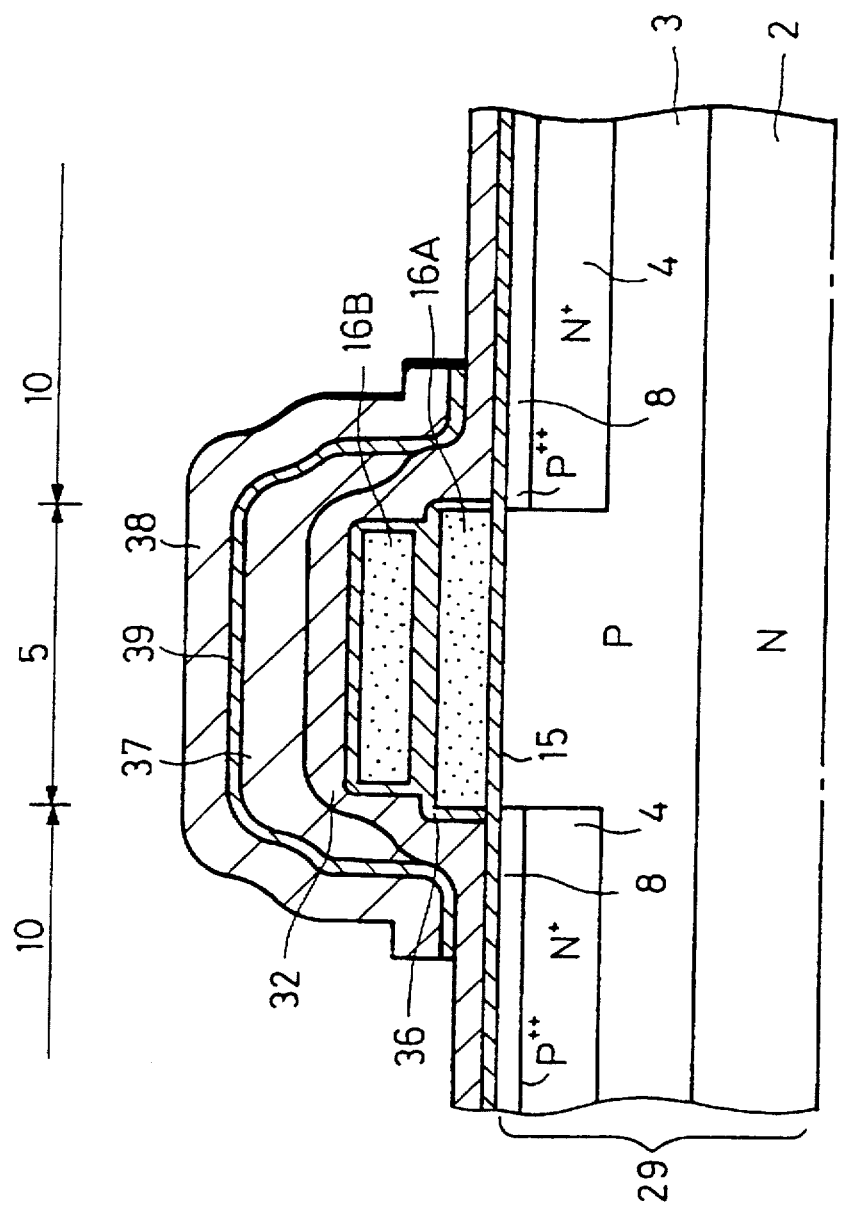
FIG. 6 is a cross-sectional view taken along the line VI—VI in FIG. 4.

FIG. 4 is a plan view showing the present invention which is applied to an FIT type CCD solid state imager. FIG. 5 is a cross-sectional view taken along the line V—V in FIG. 4, and FIG. 6 is a cross-sectional view taken through the line VI—VI in FIG. 4. FIGS. 4, 5 and 6 show only the imaging section of this FIT type CCD solid state imager according to the present invention.

As illustrated, there is provided a CCD solid state imaging device 31 which comprises a silicon substrate 2 of a first conductivity type, e.g., N type, a well region 3 of a second conductivity type, i.e., P type formed on the silicon substrate 2, and an N-type impurity diffusion region 4, an N-type transfer channel region 6 forming a vertical transfer register 5 and a P-type channel stopper region 7, all of which are formed in the P-type well region 3. A P-type positive electric charge accumulation region 8 is formed on the N-type impurity diffusion region 4 and a second P-type well region 9 is formed beneath the N-type channel region 6.

A photodiode PD based on a PN junction j between the N-type impurity diffusion region 4 and the P-type well region 3 forms a photosensor section (photoelectric-conversion section) 10. The photosensor section 10 serves as a pixel and a plurality of photosensor sections 10 are arranged in a matrix fashion.

Transfer electrodes 16 (16A, 16B) formed of first and second polycrystalline silicon layers are formed through a gate insulating film 15 on the transfer channel region 6 forming the vertical transfer register 5, a read-out gate section 11 and the channel stopper region 7 of a semiconductor substrate 29 on which the above respective regions are formed. The transfer channel region 6, the gate insulating film 15 and the transfer electrode 16 constitute a vertical transfer register 5.

The vertical transfer register 5 is formed on one side of a column of each of the photosensor sections 10. The respective transfer electrodes 16 are shaped in band in the horizontal direction, and are sequentially arranged between the adjacent photosensor sections arranged in the vertical direction such that the transfer 16A, 16B formed of the first and second polycrystalline silicon layers are overlapped each other.

A shunt line layer 33 made of a first Al layer is formed along each vertical transfer register 5 through an interlayer insulating layer 32 made of a PSG (phosphor silicate glass), for example. As shown in FIG. 4, each shunt line layer 33 is connected to the corresponding transfer electrode 16 through a contact section 34. 4-phase transfer clocks $\phi V_1$, $\phi V_2$, $\phi V_3$ and $\phi V_4$, for example, are applied to each transfer electrode 16 through the shunt line layer 33.

In the contact portion 34, as shown in FIG. 5, a buffer polycrystalline silicon layer 35 is formed through the interlayer insulating layer 32 under the shunt line layer 33 in order to prevent the Al layer from projecting from the shunt line layer 33. The buffer polycrystalline silicon layer 35 and the shunt line layer 33 are connected together at a first position, and the buffer polycrystalline silicon layer 35 and the transfer electrode 16 are connected together at a second position different from the first position. Reference numeral 36 designates an insulating layer made of $SiO_2$ or the like.

The buffer polycrystalline silicon layer 35 may be removed and instead, the shunt line layer 33 and the polycrystalline silicon transfer electrode 16 may be connected through a barrier metal.

An interlayer insulating layer 37 made of plasma SiN, for example, is formed on the whole surface except the photosensor sections so as to cover the shunt line layer 33. A photo-shield layer 38 of a second Al layer is formed on the interlayer insulating layer 37 and is partly extended on the insulating layer 32 of the photosensor section 10.

A reflection preventing film 39 made of TiON or the like may be formed on the lower surface of the Al photo-shield layer 38.

The photo-shield layer 38 may not be limited to Al but might be W, Mo, Wsi, MoSi or the like.

According to the first embodiment of the present invention, in the CCD solid state imaging device 31 having the shunt line structure, the vertical transfer register 5 and adjacent photosensor sections 10 arranged in the vertical direction can be photo-shielded by forming the photo-shield layer 38 formed of the second Al layer on the vertical transfer register 5 except the photosensor section 120 through the interlayer insulating layer 37 covering the shunt line layer 33 made of the first Al layer and on the area provided between the adjacent photosensor sections 10 in the vertical direction.

In addition, since the interlayer insulating layer 37 is selectively removed at its portion corresponding to the photosensor section 10 and an extended section 38a of the photo-shield layer 38 to the photosensor section 10 side is formed on the under thin insulating layer 32, a photo-shield becomes more reliable and the smear component can be reduced.

Since the Al photo-shield layer 38 is formed independently of the shunt line layer 33, the potential at the photo-shield layer 38 can be set to the ground level.

Figure 1:
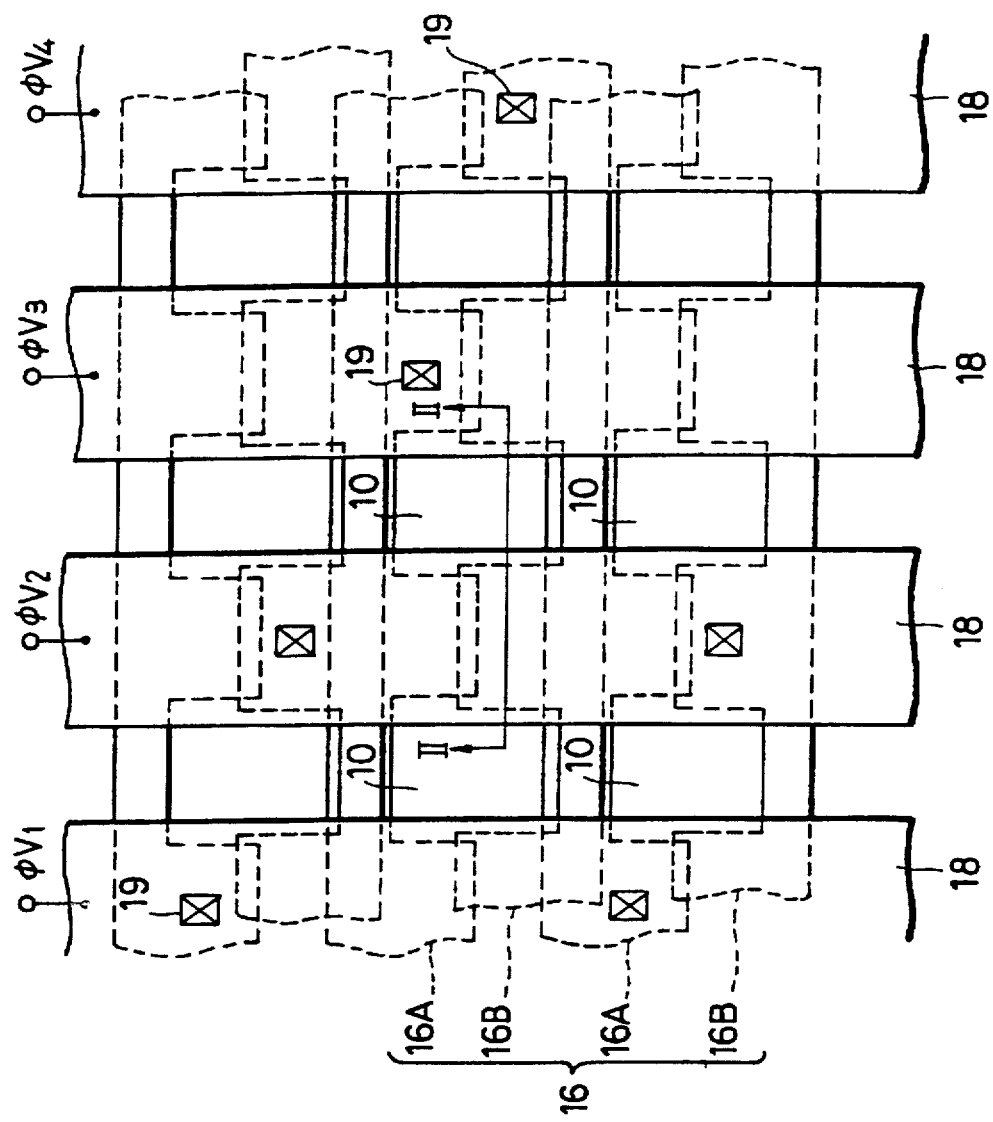
FIG. 1 is a plan view showing an example of a conventional CCD solid state imaging device, particularly, an imaging section thereof.
Figure 2:
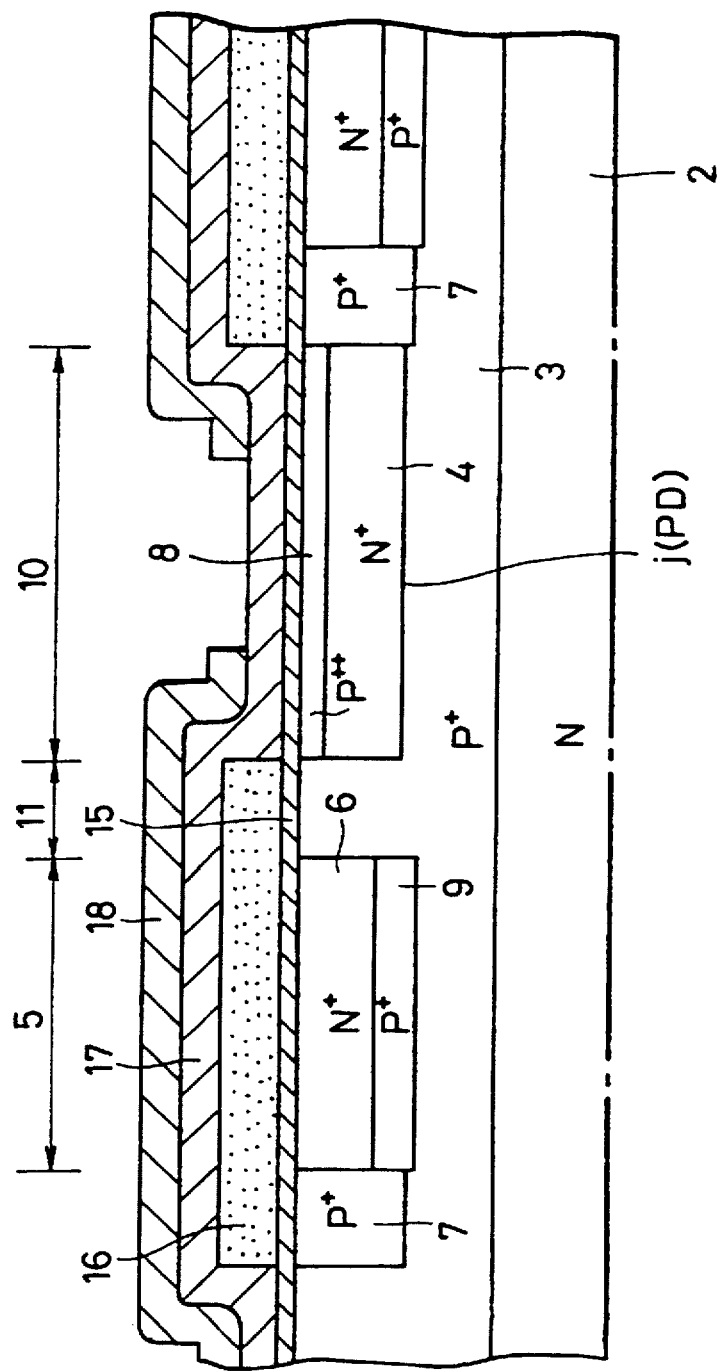
FIG. 2 is a cross-sectional view taken along the line II—II in FIG. 1.
Figure 3:
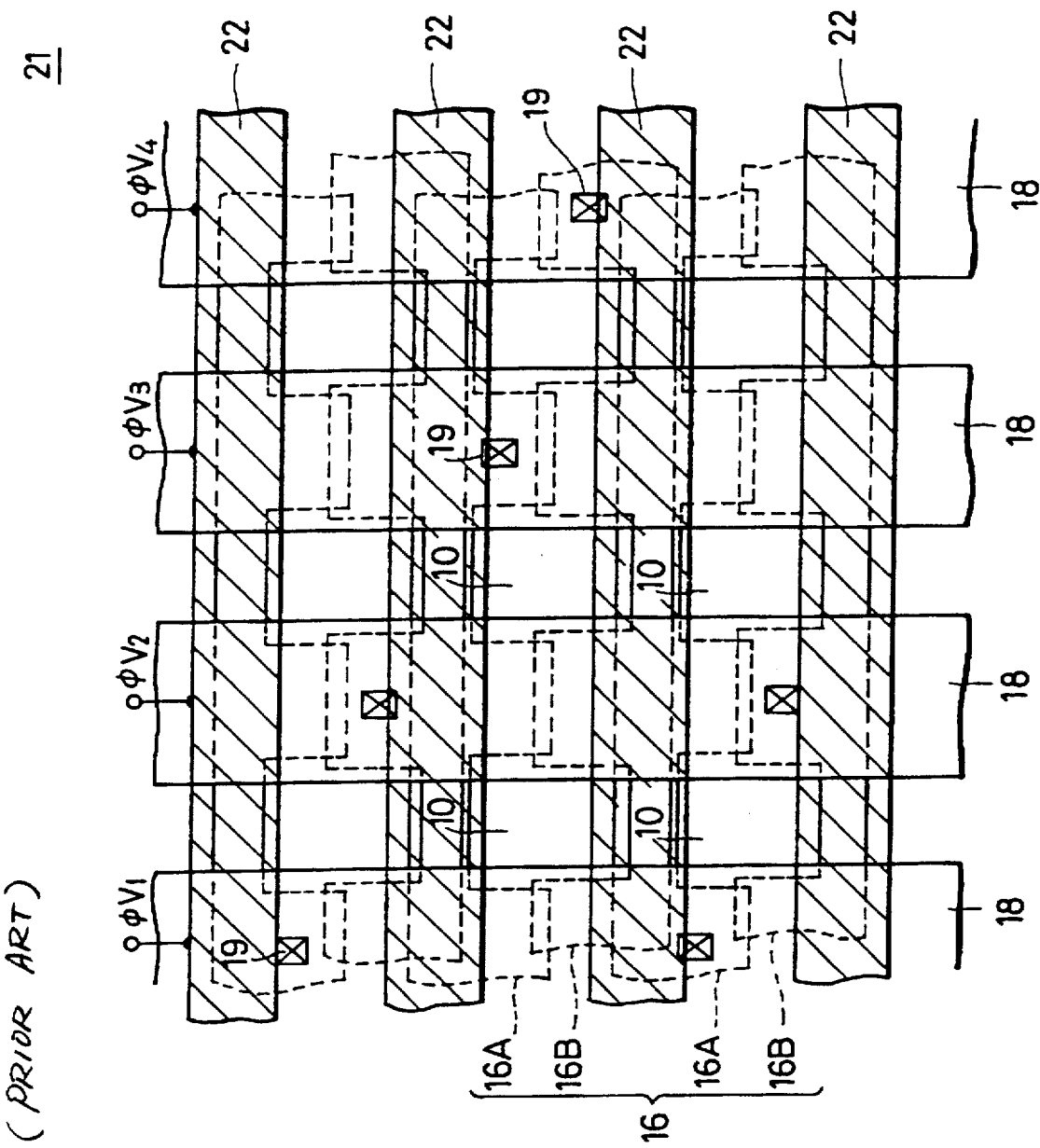
FIG. 3 is a plan view showing another example of the conventional CCD solid staging device, particularly, an imaging section thereof.

Since the shunt line layer is formed as the separate member unlike the conventional CCD solid state imaging device 1 that the shunt line layer is served also as the photo-shield layer as shown in FIG. 2, the reflection preventing film 39 made of TiON or the like can be formed under the photo-shield layer 38 by the conventional etching. Therefore, light, which is introduced into the insulating layer 32 formed under the extended portion 38a of the photo-shield layer 38, repeatedly reflected between the extended portion 38a and the silicon surface and introduced into the vertical transfer register 5, can be reduced so that the smear component can be reduced much more.

An example of a manufacturing method of the CCD solid state imaging device 31 according to the present invention will hereinafter be described with reference to FIGS. 7A, 7B through FIGS. 11A, 11B. FIGS. 7A, 7B through FIGS. 11A, 11B are cross-sectional views taken along the lines V—V and the lines VI—VI in FIG. 4, respectively.

Figure 7A:
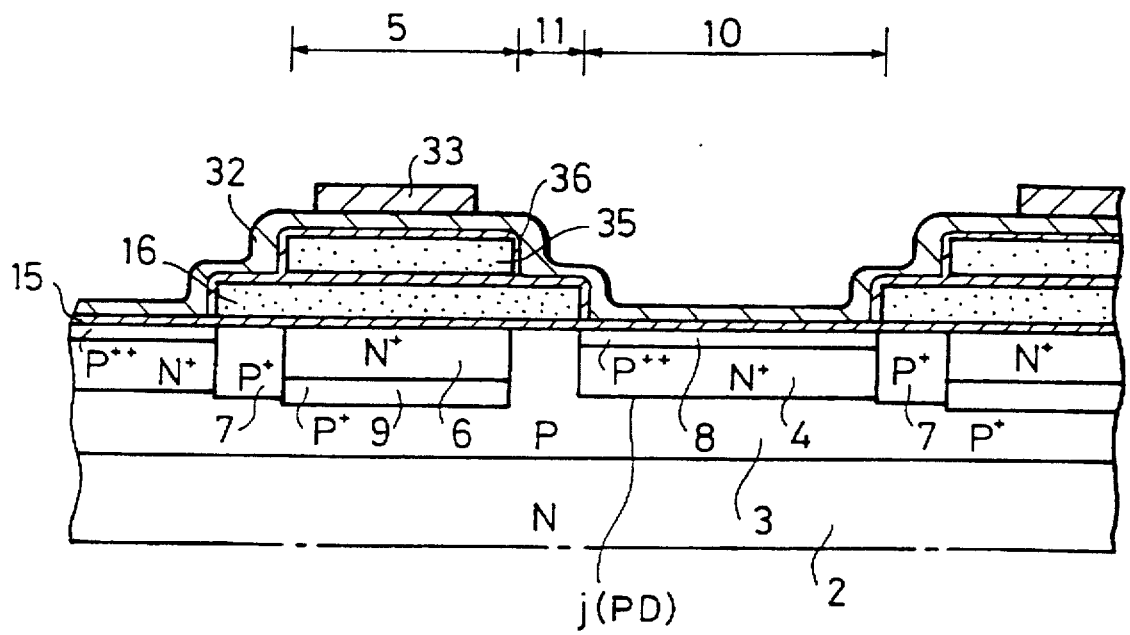
FIG. 7A is a manufacturing process diagram of the CCD solid state imaging device according to the present invention (corresponding to the cross-sectional view taken along the line V—V in FIG. 4)
Figure 7B:
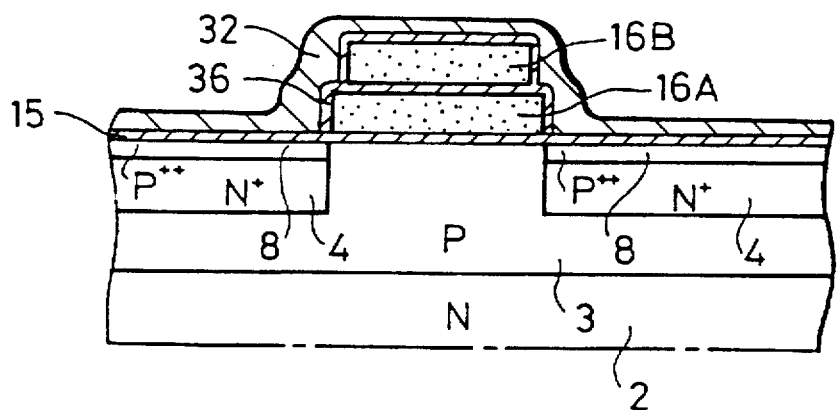
FIG. 7B is a manufacturing process diagram of the CCD solid state imaging device according to the present invention (corresponding to the cross-sectional view taken along the line VI—VI in FIG. 4)
Figure 8A:
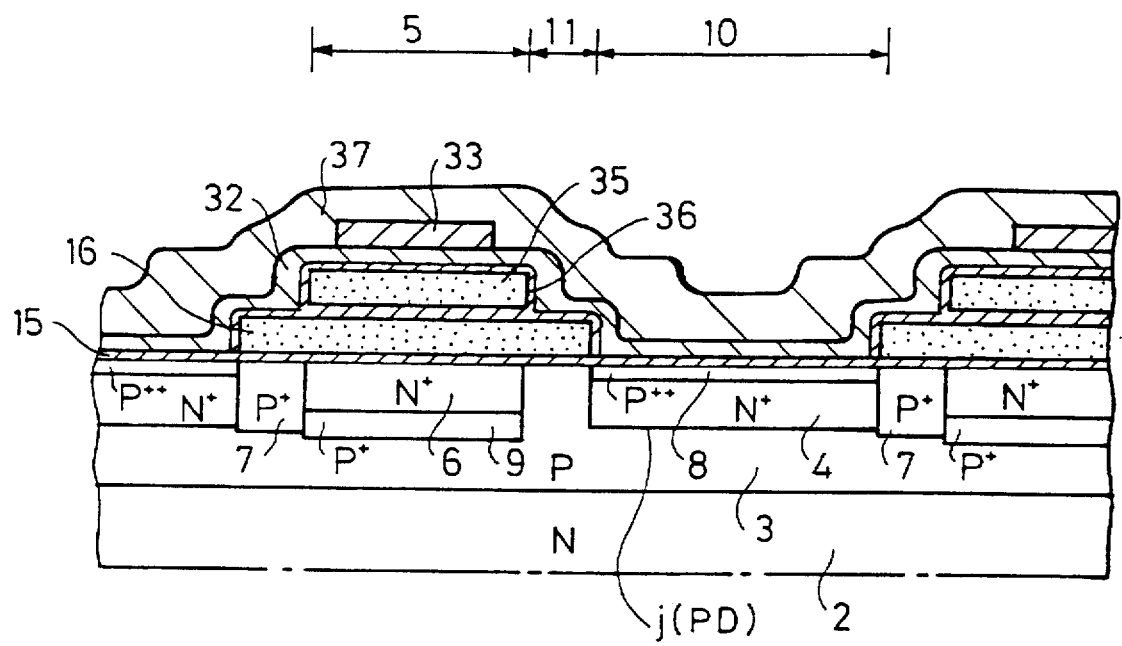
FIG. 8A is a manufacturing process diagram of the CCD solid state imaging device according to the present invention (corresponding to the cross-sectional view taken along the line V—V in FIG. 4)
Figure 8B:
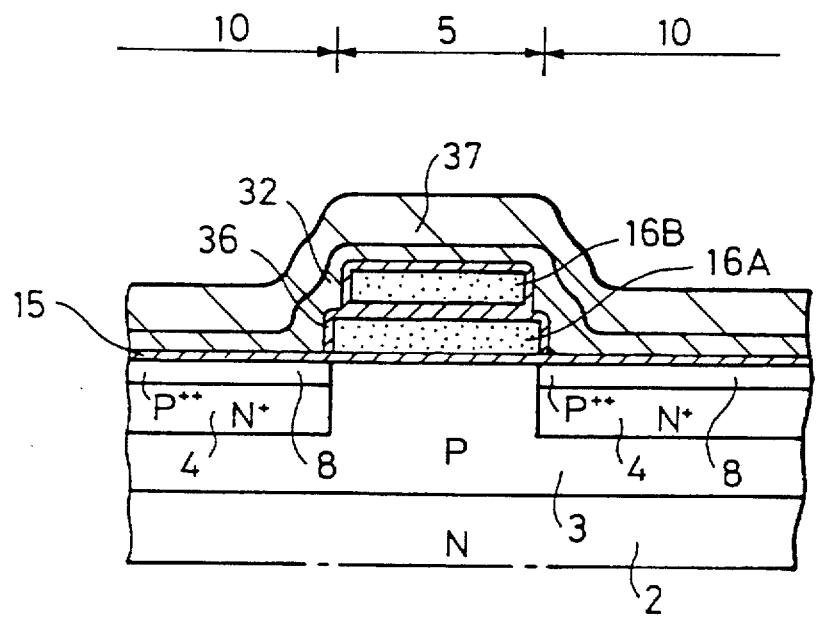
FIG. 8B is a manufacturing process diagram of the CCD solid state imaging device according to the present invention (corresponding to the cross-sectional view taken along the line VI—VI in FIG. 4)

As shown in FIGS. 7A, 7B, on an N-type silicon substrate 2 are formed a first P-type well region 3, an N-type impurity diffusion region 4 forming the photosensor section 10, the P-type positive electric charge accumulation region 8, an N-type transfer channel region 6 forming a vertical transfer register 5, a P-type channel stopper region 7 and a second P-type well region 9.

Transfer electrodes 16 (16A, 16B) made of first and second polycrystalline silicon layers are formed through a gate insulating film 15. A buffer polycrystalline silicon layer 35 is connected to the corresponding transfer electrode 16 along the vertical transfer register 5 through an insulating layer 36 made of SiO$_2$.

Subsequently, a PSG film 32 serving as an interlayer insulating layer is deposited on the whole surface and a shunt line layer 33 formed of a first Al layer is formed on each vertical transfer register 5. The shunt line layer 33 is connected at its predetermined portion to the buffer polycrystalline silicon layer 35 of the under layer.

An insulating layer, e.g., a plasma SiN-based film 37 is formed ont the whole surface so as to cover the shunt line layer 33.

Figure 9A:
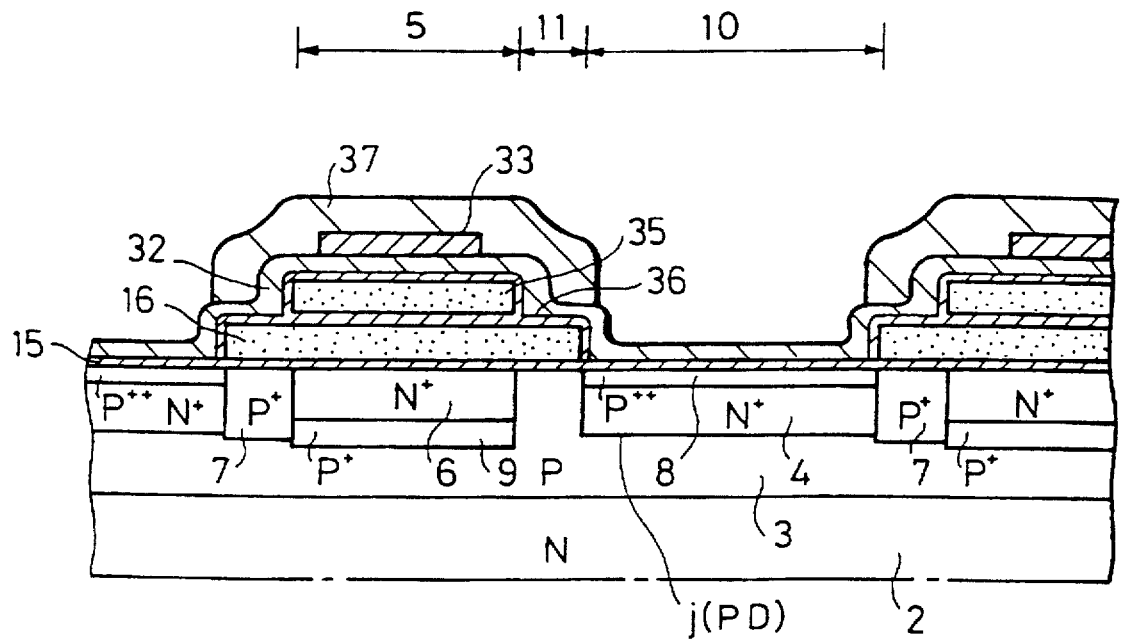
FIG. 9A is a manufacturing process diagram of the CCD solid state imaging device according to the present invention (corresponding to the cross-sectional view taken along the line V—V in FIG. 4)
Figure 9B:
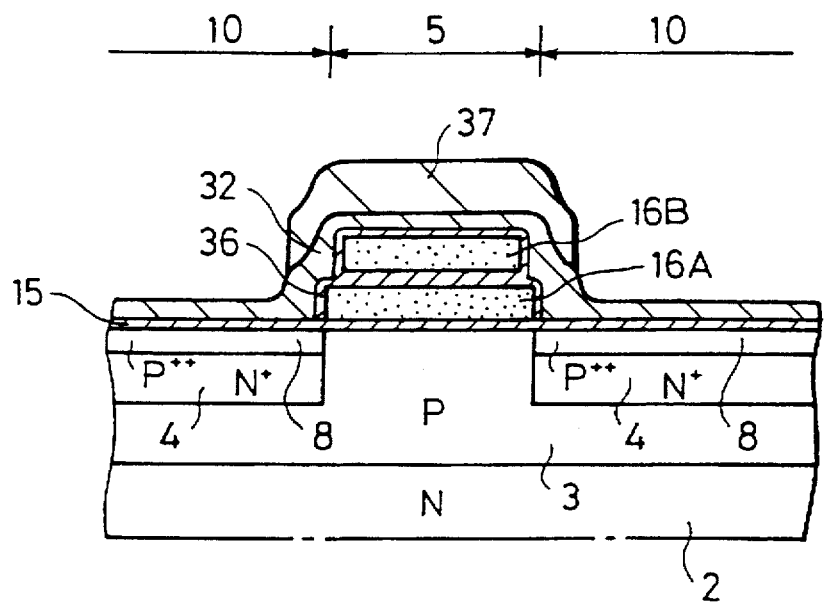
FIG. 9B is a manufacturing process diagram of the CCD solid state imaging device according to the present invention (corresponding to the cross-sectional view taken along the line VI—VI in FIG. 4)

Then, as shown in FIGS. 9A, 9B, the plasma SiN-based film 37 is selectively removed at its portion corresponding to the photosensor section 10 by etching. At that time, the plasma SiN-based layer 37 on the photosensor section 10 is selectively removed by etching the plasma SiN-based layer 37 in the mode in which an etching selectivity between the plasma SiN-based layer 37 and the PSG layer 32 serving as the support can be obtained.

Figure 10A:
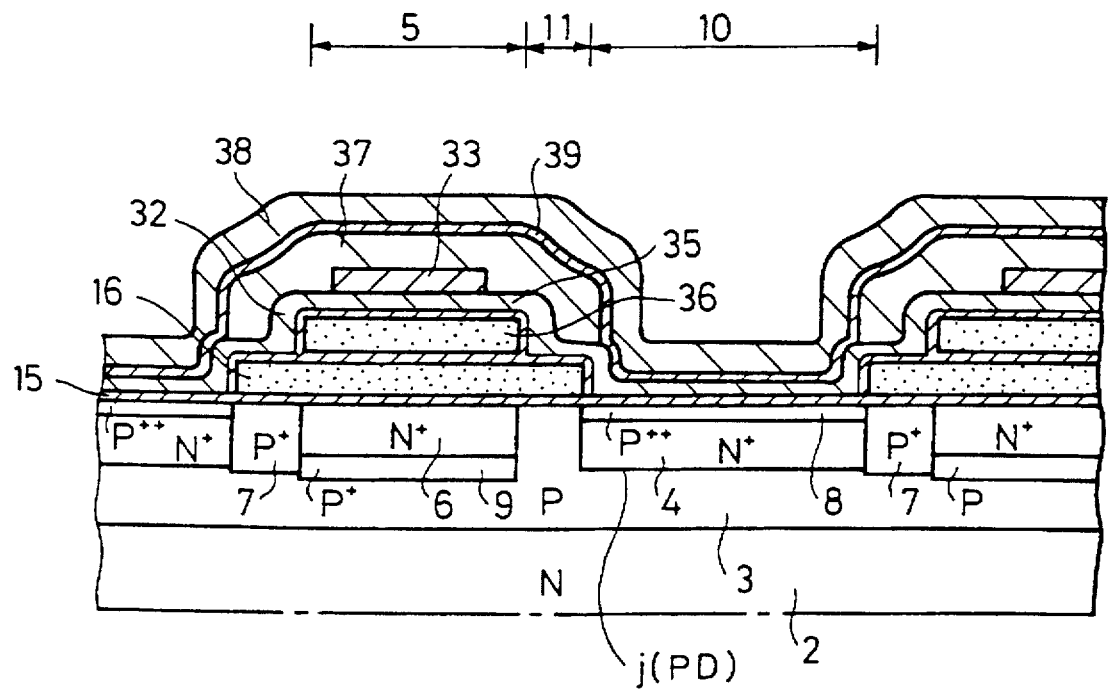
FIG. 10A is a manufacturing process diagram of the CCD solid state imaging device according to the present invention (corresponding to the cross-sectional view taken along the line V—V in FIG. 4)
Figure 10B:
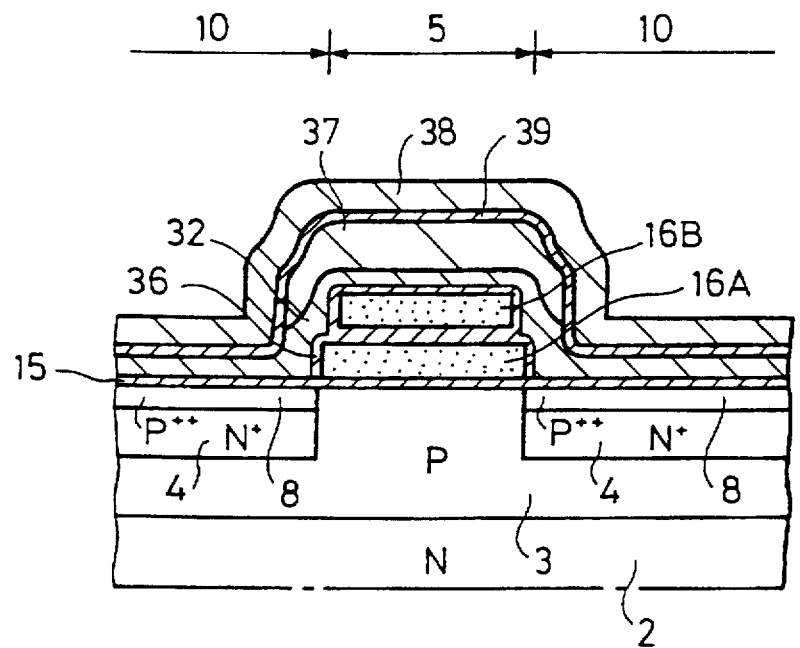
FIG. 10B is a manufacturing process diagram of the CCD solid state imaging device according to the present invention (corresponding to the cross-sectional view taken along the line VI—VI in FIG. 4)

As shown in FIGS. 10A, 10B, a reflection preventing film 39, e.g., TiON film is deposited on the whole surface and a photo-shield layer 38 formed of a second Al layer is formed on the whole surface of the reflection preventing film 39.

Figure 11A:
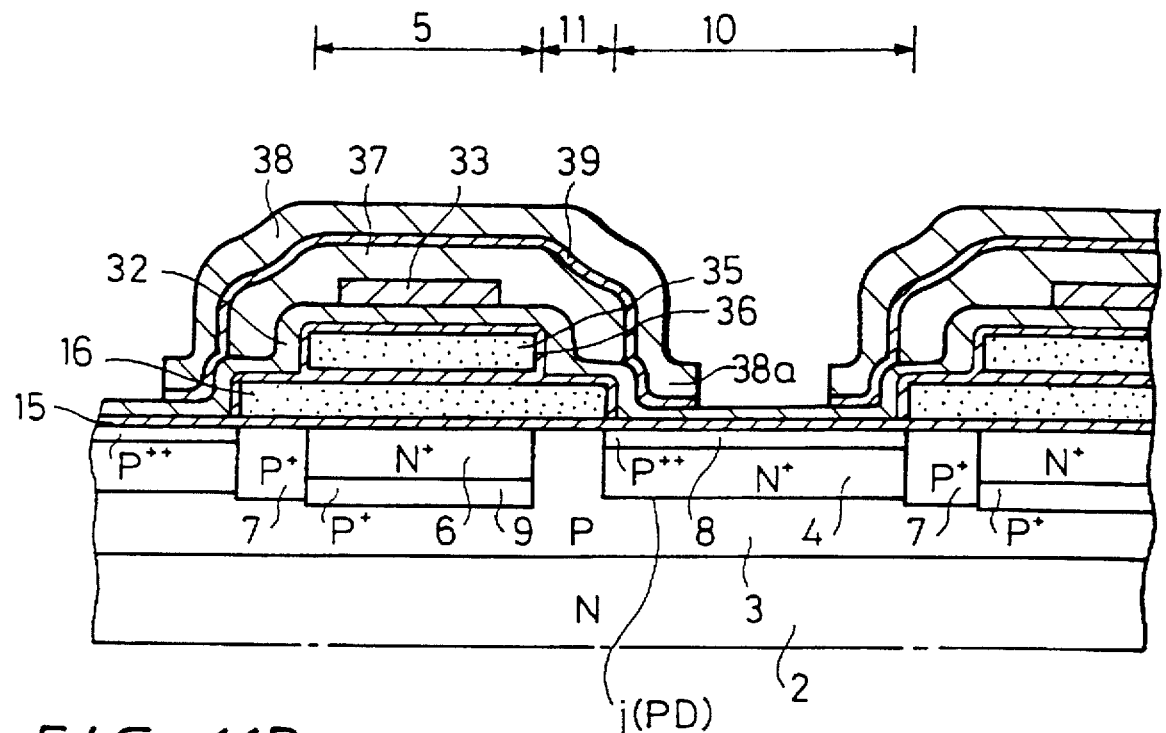
FIG. 11A is a manufacturing process diagram of the CCD solid state imaging device according to the present invention (corresponding to the cross-sectional view taken along the line V—V in FIG. 4)
Figure 11B:
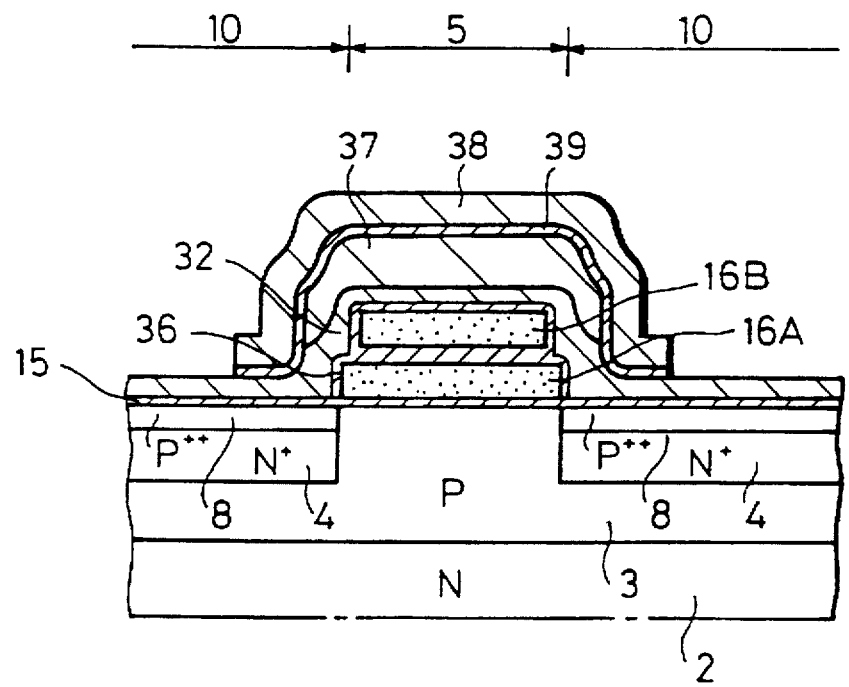
FIG. 11B is a manufacturing process diagram of the CCD solid state imaging device according to the present invention (corresponding to the cross-sectional view taken along the line VI—VI in FIG. 4)

Subsequently, as shown in FIGS. 11A, 11B, the photo-shield layer 38 and the TiON film 39 on the photosensor section 10 are both selectively removed by etching so as to leave the extended portion 38a of the photo-shield layer 38 in the photo-sensor section 10. Thus, there can be obtained a desired FIT type CCD solid state imaging device 31.

According to this manufacturing method, after the plasma SiN-based layer 37 is formed on the whole surface so as to cover the shun line layer 33, only the PSG layer 32 is left on the photosensor section 10 as the insulating layer by selectively removing the plasma SiN-based layer 37 on the photosensor section 10 in the mode in which the selectivity relative to the PSG layer 32 of the support layer is achieved. Accordingly, the extended portion 38a of the succeeding photo-shield layer 38 is formed on the PSG layer 32. Since the film thickness of the PSG layer 32 can be reduced so that a smear component can be reduced considerably.

Figure 12:
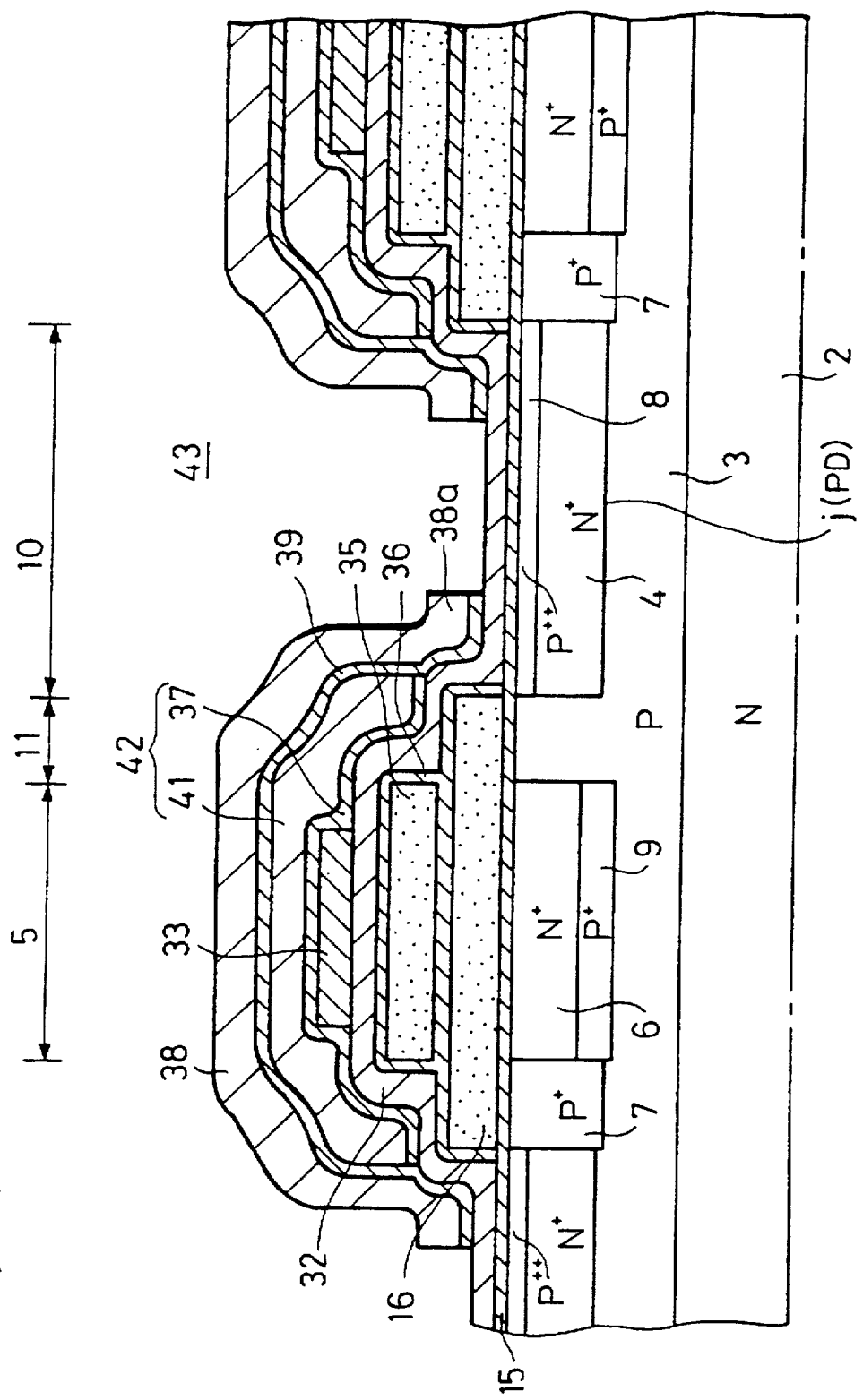
FIG. 12 is a cross-sectional view corresponding to the cross-sectional view taken along the line V—V in FIG. 4 and showing the CCD solid state imaging device according to other embodiment of the present invention.
Figure 13:
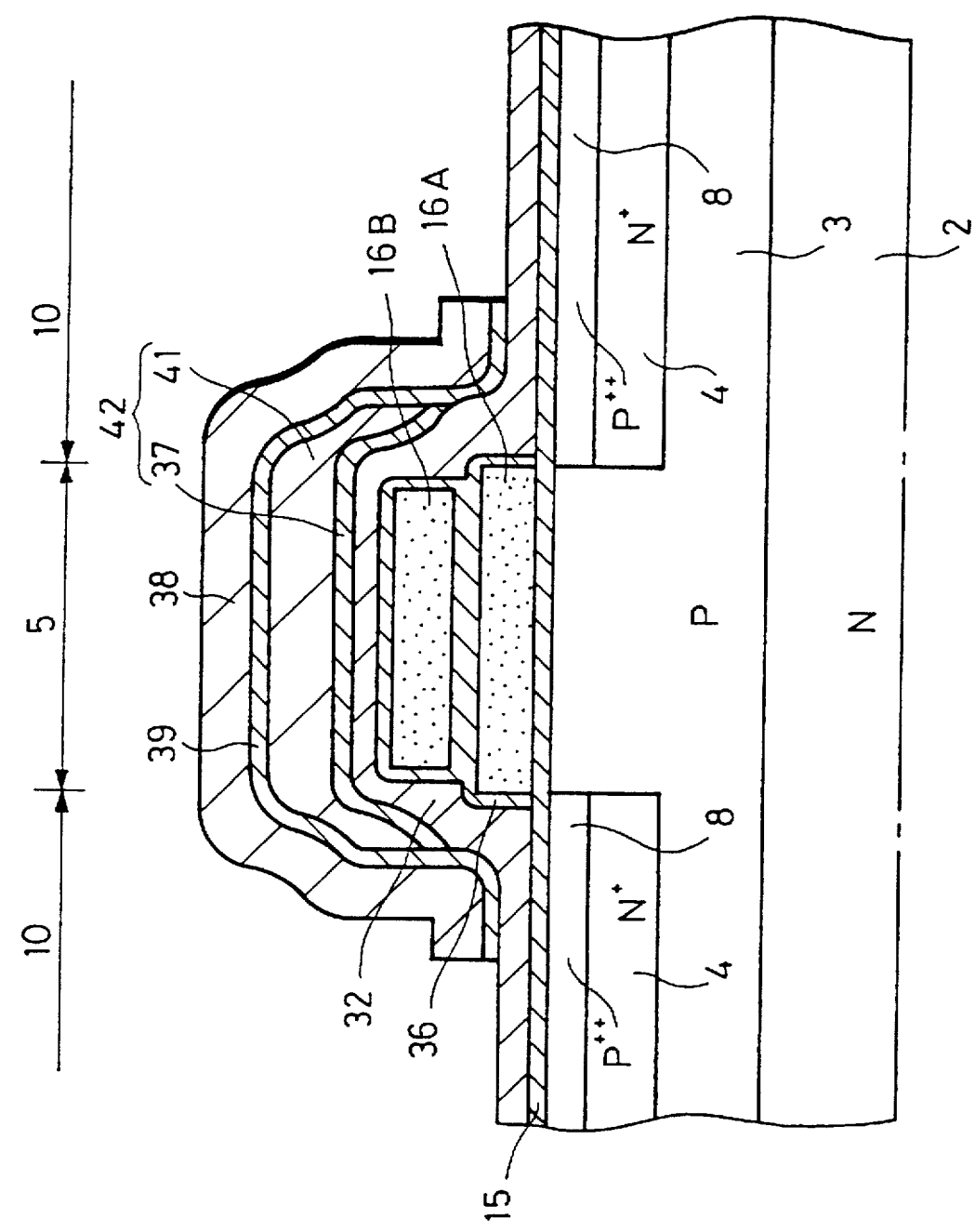
FIG. 13 is a cross-sectional view corresponding to the cross-sectional view taken along the line VI—VI in FIG. 4 and showing the CCD solid state imaging device according to other embodiment of the present invention.

FIGS. 12 and 13 show a CCD solid state imaging device according to a second embodiment of the present invention. FIGS. 12 and 13 are respectively cross-sectional views taken along the line V—V and the line VI—VI in FIG. 4. As shown in FIGS. 12 and 13, in a CCD solid state imaging device 43 according to this embodiment, an interlayer insulating layer 42 which covers the shunt line layer 33 is formed of a laminated layer of a thin plasma SiN-based film 37 of a support layer and a plasma SiO-based film 41 of an upper layer. The photo-shield layer 38 formed of the Al layer is formed on the interlayer insulating layer 42. A rest of the arrangements in FIGS. 12 and 13 is similar to FIGS. 5 and 6 and therefore need not be described in detail.

The CCD solid state imaging device 43 according to this embodiment can achieve effects similar to those of the CCD solid state imaging device shown in FIGS. 4 through 7. In addition, since the the interlayer insulating layer 42 provided between the shunt line layer 33 of the first Al layer and the photo-shield layer 38 of the second Al layer is formed of the laminated layer of the plasma SiN-based layer 37 and the plasma SiO-based film 41 having a specific inductive capacity smaller than that of the plasma SiN layer 37, a capacity between the shunt line layer 33 and the photo-shield layer 38 can be reduced by half as compared with the CCD solid state imaging devices shown in FIGS. 4 through 7. As a consequence, a load capacity of a transfer clock terminal of the vertical transfer register 5 is reduced and a power consumption can be reduced.

FIGS. 14A, 14B through FIGS. 18A, 18B show an example of a manufacturing method of the CCD solid state imaging device 43. FIGS. 14A, 14B through FIGS. 18A, 18B are cross-sectional views taken along the line V—V and the line VI—VI in FIG. 4.

Figure 14A:
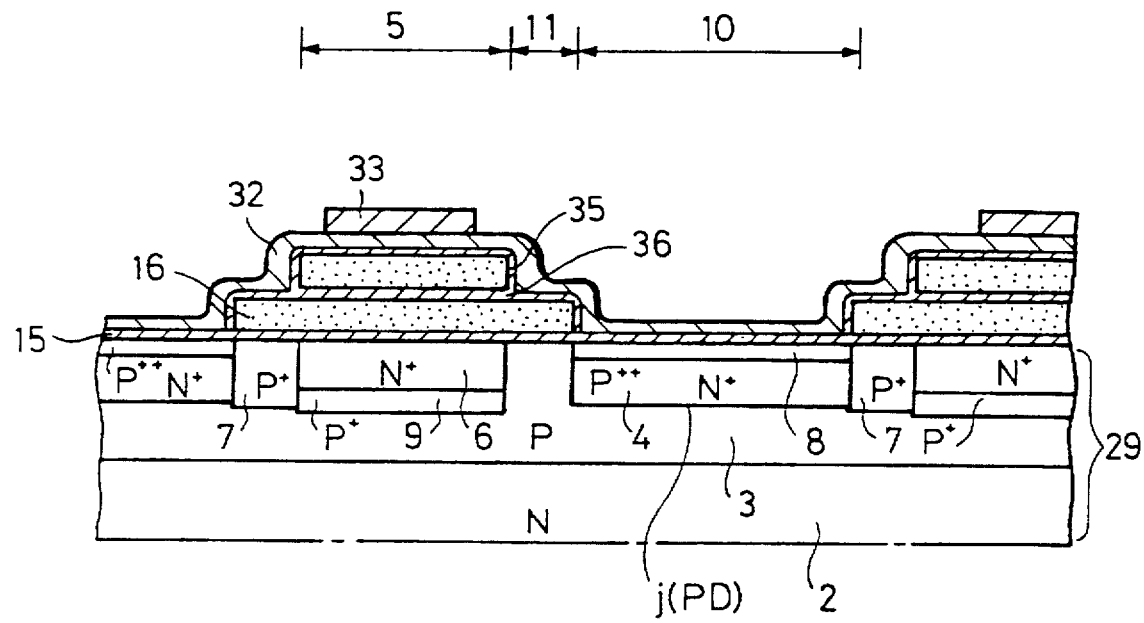
FIG. 14A is a manufacturing process diagram of the CCD solid state imaging device according to other embodiment of the present invention (corresponding to the cross-sectional view taken along the line V—V in FIG. 4)
Figure 14B:
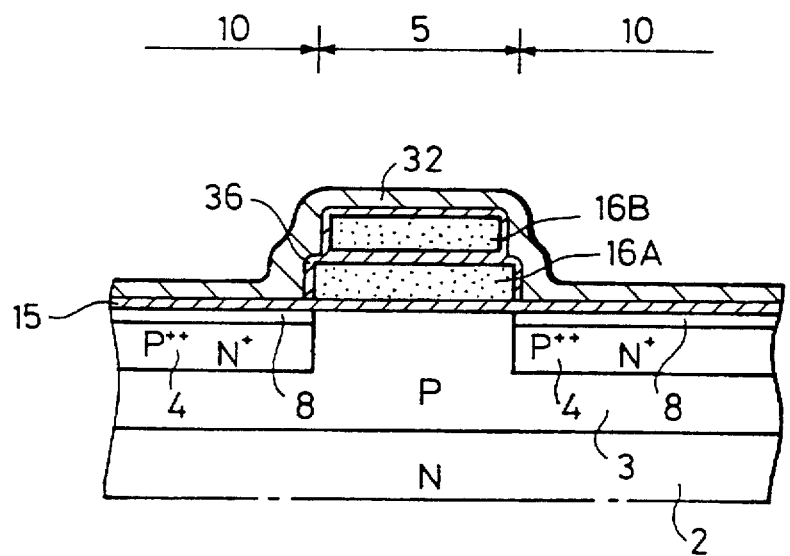
FIG. 14B is a manufacturing process diagram of the CCD solid state imaging device according to other embodiment of the present invention (corresponding to the cross-sectional view taken along the line VI—VI in FIG. 4)

FIGS. 14A, 14B show processes similar to those of FIGS. 7A, 7B. Specifically, as shown in FIG. 14A and 14B, on the N-type silicon substrate 2 are formed the first P-type well region 3, the N-type impurity diffusion region 4 forming the photosensor section 10, the P-type positive electric charge accumulation region 8, the N-type transfer channel region 6 forming the vertical transfer register 5, the P-type channel stopper region 7 and the second P-type well region 9.

Polycrystalline silicon transfer electrodes 16 (16A, 16B) are formed through a gate insulating film 15 on a semiconductor substrate 29 on which the above-mentioned regions are formed. A buffer polycrystalline silicon layer 35 is connected to a part of the corresponding transfer electrode 16 through the insulating film 36 along each vertical transfer register 5. Further, the PSG layer 32 is formed on the whole surface and the shunt line layer 33 formed of the first Al layer is formed on each vertical transfer register 5.

Figure 15A:
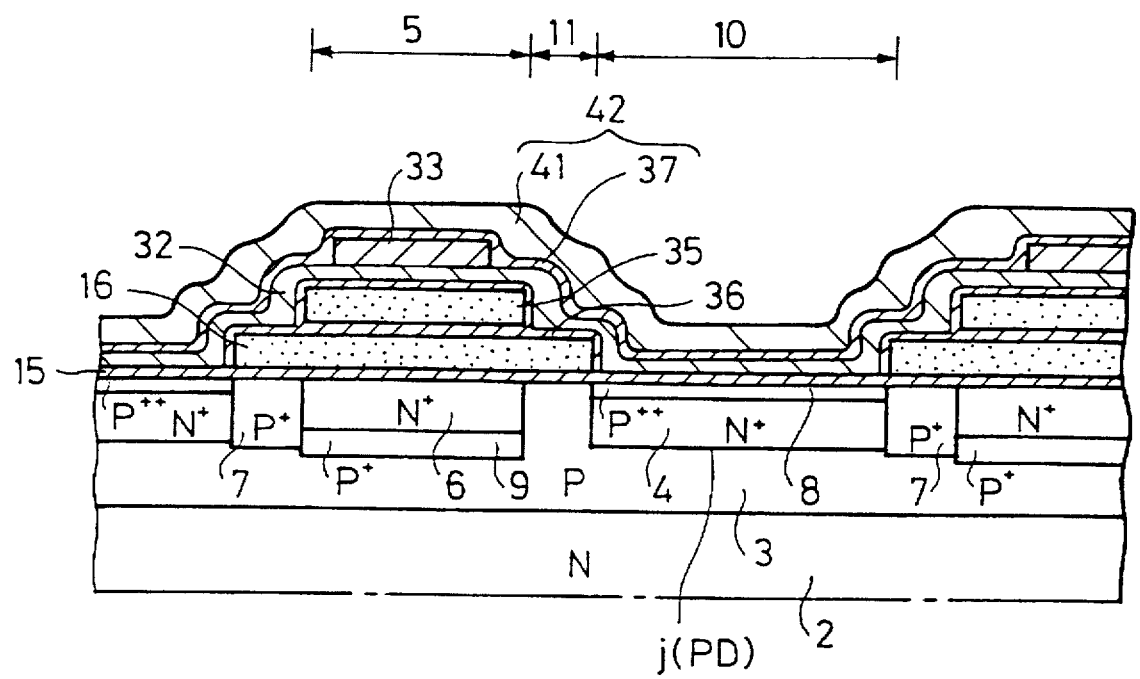
FIG. 15A is a manufacturing process diagram of the CCD solid state imaging device according to other embodiment of the present invention (corresponding to the cross-sectional view taken along the line V—V in FIG. 4)
Figure 15B:
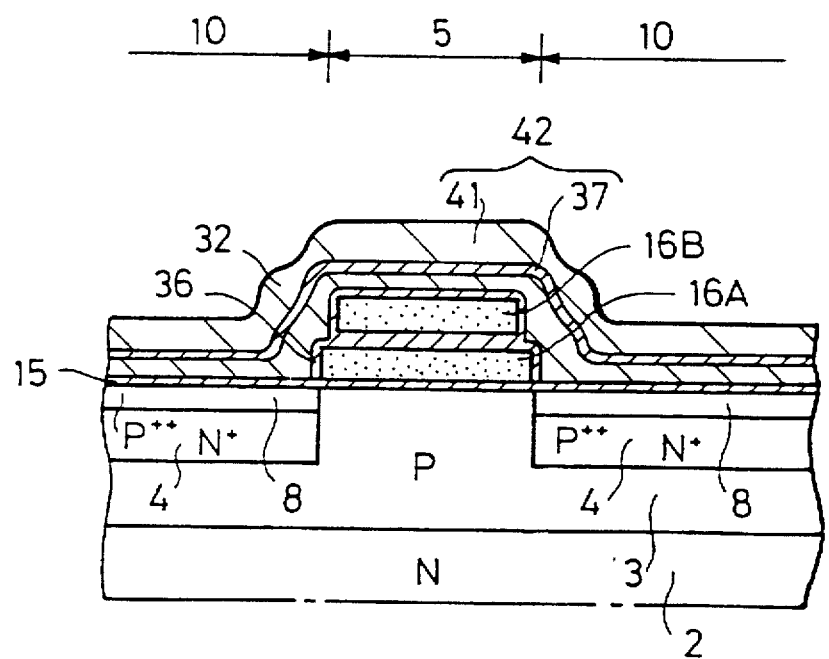
FIG. 15B is a manufacturing process diagram of the CCD solid state imaging device according to other embodiment of the present invention (corresponding to the cross-sectional view taken along the line VI—VI in FIG. 4)

Subsequently, as shown in FIGS. 15A, 15B, a thin plasma SiN-based film 37 is deposited on the whole surface and a thick plasma SiO-based film 41 is formed on the thin plasma SiN-based film 37, thereby an interlayer insulating layer 42 being formed of the laminated layer.

Figure 16A:
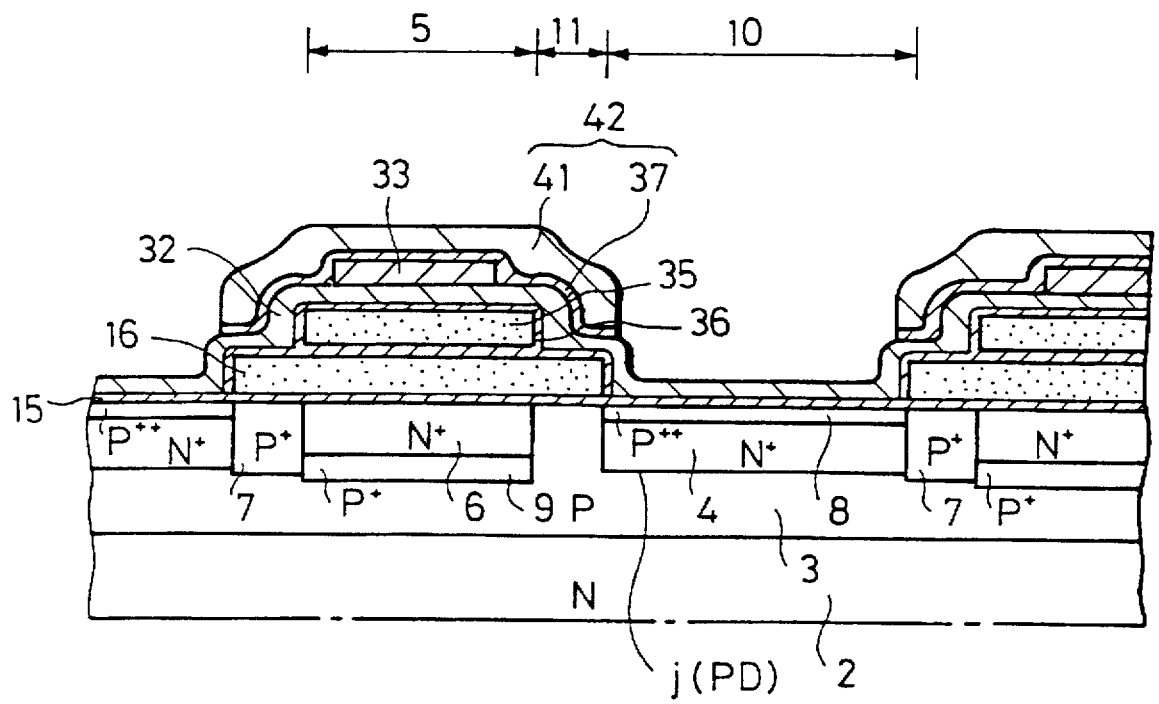
FIG. 16A is a manufacturing process diagram of the CCD solid state imaging device according to other embodiment of the present invention (corresponding to the cross-sectional view taken along the line V—V in FIG. 4)
Figure 16B:
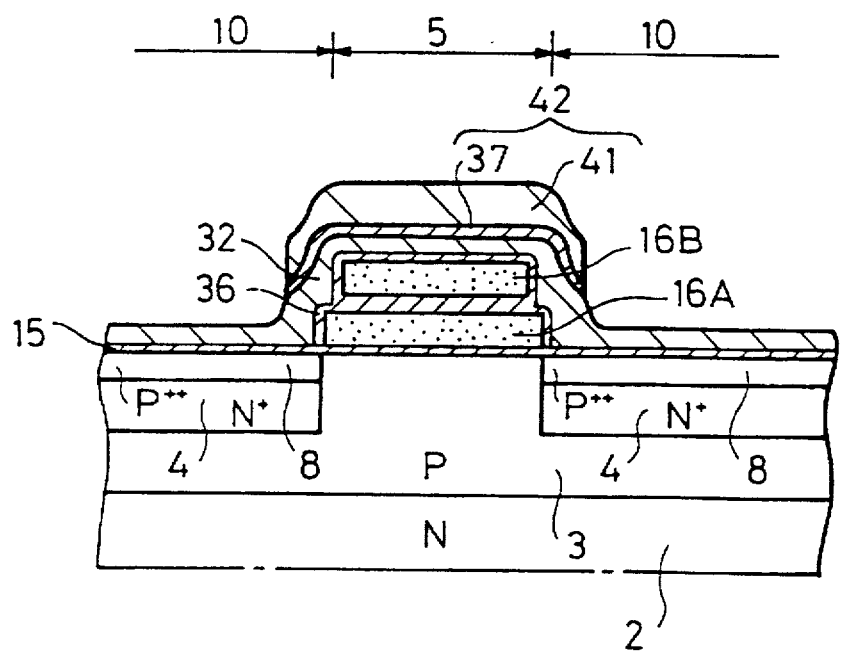
FIG. 16B is a manufacturing process diagram of the CCD solid state imaging device according to other embodiment of the present invention (corresponding to the cross-sectional view taken along the line VI—VI in FIG. 4)

Then, as shown in FIGS. 16A, 16B, the plasma SiO-based film 41 and the plasma SiN-based film 37 are selectively removed at their portions corresponding to the photosensor section 10 by etching.

In this case, the plasm SiO-based film 41 is selectively removed by etching in the plasma SiO-based etching mode. Then, when the end of this etching mode is detected, the plasma SiO etching mode is switched to the plasma SiN-based etching mode and the plasma SiN-based film 37 is selectively removed by etching in the plasma SiN etching mode.

Figure 17A:
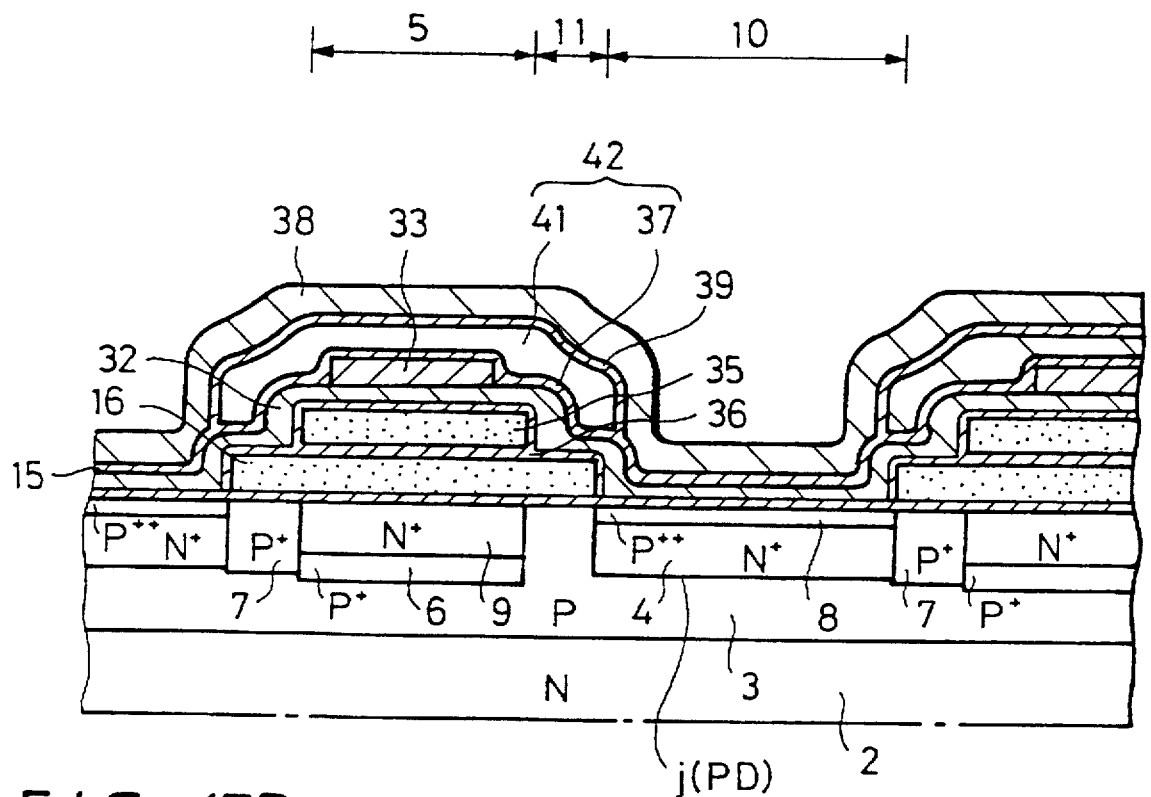
FIG. 17A is a manufacturing process diagram of the CCD solid state imaging device according to other embodiment of the present invention (corresponding to the cross-sectional view taken along the line V—V in FIG. 4)
Figure 17B:
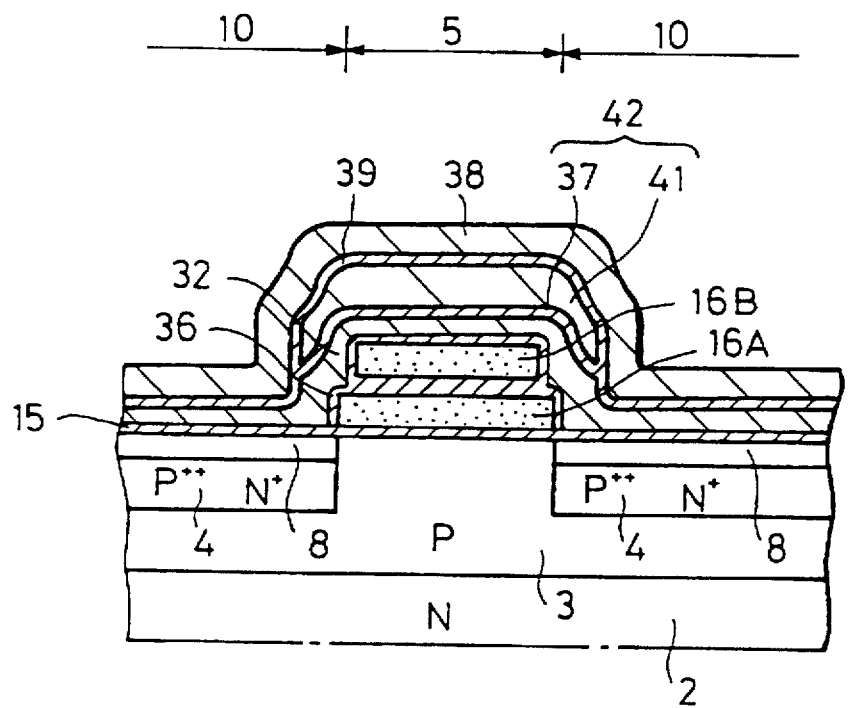
FIG. 17B is a manufacturing process diagram of the CCD solid state imaging device according to other embodiment of the present invention (corresponding to the cross-sectional view taken along the line VI—VI in FIG. 4)

As shown in FIGS. 17A, 17B, a TiON film 39 serving as the reflection preventing film and the photo-shield layer 38 formed of the second Al layer are sequentially deposited on the whole surface.

Figure 18A:
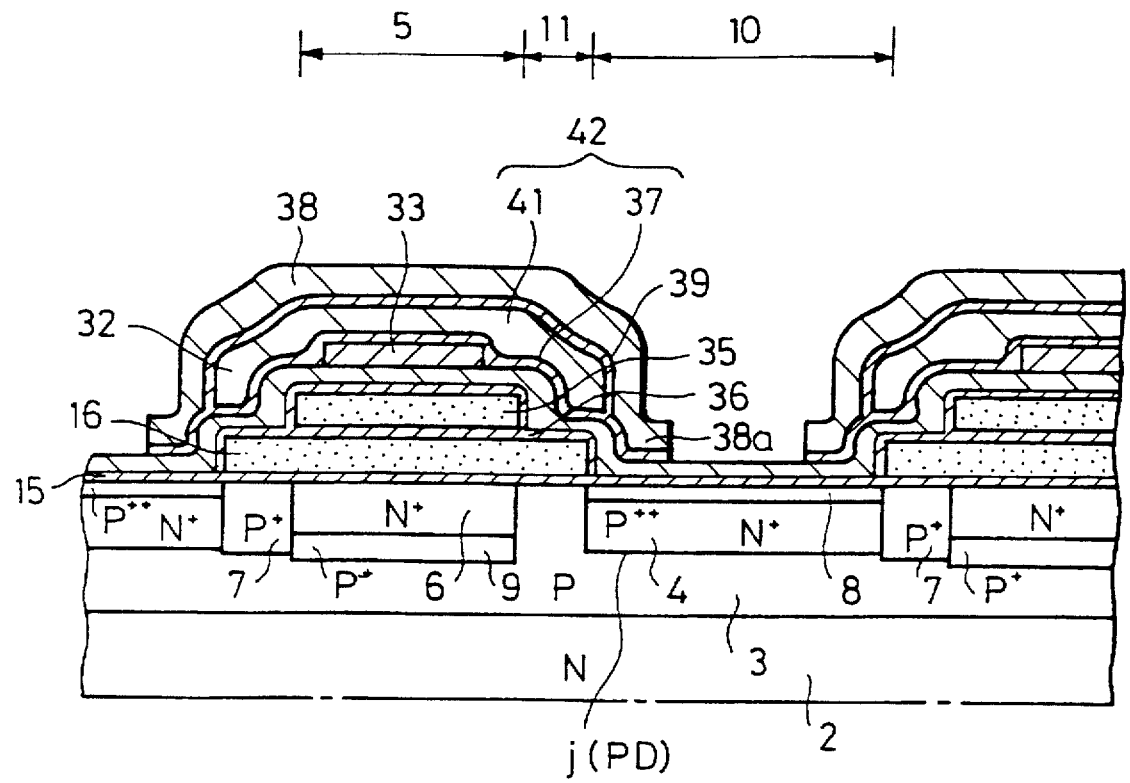
FIG. 18A is a manufacturing process diagram of the CCD solid state imaging device according to other embodiment of the present invention (corresponding to the cross-sectional view taken along the line V—V in FIG. 4)
Figure 18B:
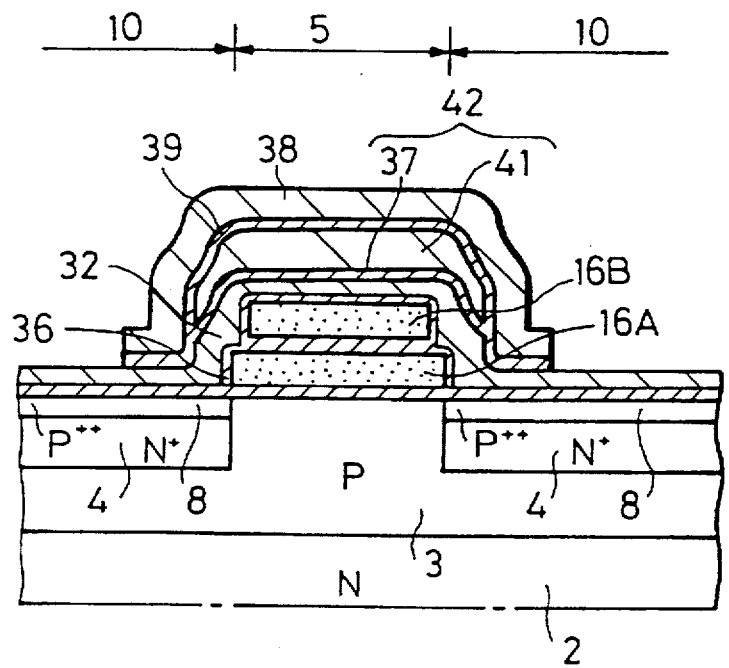
FIG. 18B is a manufacturing process diagram of the CCD solid state imaging device according to other embodiment of the present invention (corresponding to the cross-sectional view taken along the line VI—VI in FIG. 4)

Subsequently, as shown in FIGS. 18A, 18B, a desired CCD solid state imaging device 43 can be obtained by selectively removing both the photo-shield layer 38 and the TiON film 39 on the photosensor section 10 by etching so as to leave the extended portion 38a of the photos-shield layer 38 into the photosensor section 10.

While the interlayer insulating layers 37, 42 that cover the shunt line layer 33 are formed on the whole surface of the vertical transfer register 5 and the photosensor section 10 in the vertical direction except the photosensor section 10 in the structures shown in FIGS. 5, 6 and in the structures shown in FIGS. 12, 14, the present invention is not limited thereto and the interlayer insulating layers 37, 42 may not formed on the portions corresponding to the photosensor sections 10 in the vertical direction and the photo-shield layer 38 may be formed thereon.

FIGS. 19A through 19H show other example of a manufacturing method of the CCD solid state imaging device according to the present invention. FIGS. 19A through 19H which show the sequential processes of this manufacturing method are cross-sectional views taken along the line V—V in FIG. 4. As shown in the process diagrams of FIGS. 19A through 19H, respective regions of the semiconductor substrate 29 are formed similarly to those of FIG. 5, though not shown.

Initially, as shown in FIG. 19A, polycrystalline silicon transfer electrodes 16 (16A, 16B) are formed on the semiconductor substrate 29 through the gate insulating film (e.g., bilayer of an SiO₂ film and an SiN film) 15, and the buffer polycrystalline silicon layer 35 is connected to the corresponding transfer electrode 16 along the vertical transfer register 5 through the insulating film 36 made of SiO₂, for example. Subsequently, an insulating film 51 made of SiO₂ is formed on the whole surface, and a contact-hole 52 is bored through the insulating film 51 at its position corresponding to a predetermined connection portion of the buffer polycrystalline silicon layer 35, whereafter a first metal film, such as Al, W, an Al film 53, in this embodiment, of the shunt line layer is deposited on the whole surface.

Then, as shown in FIG. 19B, a shunt line layer 3 formed of the first Al layer 53 is formed on the first buffer polycrystalline silicon layer 35 by patterning the first Al layer 3. Also, the first Al film 53 is removed such that a part of the first Al film is removed on an outer peripheral step portion extended from the photosensor section 10, i.e., an Al protecting film 54 is formed.

Figures 19C, 19D:
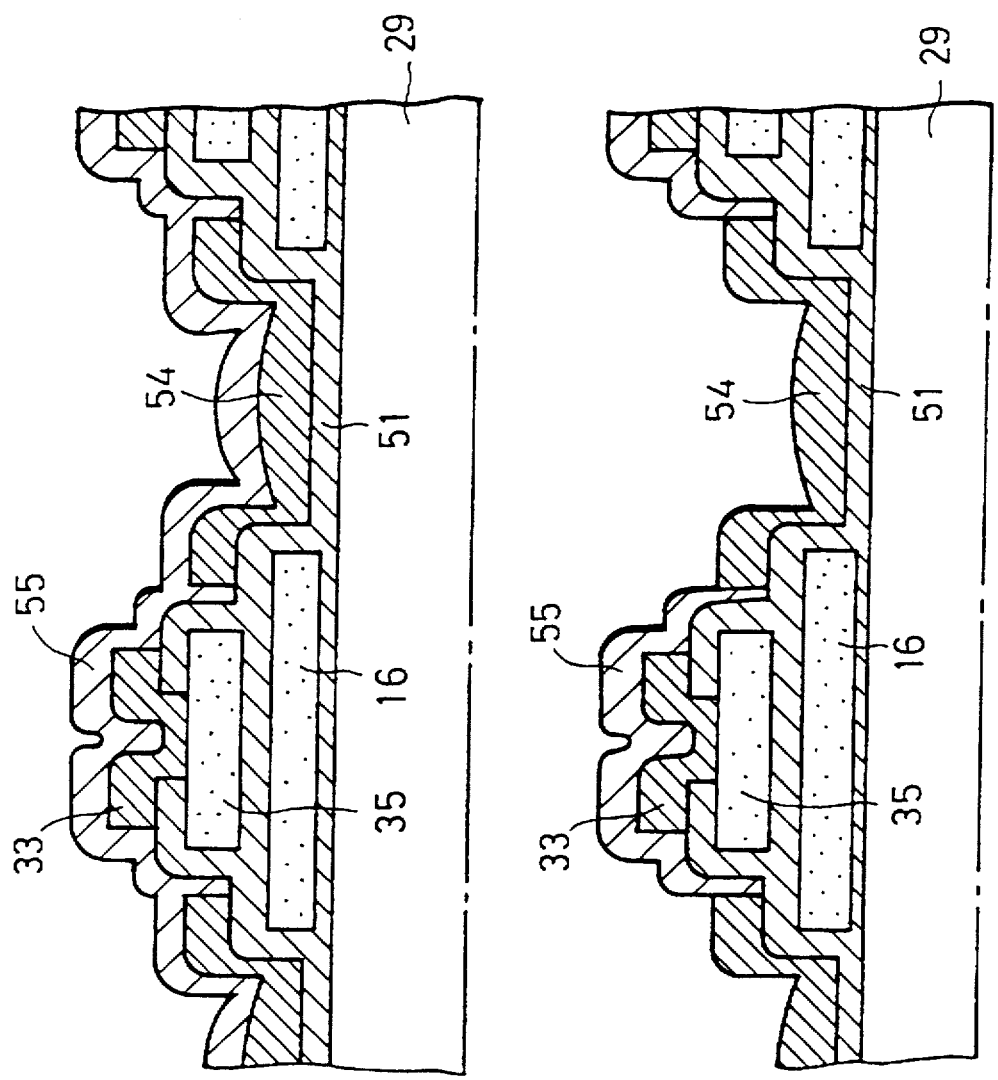

As shown in FIG. 19C, an interlayer insulating layer 55 is formed on the whole surface including the vertical transfer register 5 and the photosensor section 10. The interlayer insulating layer 55 may be formed of a plasma SiO-based film or a plasma SiN-based film which can be formed at low temperature because the interlayer insulating layer 55 is deposited on the Al film.

Then, the interlayer insulating layer 55 is selectively removed only at its portion on the Al protecting layer 54 corresponding to the photosensor section 10 by etching, thereby the interlayer insulating layer 55 being left so as to surround the shunt line layer 33. When the interlayer insulating layer 55 is selectively removed by etching, the Al protecting layer 54 on the photosensor section 10 can serve as an etching stopper region to cease the etching. Therefore, the insulating film 51 of the support can be prevented from being damaged, and can be protected so as to main a predetermined film thickness.

Figure 19E:
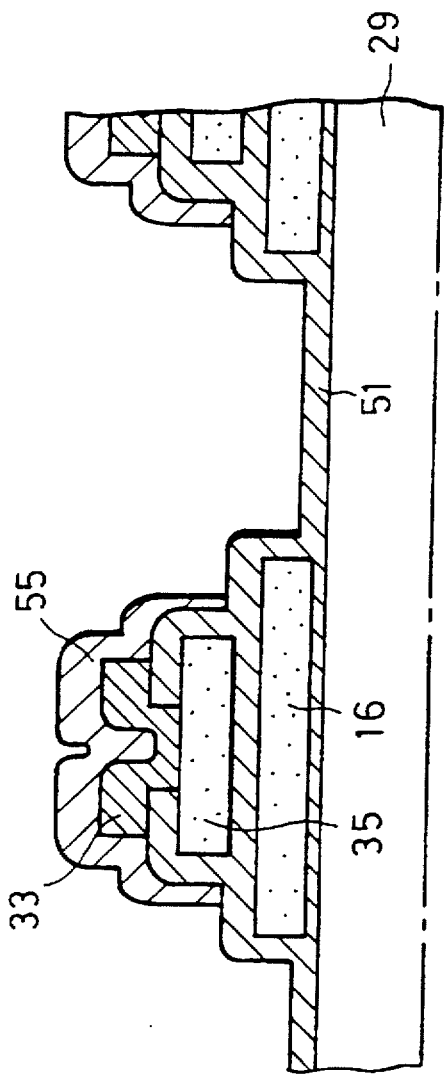

Subsequently, as shown in FIG. 19E, the protecting film 54 which was formed on the photosensor section 10 as the protecting film upon etching is selectively removed with a small damage by etching having a small stress, such as a wet etching or the like.

Figure 19F:
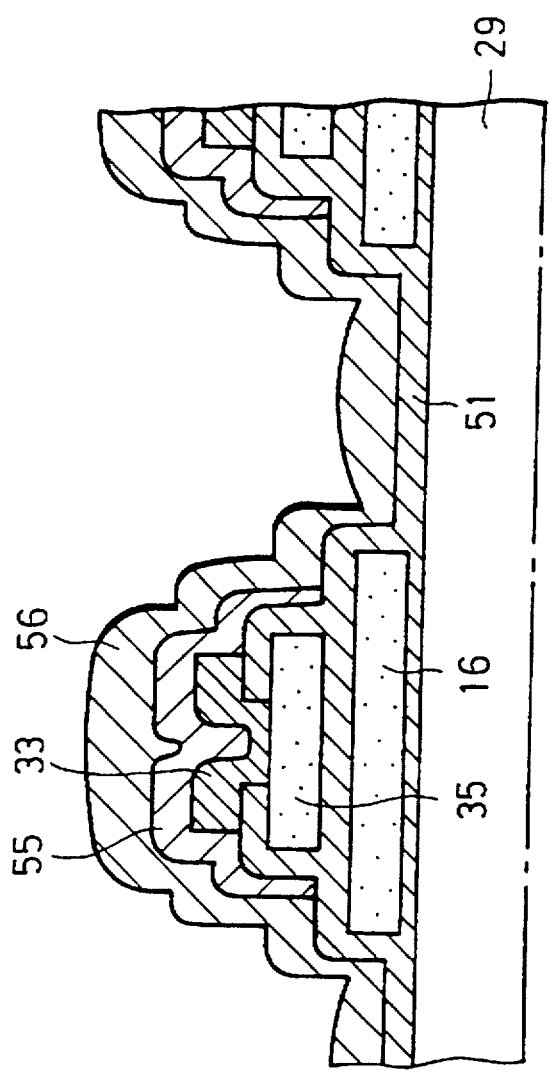

As shown in FIG. 19F, a second metal layer serving as a photo-shield layer, such as Al, W, an Al film 56 in this embodiment, is deposited on the whole surface.

As shown in FIG. 19G, an opening portion 10a is formed by selectively removing the second Al film 56 at its portion on the photosensor section 10 by etching. A photo-shield layer 38 having an integral extended portion 38a partly extended to the photosensor section 10 side is formed on the opening portion 10a.

Thereafter, as shown in FIG. 19H, an insulating protecting film 57 made of a material such as plasma SiN-based film or plasma SiO-based film is deposited on the whole surface. Thus, there can be obtained a desired FIT type CCD solid state imaging device 58.

According to this manufacturing method, the shunt line layer 33 is formed by patterning the first Al film 53 and a part of the first Al layer 53 is left on the photosensor section 10 as the protecting film 54. Under this condition, the insulating film 55 which covers the shunt line layer 33 is formed on the whole surface, whereafter the insulating film 55 on the photosensor section 10 is selectively removed by etching. Thus, the Al protecting film 54 on the photosensor section 10 can be served as the etching stopper to protect the insulating film 51 of the support having the predetermined thickness. That is, the insulating film 51 can be prevented from being exposed to the plasma and also prevented from being etched.

Thereafter, since the photo-shield film 38 is formed after the Al protecting film 54 was removed, the extended portion 38a of the photo-shield film 38 is formed on the thin insulating film 51.

As described above, since the insulating film 51 on the photosensor section 10 can reduce the influence of the etching when the interlayer insulating layer 55 formed on the insulating film 51 is selectively removed by etching, i.e., the stress applied to the insulating film 51 when the interlayer insulating layer 55 is selectively removed by etching, it is possible to suppress the occurrence of a white defect when the CCD solid state imaging device is in use. Also, since the insulating film 51 formed under the extended portion 38a of the photo-shield layer 38 can be reduced in film thickness, it is possible to manufacture a CCD solid state imaging device with a satisfactory smear characteristic.

Figures 20A, 20B:
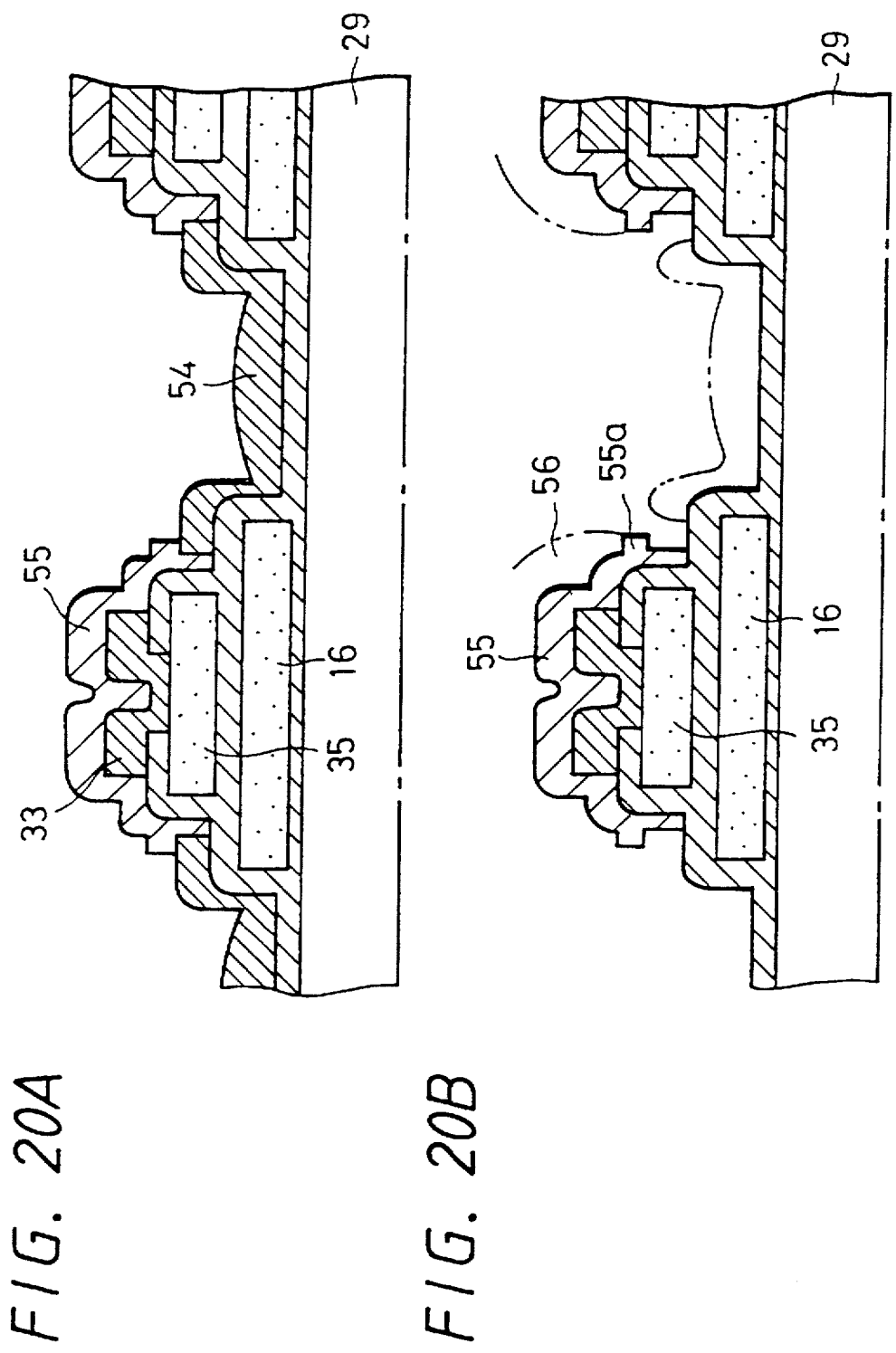
FIGS. 20A and 20B are process diagrams used to explain the present invention, respectively.

While the interlayer insulating layer 55 is patterned in the step shown in FIG. 19D according to the above manufacturing process, as shown in FIG. 19C, it is difficult to accurately remove the interlayer insulating layer 55 only at its portion formed on the Al protecting film 54. Consequently, the interlayer insulating layer 55 is patterned so as to partly overlap with the Al protecting film 54 as shown in FIG. 20A. Therefore, when the Al protecting film 54 is removed, as shown in FIG. 20B, an overhanging portion 55a of the interlayer insulating layer 55 is formed.

There is then the risk that, when the second Al film 56 is formed, the second Al film 56 is not formed within the concave portion provided by the overhanging portion 55. As a result, the photo-shield layer 38 cannot be formed satisfactorily.

FIGS. 21A through 21F and FIG. 22 show a CCD solid state imaging device and a manufacturing method thereof according to a further embodiment of the present invention in which the aforesaid shortcomings can be improved and a photo-shield property of the photo-shield layer can be improved. FIGS. 21A through 21F and FIG. 22 are cross-sectional views taken along the line V—V in FIG. 4, respectively.

Figure 21C:
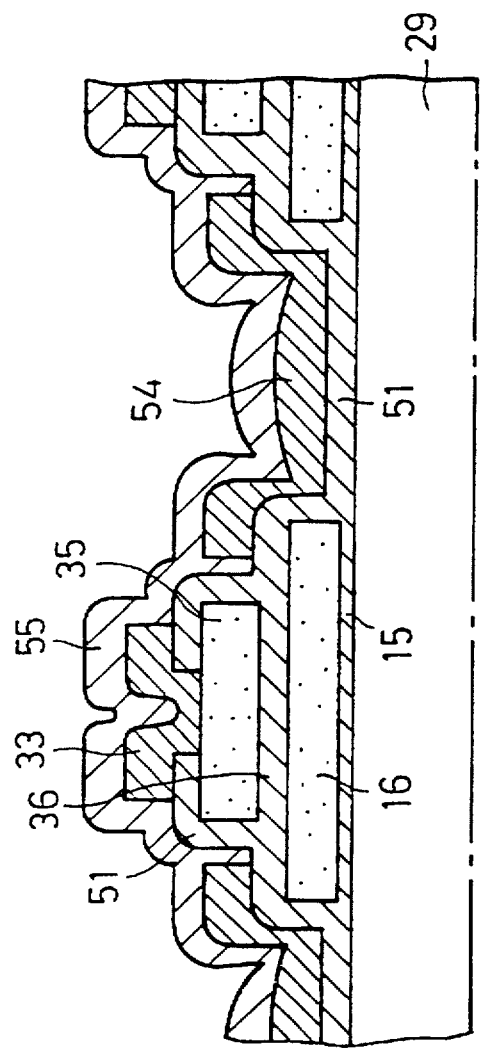

Processes shown in FIGS. 21A to 21C are similar to those of FIGS. 19A to 19C.

Specifically, as shown in FIG. 21A, the polycrystalline silicon transfer electrodes (16A, 16B) are formed on the semiconductor substrate 29 through the gate insulating film (e.g., bilayer of the $SiO_2$ film and the SiN film) 15. Further, the buffer polycrystalline silicon layer 35 is connected to the corresponding transfer electrode 16 along the vertical transfer register 5 through the insulating film 36 made of $SiO_2$, for example.

Subsequently, the insulating film 51 made of $SiO_2$ is formed on the whole surface and the contact hole 52 is bored through the insulating film 51 at its position corresponding to a predetermined connection portion of the buffer polycrystalline silicon layer 35, whereafter the first metal film serving as the shunt line layer, such as Al, w, the Al film 53, in this embodiment is formed on the whole surface.

As shown in FIG. 21B, the shunt line layer 33 formed of the first Al layer 53 is formed on the portion corresponding to buffer polycrystalline silicon layer 35 by patterning the first Al layer 53, and the first Al layer 53 is left on the area which is partly extended on the outer peripheral step portion from the photosensor section 10, i.e., the Al protecting layer 54 formed of the first Al film 53 is formed.

As shown in FIG. 21C, the interlayer insulating layer 55 formed of a plasm SiO-based film or a plasma SiN-based film is formed on the whole surface including the vertical transfer register 5 and the photosensor section 10.

Figure 21D:
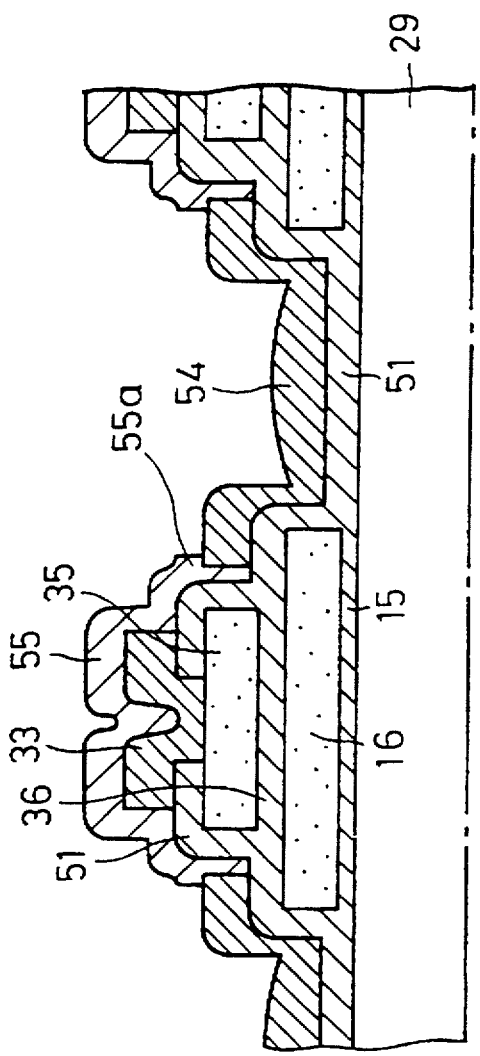

Subsequently, as shown in FIG. 21D, the interlayer insulating layer 55 is selectively removed at its portion on the Al protecting film 54 corresponding to the photosensor section 10 by etching. Thus, the interlayer insulating layer 55 is left so as to surround the shunt line layer 33.

When the interlayer insulating layer 55 is selectively removed by etching, the Al protecting film 54 on the photosensor section 10 is served as an etching stopper to protect the insulating film 51 formed on the surface of the photosensor section 10 from the etching.

Then, as shown in FIG. 21E, under the condition that the Al protecting film 54 is left, the second metal film, e.g., Al, W, an Al film 56 in this embodiment, is deposited on the whole surface.

As shown in FIG. 21F, the opening portion 10A is formed by selectively removing the Al film (Al protecting film) and the second Al film 56 at their portions in which the opening of the photosensor section 10 should be formed by etching. The photo-shielding layer 38 having the integral overhanging portion 38a which partly overhangs on the photosensor section 10 side is formed on the opening portion 10A. The overhanging portion 38a is formed of the bilayer structure of the first and second Al layers 54 and 56.

Figure 22:
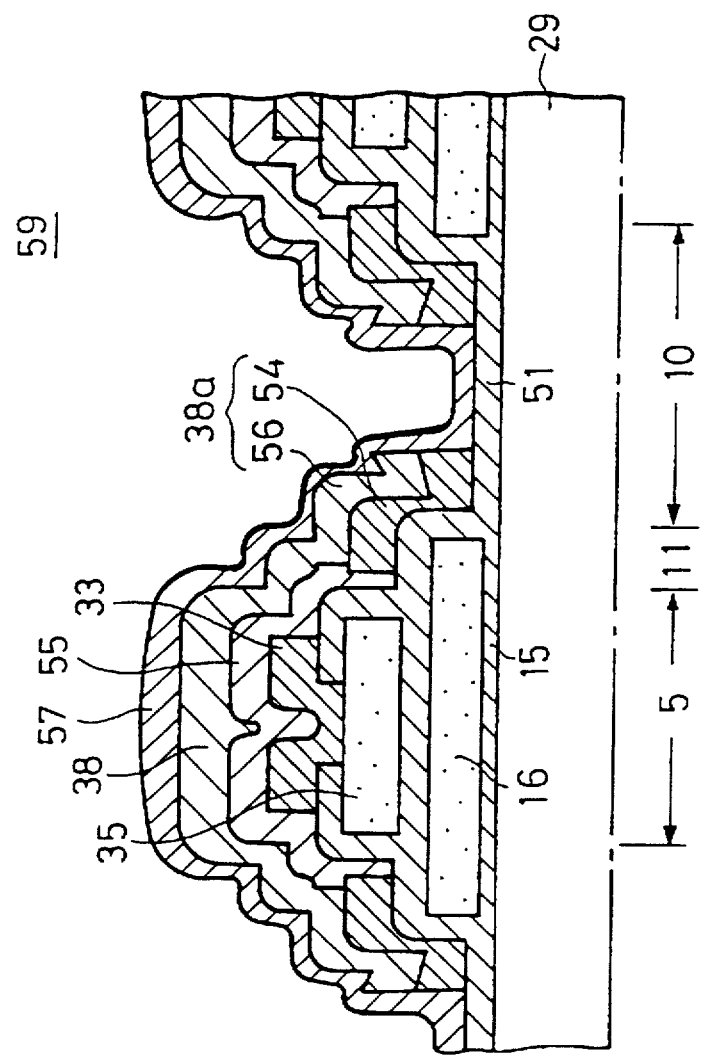
FIG. 22 is a manufacturing process diagram of the CCD solid state imaging device according to other embodiment of the present invention.

Thereafter, as shown in FIG. 22, an insulating protecting film 57 formed of a plasma SiN-based film or a plasma SiO-based film is formed on the whole surface.

Thus, there can be obtained a CCD solid state imaging device 59 which comprises a plurality of photosensor sections arranged in a matrix fashion, the vertical transfer register 5 disposed at every column of the photosensor sections, the shunt line layer 33 connected to the transfer electrode 16 on the vertical transfer register 5, the photo-shield layer 38 formed through the interlayer insulating layer 55 covering the shunt line layer 33, the overhang portion 38a of the photo-shield layer 38 being formed of the bilayer structure of the first and second metal layers 54, 56, and the thin insulating film 51 formed on the photosensor section including the lower portion of the overhang portion 38a in which the interlayer insulating layer 51 is not formed.

According to the CCD solid state imaging device 59, since the insulating film 51 formed under the overhang portion 38a of the photo-shield portion 38 is thin similarly to the above embodiment, light is difficult to be introduced into the lower portion of the overhang portion 38a and thus the smear component can be reduced.

Further, in the overhang portion 38a of the photo-shield portion 38, when the side wall of the step portion, particularly, the Al film of a narrow portion 60 is reduced in thickness, there is then the risk that incident light is leaked from the crystal grain of the Al film. However, according to this embodiment, since the overhang portion 38a has the bilayer structure, the Al film of the narrow portion 60 can be increased sufficiently and a leakage of light can be avoided completely. Thus, the smear component can be reduced further.

It is possible to form the reflection preventing film on the photo-shield layer 38, i.e., at least the lower surface of the first metal film 54 constructing the overhang portion 38a.

According to the manufacturing method of the CCD solid state imaging device, when the interlayer insulating layer 55 is selectively removed by etching as shown in FIG. 21D, the Al protecting film 54 formed of the first Al film is formed on the photosensor section 10 so that the Al protecting film 54 can prevent the insulating film 51 formed under the Al protecting film 54 from being exposed to the plasma and being removed by etching. Even when the overhang portion 55a of the interlayer insulating layer 55 is left in the process shown in FIG. 21D, the Al protecting film 54 is not removed and the second Al film is deposited on the Al protecting film 54 to thereby form the photo-shield layer 38. Therefore, it is possible to form the photo-shield layer 38 whose photo-shield property is high.

Furthermore, since the first and second Al films 54, 56 are removed in the photosensor section 10 by one etching in the process shown in FIG. 21F, the insulating film 51 can be prevented from being damaged.

Accordingly, the film thickness of the insulating film 51 can be reduced, and the smear characteristic can be improved with the photo-shield layer 38 having a high photo-shield property. Also, since the film thickness of the insulating film 51 can be controlled with accuracy and also a stress produced upon processing can be prevented from being applied to the insulating film 51, a spectral characteristic can be improved. It is therefore possible to manufacture a solid state imaging device which can prevent a white defect from being produced when the CCD solid state imaging device is in use.

Further, the first metal film 53 which serves as a part of the overhang portion 38a of the photo-shield layer 38 is utilized as the shunt line layer 33.

Figure 23:
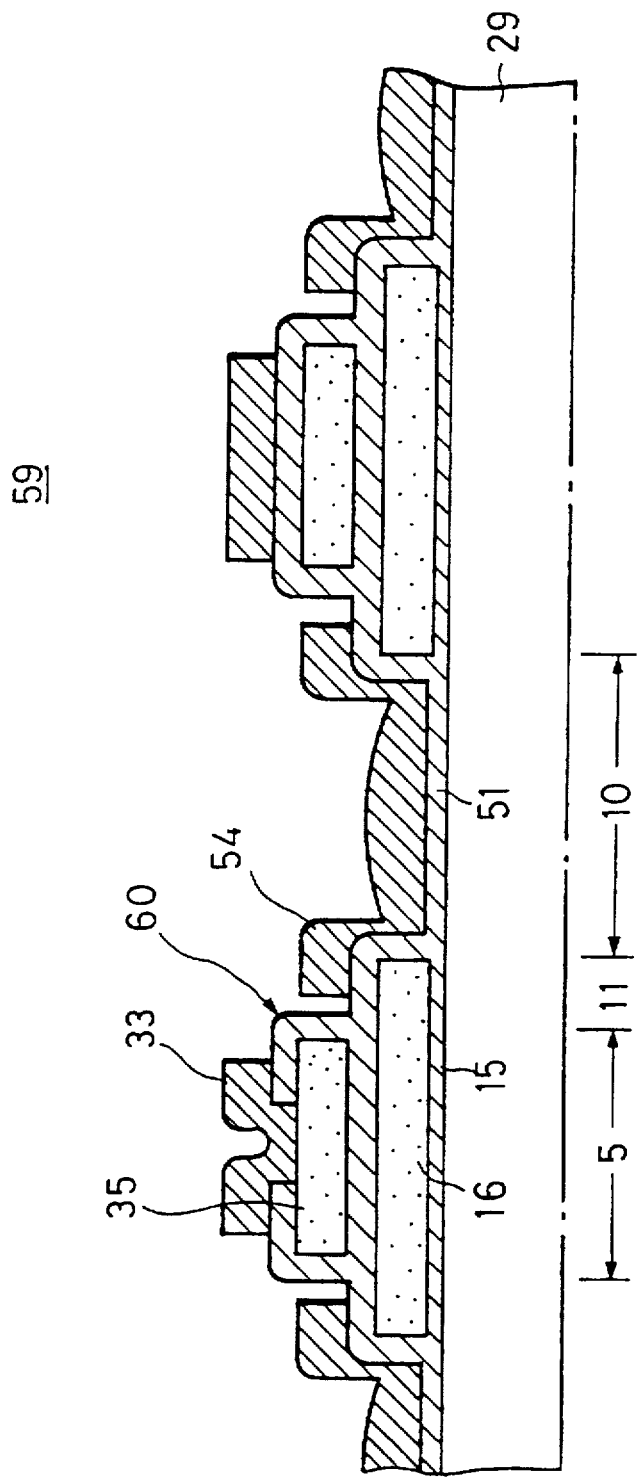
FIG. 23 is a cross-sectional view used to explain the embodiment of the present invention.

On the other hand, in the CCD solid state imaging device shown in FIG. 22, the shunt line layer 33 and the Al protecting film 54 which serves as the etching stopper on the photosensor section 10 are formed by patterning the Al film of the same layer (e.g., film thickness is about 400 nm to 500 nm). However, in this structure, as shown in FIG. 23, the Al film 53 is selectively removed in the stepped portion 60 by etching. There is then the risk that a portion, which is not fully etched, will be produced in the stepped portion 60. If such portion which not etched fully occurs, then a fault of a short-circuit occurs between the shunt line layer 33 and the photo-shield layer 38.

Although a method using both the normal etching and the wet etching is proposed in order to avoid the portion which is not etched sufficiently, this structure has a small process margin and the wet etching cannot be used. Other method is to increase the over-etching amount but the over-etching amount cannot be increased too much because the film thickness of the insulating film 51 of the support is unavoidably reduced.

The thinner the film thickness of the Al film 53 becomes the more difficult the portion which is not etched sufficient occurs. Since however the shunt line layer 33 is formed of the Al film 53, the film thickness of the Al film 53 is reduced to cause a resistance to be increased. There is then the risk that a performance of the solid state imaging device is lowered. When the Al film 53 is etched, the process margin is small and the portion which is not etched sufficiently tends to occur.

FIGS. 24A through 24H and FIG. 25 show a CCD solid state imaging device according to a further embodiment of the present invention and a manufacturing method thereof in which the aforesaid disadvantages are improved. FIGS. 24A through 24H and FIG. 25 are cross-sectional views taken along the line V—V in FIG. 4, respectively.

FIG. 24A shows the same process as that of FIG. 21A. Specifically, as shown in FIG. 24A, the polycrystalline silicon transfer electrodes 16 (16A, 16B) are formed on the semiconductor substrate 29 through the gate insulating film (e.g., bilayer of the SiO$_2$ film and the SiN film), and the buffer polycrystalline silicon layer 35 is connected to the corresponding transfer electrode 16 along the vertical transfer register 5 through the SiO$_2$ insulating film 36.

Subsequently, the SiO$_2$ insulating film 51 is formed on the whole surface and the contact-hole 52 is bored through the insulating film 51 at its position corresponding to a predetermined connection portion of the buffer polycrystalline silicon layer 35, whereafter the first metal film which serves as the shunt line layer, e.g., Al, W, the Al film 53 having a film thickness t$_1$ ranging from about 400 nm to 500 nm is deposited on the whole surface by some suitable means, such as sputtering or the like.

Then, the shunt line layer 33 formed of the first Al film 53 is formed on the portion corresponding to the buffer polycrystalline silicon layer 35 by patterning the first Al film 53 with a photoresist layer 71 as a mask. In this patterning, the pattern is coarse and the reactive ion etching (RIE) and the wet etching both become possible in use. Therefore, the above-mentioned portion which is not sufficiently etched can be removed.

Figures 24C, 24D:
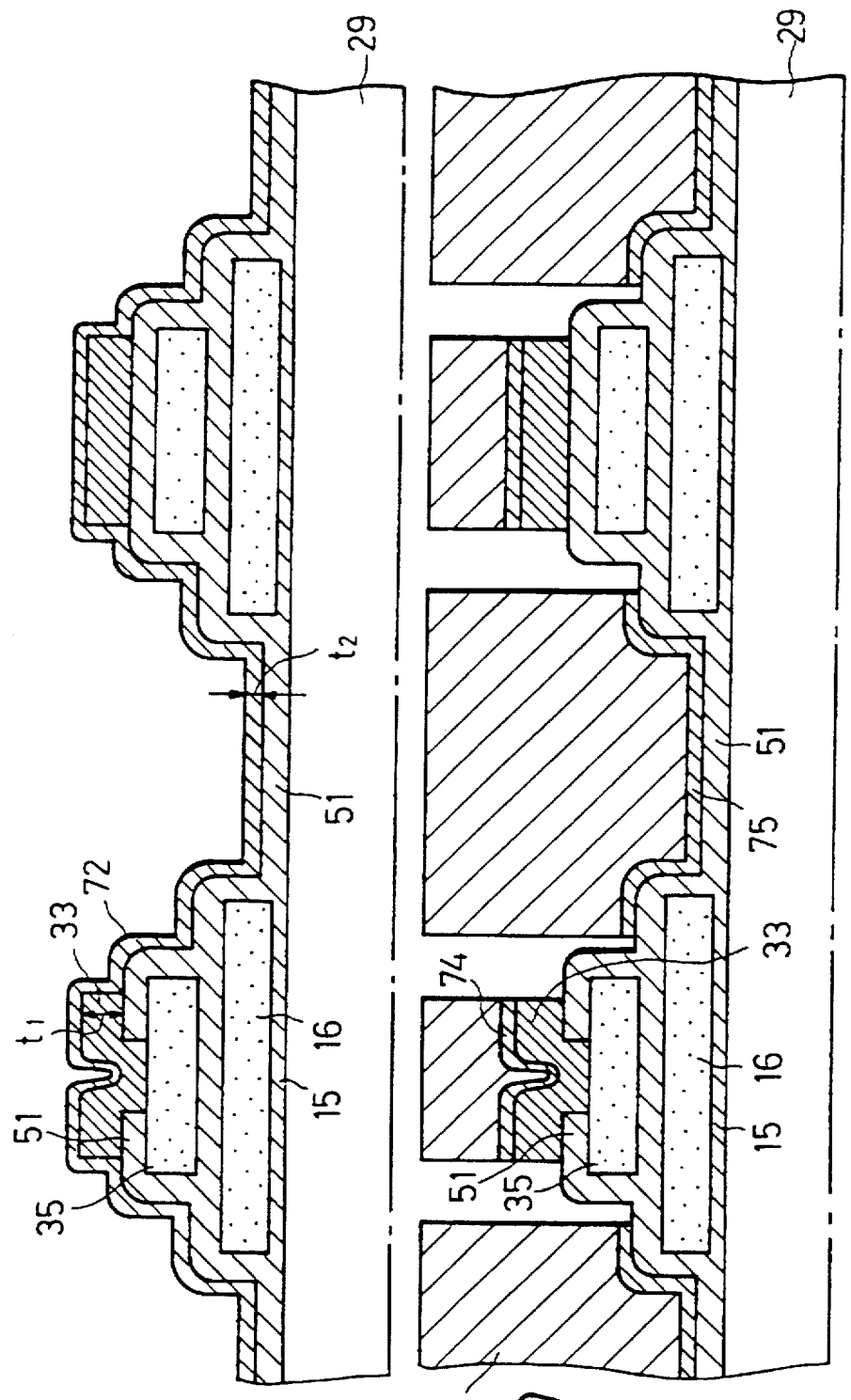

As shown in FIG. 24C, a second metal film which serves as the etching stopper, e.g., Al, W, an Al film 72 in this embodiment, is deposited on the whole surface. A film thickness t$_2$ of the Al film 72 may be several tenths of the film thickness t$_1$ of the shunt line layer 33. In this embodiment, the film thickness t$_2$ is selected to be about 100 nm to 50 nm.

Subsequently, as shown in FIG. 24D, an Al layer 74 which is laminated on the portion corresponding to the shunt line layer 33 is formed by patterning the second Al film 72 with the photoresist layer 73 used as the mask by etching such as the reactive ion etching or the like. Also, an Al protecting film 75 which is formed of the second Al film 72 to serve as an etching stopper is formed on the region partly extended on the outer peripheral step from the photosensor section 10.

Figures 24E, 24F:
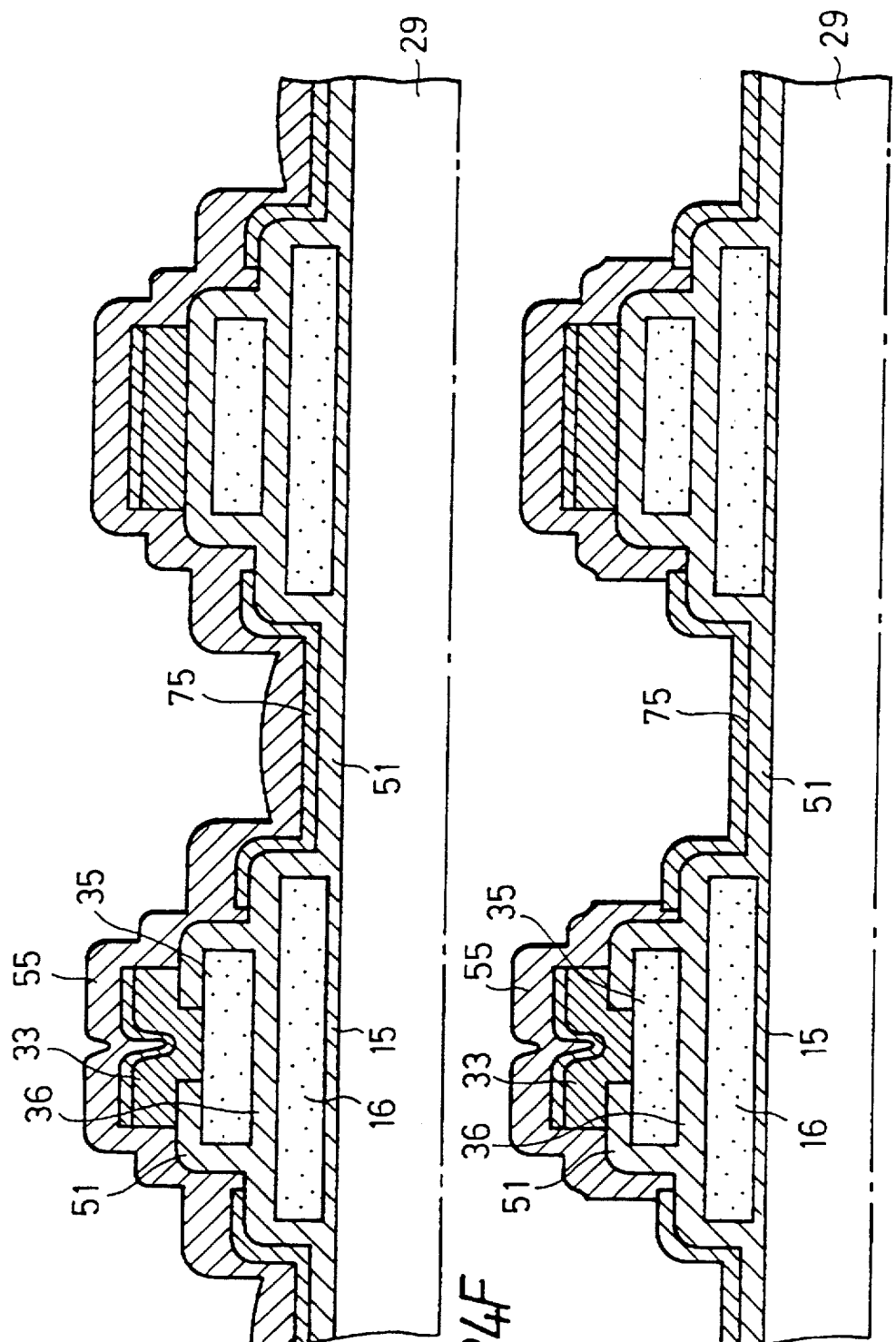

Then, as shown in FIG. 24E, the interlayer insulating layer 55 made of a plasma SiO-based film or a plasma SiN-based film is formed on the whole surface including the vertical transfer register 5 and the photosensor section 10.

Subsequently, as shown in FIG. 24F, the interlayer insulating layer formed on the Al protecting film 75 corresponding to the photosensor section 10 is selectively removed by etching, whereby the interlayer insulating layer 55 is left so as to surround the shunt line layer 33.

When the interlayer insulating layer 55 is selectively removed by etching, the Al protecting film 75 on the photosensor section 10 serves as the etching stopper to protect the insulating film 51 formed on the surface of the photosensor section 10 from the etching.

As shown in FIG. 24G, under the condition that the Al protecting film 75 is left, a third metal film, e.g., Al, W, an Al film 76 in this embodiment is formed on the whole surface.

Then, as shown in FIG. 24H, the opening portion 10a is formed by selectively removing the second and third Al films 75, 76 on the photosensor section 10 at its portion in which the opening should be formed by etching. Then, the photo-shield layer 38 having the integral overhang portion 38a which partly overhangs to the photosensor section 10 is formed on the opening portion 10a. The overhang portion 39a is formed by the bilayer structure of the second and third Al films 75 and 76.

Figure 25:
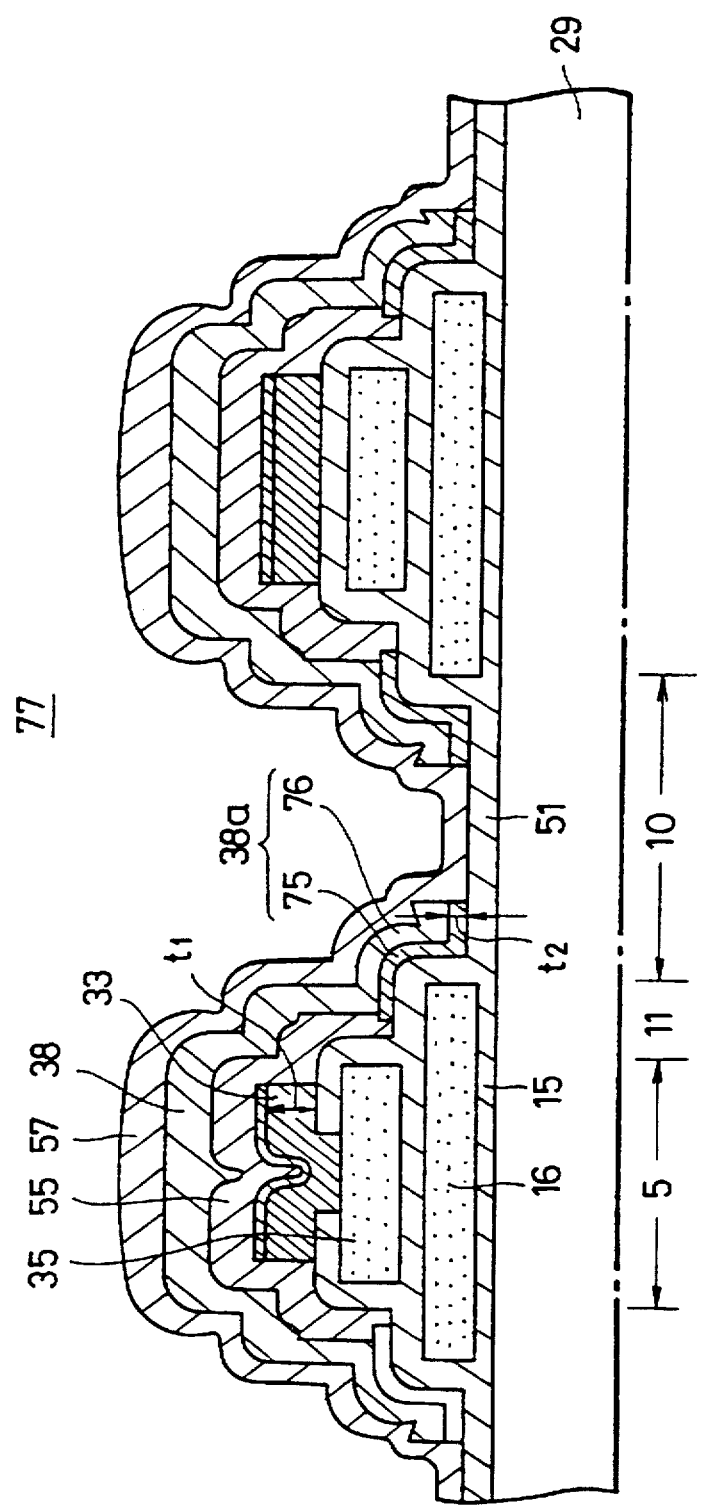
FIG. 25 is a manufacturing process diagram of the CCD solid state imaging device according to yet a further embodiment of the present invention.

Thereafter, as shown in FIG. 25, an insulated protecting film 57 made of a plasma SiN-based film or a plasma SiO-based film is deposited on the whole surface.

Therefore, there is obtained a CCD solid state imaging device 77 which comprises a plurality of photosensor sections 10 arranged in a matrix fashion, the vertical transfer registers 5 disposed at every column of each photosensor section 10, the shunt line layer 33 connected to the transfer electrodes 16 on the vertical transfer register 5, and the photo-shield layer 38 formed through the interlayer insulating layer 55 covering the shunt line layer 33, in which the overhang portion 38a of the photo-shield layer 38 is formed by the bilayer structure of the second metal film 72 (accordingly, the metal film 75) having the film thickness t$_2$ thicker than the film thickness t$_1$ of the shunt line layer 33 and the third metal film 76, the interlayer insulating film 55 is not formed on the photosensor section 10 including the lower portion of the overhang portion 38a and the thin insulating film 51 is formed.

According to the CCD solid state imaging device 77, since the metal film remaining on the photosensor section 10, i.e., the Al film 72 (accordingly the metal film 75) formed as the support layer of the overhang portion 38a of the bilayer structure of the photo-=shield layer 38 is reduced in thickness thinner than the film thickness t$_1$ of the shunt line layer 33, the Al layer 72 can be patterned satisfactorily and therefore the disconnection caused by the insufficient etching can be prevented.

Further, since the amount that the thickness of the support insulating film 51 is reduced by the over-etching is reduced when the thin Al film 72 is patterned, as compared with the CCD solid state imaging device 59, the insulating film 51 formed under the overhang portion 38a of the photo-shield layer 38 can be further reduced in thickness. Therefore, the smear suppressing ratio can be improved much more.

FIGS. 26A through 26H respectively show the CCD solid state imaging device according to a further embodiment of the present invention and a manufacturing method thereof. FIGS. 26A through 26H, each of which is the process diagram, are cross-sectional views taken along the V—V in FIG. 4.

Initially, as shown in FIG. 26A, the polycrystalline silicon transfer electrodes 16 (16A, 16B) are formed on the semiconductor substrate 29 through the gate insulating film 15. Further, the buffer polycrystalline silicon layer 35 is connected to the corresponding transfer electrode 16 along the vertical transfer register 5 through the $SiO_2$ insulating film 36. Then, a first interlayer insulating layer 81 made of PSG (phosphorous silicate glass) or BPSG (boron, phosphorous silicate glass) is formed on the whole surface.

Then, as shown in FIG. 26B, a thin film which serves as an etching stopper later, e.g., a semiconductor thin film, a polycrystalline silicon thin film 82 in this embodiment, is formed on the whole surface of the first interlayer insulating film 81. A film thickness of the polycrystalline silicon thin film 82 should preferably be selected to be about 100 nm or smaller in order to obtain a device with a satisfactory smear characteristic.

Subsequently, as shown in FIG. 26C, the polycrystalline silicon thin film 82 is left only on the region partly extended on the outer peripheral portion from the photosensor section 10 by patterning the polycrystalline silicon thin film 82 by etching.

When the polycrystalline silicon thin film 82 is selectively removed by etching, an etcher having a large etching selectivity relative to the first interlayer insulating layer 81 must be used in order to prevent the film thickness of the first interlayer insulating layer 81 from being reduced. when the first interlayer insulating layer 81 is formed of the PSG film, it is sufficient to use an etcher for a normal polycrystalline silicon thin film.

Then, as shown in FIG. 26D, after a contact hole 52 is bored through the first interlayer insulating film 81 at its position corresponding to a predetermined connection portion of the buffer polycrystalline silicon layer 35, the first metal film which serves as the shunt line layer, e.g., Al, W, an Al film in this embodiment, is formed by sputtering. Then, a shunt line layer 33 formed of the first Al film is formed on the portion corresponding to the buffer polycrystalline silicon layer 35 by patterning the Al film.

As shown in FIG. 26E, a second interlayer insulating layer made of a plasma SiN-based film or a plasma SiO-based film is formed on the whole surface so as to cover the shunt line layer 33.

Subsequently, as shown in FIG. 26F, the photosensor section 10 of the second interlayer insulating layer 82 and the region including the peripheral portion of the photosensor section 10 are selectively removed by the etching.

When the photosensor section 10 and the region including the peripheral portion of the photosensor section 10 are selectively removed by etching as described above, the polycrystalline silicon film 82 on the photosensor section 10 becomes an etching stopper to protect the first interlayer insulating layer 81 formed on the surface of the photosensor section 10 from the etching.

An etching condition is such that a sufficiently high etching selectivity can be achieved between the polycrystalline silicon film 82 and the second interlayer insulating layer 83 so that, when the etching is ended, the polycrystalline silicon film 82 can be left in order to prevent the film thickness of the first interlayer insulator 81 from being reduced.

Subsequently, under the condition that the polycrystalline silicon film 82 is left, the second metal film, e.g., Al, W, an Al film in this embodiment, is deposited on the whole surface.

Figure 26G:
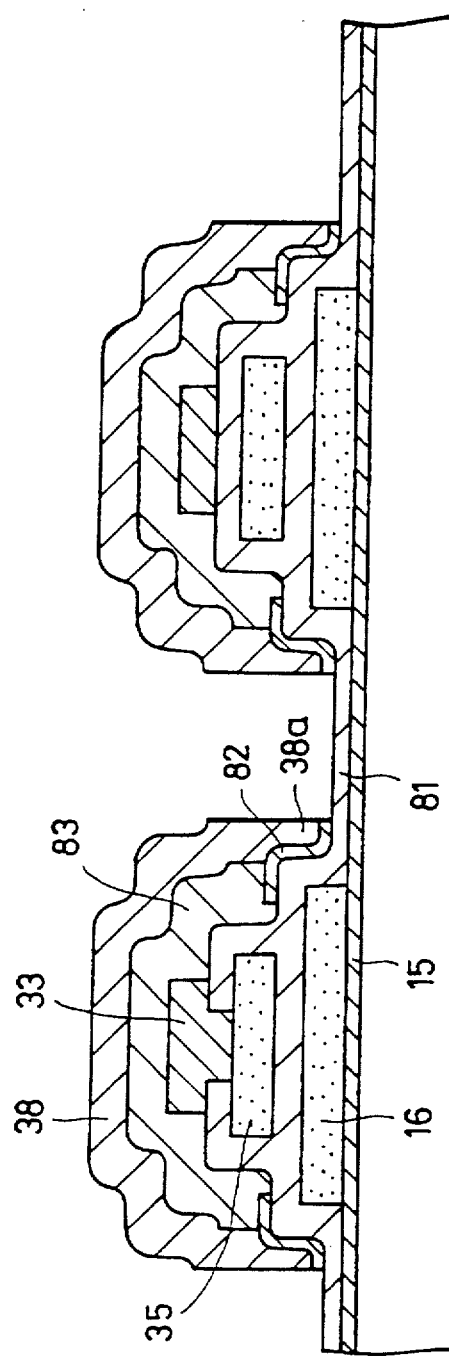
Figure 26H:
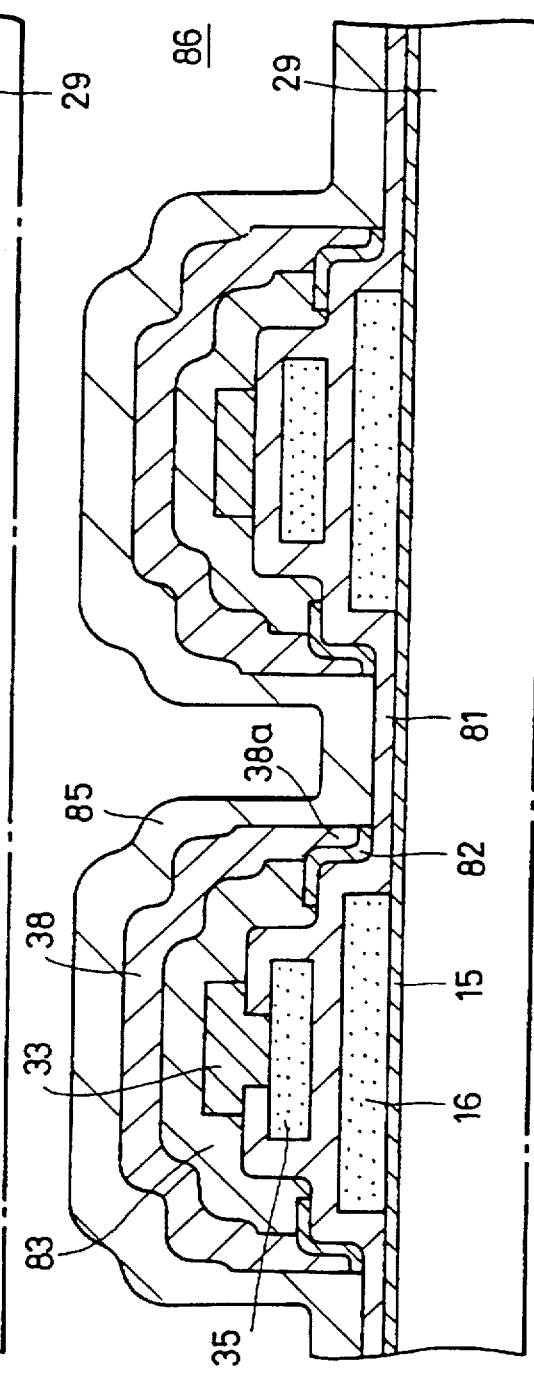

As shown in FIG. 26G, the opening portion 10a is formed by selectively removing the second Al film and the polycrystalline silicon film 82 on the photosensor section 10 at its portion in which the opening should be formed by etching at the same time. Then, the photo-shield layer 38 having the integrated overhang portion 38a which partly overhangs to the photosensor section 10 side is formed on the opening portion 10a.

In this case, if the polycrystalline silicon film 82 is removed at the same time by etching, it is possible to prevent a spectral characteristic from being changed.

Thereafter, as shown in FIG. 26G, a normal plasma SiN or plasma SiO insulated protecting film 85 is deposited on the whole surface.

Thus, there is obtained a CCD solid state imaging device 86 which comprises a plurality of photosensor sections 10 arranged in a matrix fashion, the vertical transfer registers 5 disposed at every column of the photosensor sections 10, the shunt line layer 33 connected to the transfer electrodes 16 on the vertical transfer registers 5, and the photo-shield layer 38 formed through the second interlayer insulating layer 83 which covers the shunt line layer 33, in which the second interlayer insulating layer 83 is not formed under the overhang portion 38a which overhangs to the photosensor section 10 side of the photo-shield layer 38, and the polycrystalline silicon thin film 82 which serves as the etching stopper is formed between the overhang portion 38a and the first interlayer insulating layer 81 on the photosensor section 10.

While the thin film 82 which serves as the etching stopper is formed of the polycrystalline silicon film as described above, when the polycrystalline silicon film and the metal of the photo-shield layer 38 react to each other, if a thin film having a bilayer film structure of a polycrystalline silicon film whose surface is oxidized and a silicon oxide film or a thin film in which arsenic of high concentration is injected into the polycryrstalline silicon film by ion implantation is used, then the above-mentioned reaction can be avoided.

According to the CCD solid state imaging device 86, the polycrystalline silicon thin film (or polycrystalline silicon thin film whose surface is oxidized) is formed on the first interlayer insulating layer 81 of the photosensor section 10 and the second interlayer insulating layer 83 on the polycrystalline silicon thin film (or polycrystalline silicon thin film whose surface is oxidized) is selectively removed by etching, whereby the second interlayer insulating layer 83 of the photosensor section 10 can be removed under the condition that the first interlayer insulating layer 81 is made thin. Therefore, when the second interlayer insulating layer 83 is selectively removed by etching, the film thickness of the first interlayer insulating layer 81 can be prevented from being reduced, and the first interlayer insulating film 81 formed beneath the overhang portion 38a of the photo-shield layer 38 can be made thinner. Therefore, a smear component can be reduced.

When the polycrystalline silicon thin film (or the polycrystalline silicon thin film) 82 is patterned in the process shown in FIG. 26C, the etching selectivity between the thin film 82 and the first interlayer insulating layer 81 of the PSG support is large so that the over-etching becomes possible to provide a satisfactory patterning.

Further, in the manufacturing of this kind of solid state imaging device, satisfactory solid state imaging devices can be produced with high yield.

Moreover, since the photo-shield layer 38 is formed of only the second metal film (e.g., Al film), this process can be satisfactorily matched with the process in which the reflection preventing film is formed on the lower surface of the photo-shield layer 38.

In the CCD solid state imaging device 59 shown in FIG. 22, since the overhang portion 38a of the photo-shield layer 38 is formed as the bilayer structure and made relatively thick, the overhang portion 38a rises in the opening portion 10a as a wall. There is then the risk that an eclipse of incident light tends to occur.

FIGS. 27A through 27D and FIG. 28 show a CCD solid state imaging device according to a yet further embodiment of the present invention and a manufacturing method thereof in which the aforesaid disadvantages can be improved. FIGS. 27A through 27D and FIG. 28, each of which is a process diagram, are cross-sectional views taken along the line V—V in FIG. 4.

Figures 27A, 27B:
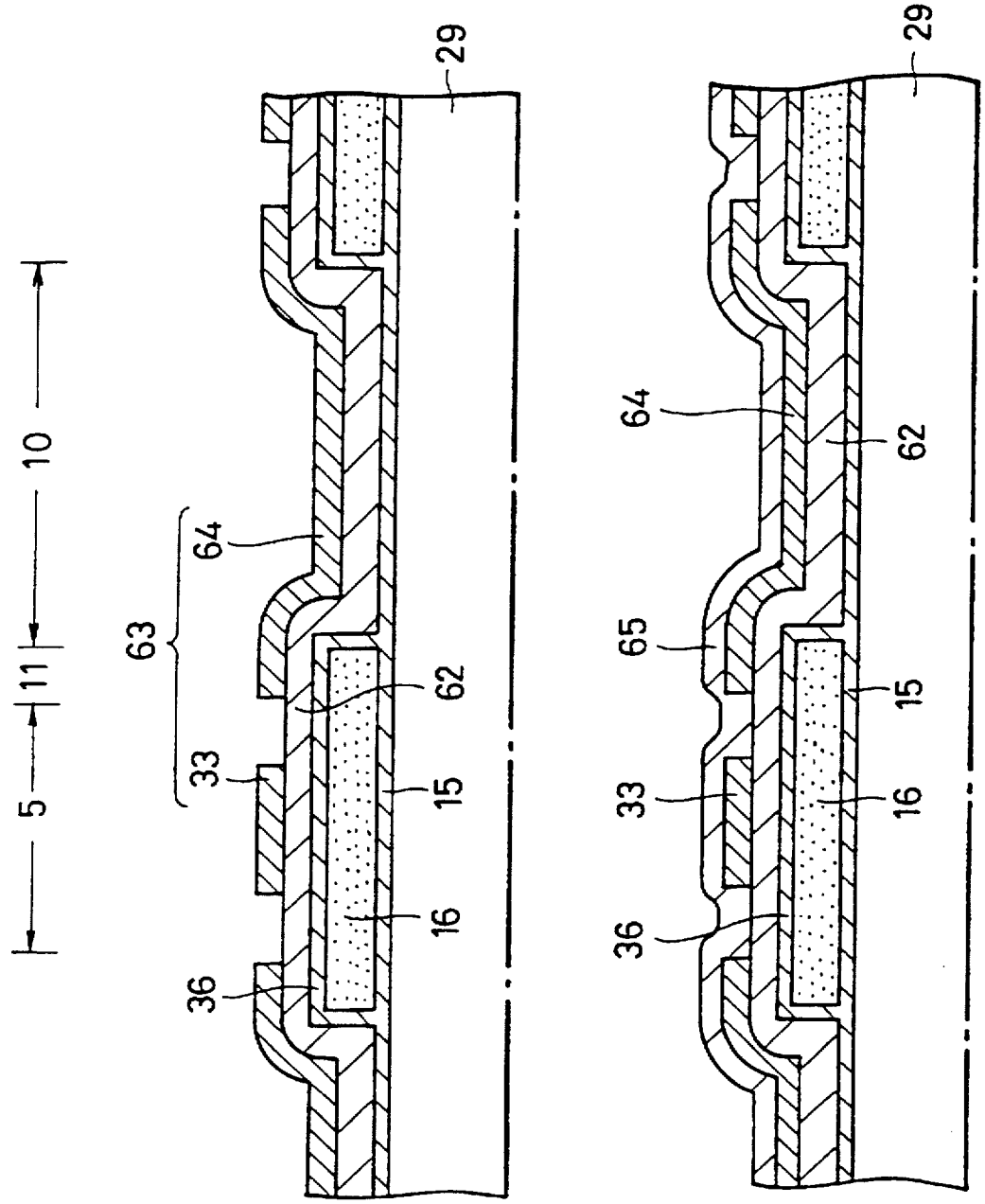
FIGS. 27A through 27D are manufacturing process diagrams of the CCD solid state imaging device according to still a further embodiment of the present invention, respectively.

Initially, as shown in FIG. 27A, the polycrystalline silicon transfer electrodes 16 (16A, 16B) are formed on the semiconductor substrate 29 through the gate insulating film (e.g., bilayer of the SiO$_2$ film and the SiN film). Then, the oxide film (SiO$_2$) film 36 is formed on the surface of the transfer electrode 16 and an insulating film (planarization film) 62 is formed on the whole surface.

After the first metal layer, e.g., tungsten (W) film 63 is deposited by sputtering, the shunt line layer 33 connected to the corresponding transfer electrode 16 along the vertical transfer register and a tungsten (W) protecting film 63 which is extended onto the photosensor section 10 from the portion which serves as the overhang portion 38a of the photo-shield layer are formed by patterning the tungsten (W) film 63.

Then, as shown in FIG. 27B, an interlayer insulating layer 65 is formed on the whole surface including the shunt line layer 33 and the tungsten (W) protecting film 64 by a CVD.

Figure 27C:
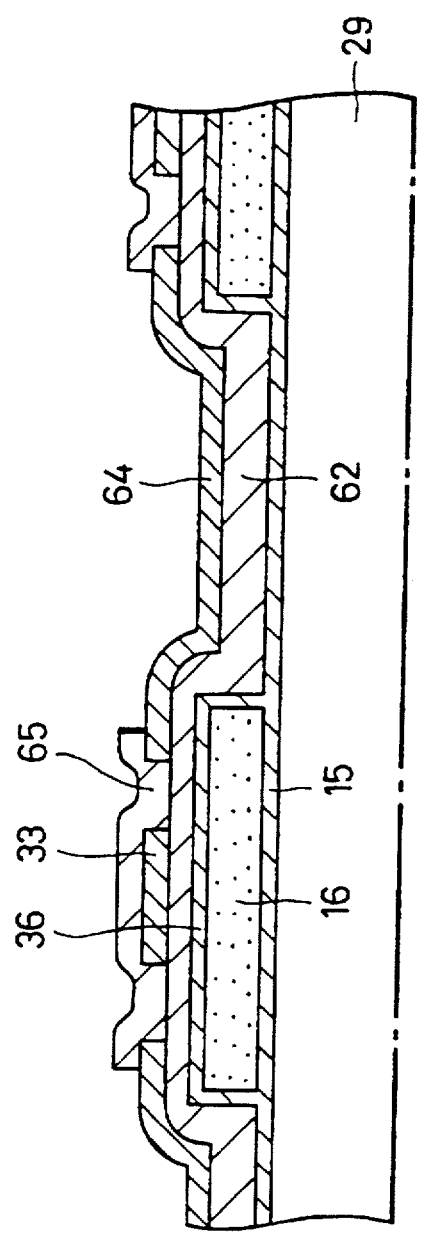

As shown in FIG. 27C, by selectively removing the interlayer insulating layer 65 by etching, the interlayer insulating film 65 is left such that the interlayer insulating film 65 covers the shunt line layer 33 and also partly extends across the tungsten (w) protecting film 64, i.e., an edge portion of an edge which becomes the overhang portion 38a of the photo-shield layer. When the interlayer insulating film 65 is patterned, the tungsten (W) protecting film 64 is formed on the photosensor section 10 side so that the insulating film 62 formed on the surface of the photosensor section 10 can be prevented from being etched.

Figure 27D:
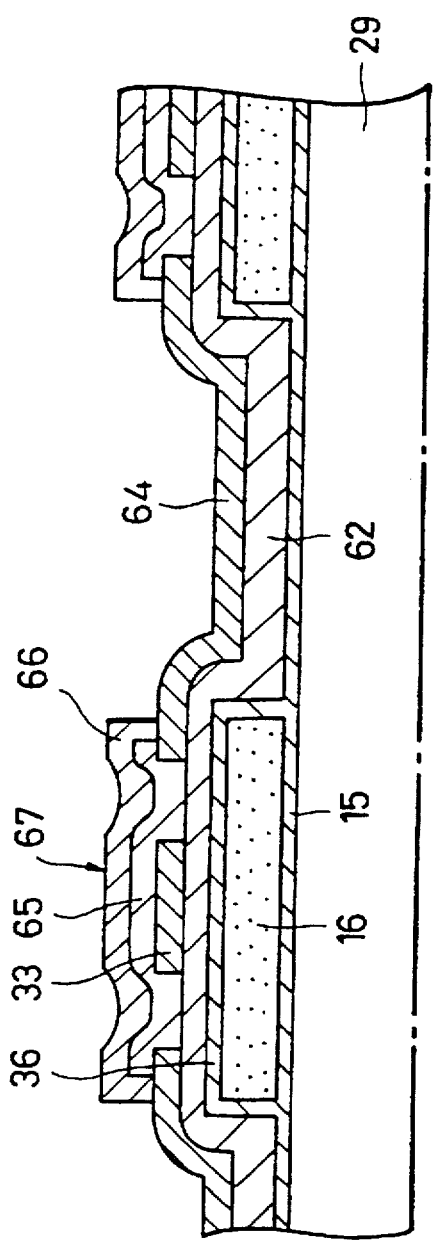

Subsequently, as shown in FIG. 27D, after the second metal film, e.g., aluminum (Al) film 66 is deposited by sputtering, the Al film 66 is patterned by using the support tungsten (W) protecting film 64 as an etching stopper to thereby form an Al photo-shield section 67 which forms a part of the photo-shield layer so as to physically and electrically contact with the end edge of the W protecting film 64.

Figure 28:
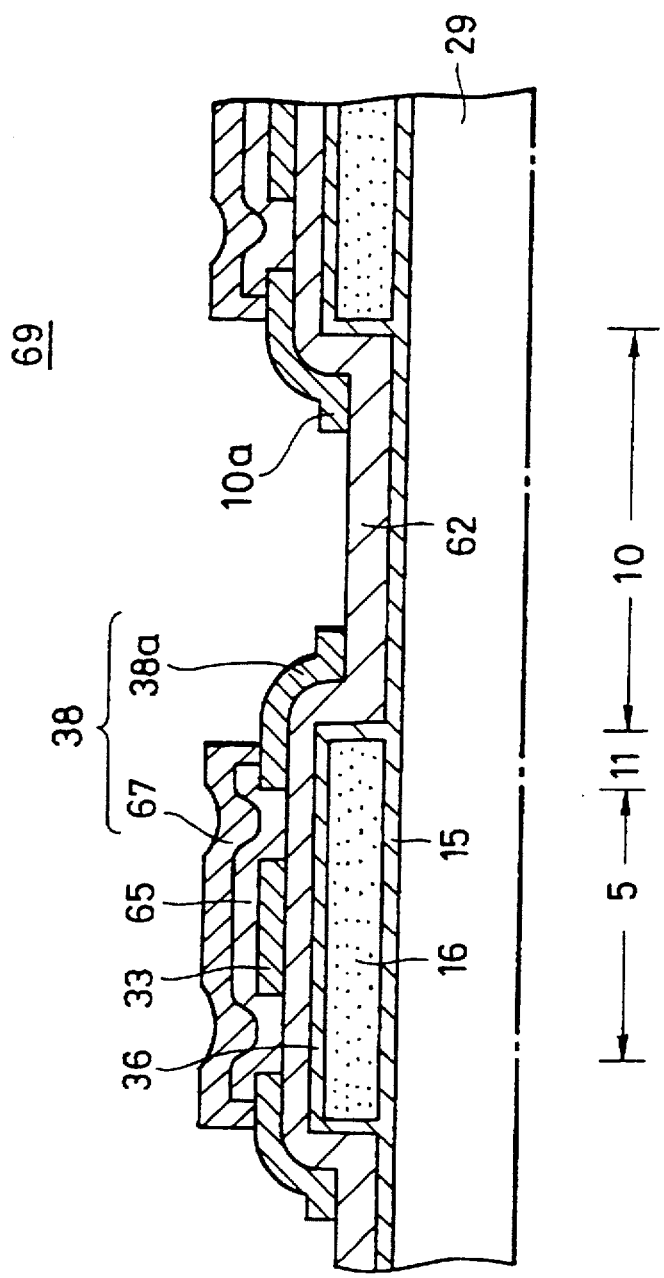
FIG. 28 is a manufacturing process diagram of the CCD solid state imaging device according to still a further embodiment of the present invention.

As shown in FIG. 28, the opening portion 10a is formed by selectively removing the W protecting film 64 on the photosensor section 10 by etching. When the opening portion 10a is formed by selectively removing the W protecting film 64 on the photosensor section 10 by etching, there is formed the photo-shield layer 38 which comprises the overhang portion 38a formed of the W (tungsten film) and the photo-shield film 67 formed of the Al film on the transfer electrode 16.

Thus, there is obtained a CCD solid state imaging device 69 which comprises a plurality of photosensor sections 10 arranged in a matrix fashion, the vertical transfer registers 5 disposed at every column of the photosensor sections 10, the shunt line layer 33 connected to the transfer electrode 16 on the vertical transfer register 5, and the photo-shield layer 38 formed through the interlayer insulating layer 65 covering the shunt line layer 33, in which the photo-shield layer 38 is formed of two kinds of metal films, i.e., the overhang portion 38a formed of the W film 63 and the photo-shield film section 67 formed of the Al film 66, and the overhang portion 38a and the shunt line layer 33 is formed of the metal film of the first metal film, i.e., the W film 63.

According to this CCD solid state imaging device 69, the photo-shield layer 38 is formed by using the two kinds of the metal films 63, 64, and the overhang portion 38a is formed of one metal film 63, thereby improving an eclipse of light incident on the photosensor section 10. Further, when an on-chip micro-lens is designed, a shape of this on-chip micro-lens can be designed with an increased freedom.

With this structure, since the insulating film 62 formed under the overhang portion 38a can be reduced in thickness, a leakage of light can be reduced, and a smear component can be reduced.

Further, according to this embodiment, since the overhang portion 38a of the photo-shield layer and the shunt line layer 33 are formed of the first W film 63, the buffer polycrystalline silicon layer can be omitted and the stepped portion on the surface can be alleviated.

Furthermore, since the tungsten overhang portion 38a forming the photo-shield layer 38 and the aluminum photo-shield film section 67 are brought in contact with each other physically and electrically, a leakage of light can be avoided and an excellent photo-shield capability can be obtained. Simultaneously, since the potential of the whole photo-shield layer 38 can be determined by supplying a potential to any one of the photo-shield film section 67 and the overhang portion 38a, the interconnection of this CCD solid state imaging device 69 can be simplified.

It is possible to form the reflection preventing film on the lower surface of the metal film 63 which constructs the photo-shield layer 38, i.e., at least the overhang portion 38a of the photo-shield layer 38.

While the etching process for forming the opening portion 10a of the photosensor section 10 is carried out in the process shown in FIG. 38 in the manufacturing shown in FIGS. 27A through 27D and FIG. 28, the present invention is not limited thereto and the opening portion 10a may be patterned at the same time when the W film is patterned in the process shown in FIG. 27A.

The metal materials of the first and second metal films 63 and 66 may be changed in such a way as to change the order of W and Al, when necessary.

While the photo-shield layer 38 is formed so as to surround the photosensor sections 10, i.e., formed on the vertical transfer register 5 and between the adjacent photosensor sections 10 in the vertical direction as described above, the present invention is not limited thereto, and the following variant is also possible. That is, the photo-shield layer 38 may be formed at least on the adjacent photosensor sections 10 in the vertical direction, the shunt line layer 33 on the vertical transfer register 5 may be served also as the photo-shield layer, and the interlayer insulating layers 37, 42, 55, 65 or 83 may not formed under the overhang portion 38a which overhangs to the photosensor section 10 side of the photo-shield layer 38. According to this structure, the vertical transfer register 5 can be photo-shielded by the shunt line layer 33 and the photosensor sections in the vertical direction can be photo-shielded by the photo-shield layer 38. In addition, since the overhang portion 38a toward the photosensor 10 side of the photo-shield layer 38 is formed on the PSG layer 32 of the support layer or the insulating films 51, 62, the vertical register 5 and the photosensor sections in the vertical direction can be photo-shielded reliably and therefore the smear component can be reduced.

Furthermore, while the present invention is applied to the FIT type CCD solid state imaging device, the present invention is not limited thereto and may be applied to an IT (interline transfer) type CCD solid state imaging device.

According to the solid state imaging device of the present invention, the vertical transfer register and the photosensors adjacent in the vertical direction can be photo-shielded reliably and therefore the smear component can be reduced.

Since the interlayer insulating layer between the shunt line layer and the photo-shield layer is formed of the nitride film, the large etching selectivity relative to the insulating layer of the support layer can be obtained so that the portion under the overhang portion of the photo-shield layer, i.e., the interlayer insulating layer at the portion corresponding to the photosensor section can be selectively removed.

Since the interlayer insulating layer is formed of the laminated film of the nitride film and the oxide film, the specific inductive capacity of the interlayer insulating layer can be reduced and therefore the capacity between the shunt line layer and the photo-shield layer can be reduced. As a consequence, the load capacity of the transfer clock terminal can be reduced. It becomes therefore possible to reduce the power consumption.

According to the solid state imaging device of the present invention, the insulating film formed under the overhang portion of the photo-shield layer can be reduced in thickness, and the photo-shield property at the overhang portion can be improved much more by the bilayer film structure, and the smear component can be reduced.

When the lower layer film of the bilayer structure formed on the overhang portion of the photo-shield layer is reduce in thickness as compared with the shunt line layer, the portion, which is not etched, produced when the lower layer film is patterned can be removed and a failure of disconnection can be prevented. Further, since the amount in which the film thickness of the support insulating film is reduced by the over-etching of the lower layer film can be reduced, the insulating layer on the overhang portion of the photo-shield layer can be further reduced in thickness and the smear compressed ratio can be improved.

Further, according to the solid state imaging device according to the present invention, the smear component can be reduced. Also, when the photo-shield layer is formed of the metal film of the single layer, the process can be satisfactorily matched with the process for forming the reflection preventing film under the photo-shield layer.

According to the solid state imaging device of the present invention, the smear component can be reduced. Also, when the photo-shield layer is formed of the metal films of two kinds, an amount of incident light shaded by the overhang portion of the photo-shield layer can be reduced, and the shape of the on-chip micro-lens can be designed with an increased freedom.

Furthermore, since the reflection preventing film can be formed on the lower surface of the photo-shield layer, a smear component caused by leaked light can be reduced.

According to the method of manufacturing a solid state imaging device of the present invention, the spacing between the overhang portion of the photo-shield layer to the photosensor section and the semiconductor surface can be reduced by selectively removing the second insulating layer formed between the shunt line layer and the photo-shield layer in the photosensor section, whereby the smear component can be reduced.

According to the method of manufacturing a solid state imaging device of the present invention, when the shunt line layer is formed, the metal film of the same single layer as the shunt line layer is left. Therefore, when the interlayer insulating layer on the photosensor section is selectively removed, the thin insulating film formed under the metal film can be protected by the remaining metal film.

Further, according to the method of manufacturing a solid state imaging device of the present invention, the thin film serving as the stopper is formed on the first interlayer insulating layer on the photosensor section. Therefore, when the second interlayer insulating layer is selectively removed at its portion corresponding to the photosensor section, the thin first interlayer insulating layer can similarly be protected by the thin film formed beneath the first interlayer insulating layer.

Consequently, the occurrence of the white defect can be reduced, and the solid state imaging device in which the smear component can be reduced.

Further, when the second metal film is formed under the condition that the first metal film on the photosensor section is left, the overhang portion of the photo-shield layer is formed of the bilayer film, whereby the photo-shield property can be improved more and the smear component can be improved.

Therefore, it is possible to provide a solid state imaging device which is high in reliability, e.g., a solid state imaging device of a high definition.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing a solid state imaging device, comprising the steps of:

a first step of forming a plurality of photosensors and a vertical transfer register having a transfer electrode provided at every column of each photosensor section;

a second step for forming a shunt line which is connected to said transfer electrode through a first insulating layer;

a third step for forming a second insulating layer which covers said shunt line;

a fourth step for selectively removing said second insulating layer at its portion corresponding to said photosensor section in a mode in which an etching selectivity between said first insulating layer and second insulating layer can be obtained; and a fifth step for forming a photo-shield layer on said vertical transfer register and around said photosensor section so that said photo-shield layer partially overhangs said photosensor section.

2. The method of manufacturing a solid state imaging device according to claim 1, wherein said second step includes a step for forming said shunt line by a first metal film and selectively leaving said first metal film on said photosensor section of said second insulating layer, said fourth step includes a step of selectively removing said second insulating layer at its portion corresponding to said photosensor section by using said first metal film on said photosensor section as a stopper and said fifth step has a preceding step for removing said first metal film on said photosensor section.

3. The method of manufacturing a solid state imaging device according to claim 2, wherein said fourth step has a succeeding fifth step for forming a second metal film on the whole surface and forming said photo-shield film on said vertical transfer register and said photosensor section by selectively patterning said first and second metal films so that said overhang portion hung to said photosensor section has a bilayer structure of said first and second metal layers.

4. A method of manufacturing a solid state imaging device, comprising the steps of:

a first step of forming a plurality of photosensor sections and a vertical transfer register having a transfer electrode provided at every column of each said photosensor section;

a second step of selectively forming a thin film serving as a stopper on a first insulating layer at a portion corresponding to said photosensor section after said first insulating layer was formed over the whole surface of said photosensor section and said vertical transfer register;

a third step of forming a shunt line on said vertical transfer register through said first insulating layer so as to be connected to said transfer electrode;

a fourth step of forming a second insulating layer which covers said shunt line;

a fifth step of selectively removing said second insulating layer at its portion corresponding to said photosensor section by using said thin film as a stopper; and a sixth step of forming a photo-shield layer on said vertical transfer register and around said photosensor section by patterning said photo-shield layer and said thin film such that said photo-shield layer is partly overhung to said photosensor section after said photo-shield layer was formed on the whole surface.

* * * * *